(12) United States Patent
Wei

(10) Patent No.: US 7,921,383 B1
(45) Date of Patent: Apr. 5, 2011

(54) PHOTOLITHOGRAPHIC PROCESS SIMULATION INCLUDING EFFICIENT RESULT COMPUTATION FOR MULTIPLE PROCESS VARIATION VALUES

(75) Inventor: Haiqing Wei, San Jose, CA (US)

(73) Assignee: oLambda, Inc, Los Altos, CA (US)

( * ) Notice: Subject to any disclaimer, the term of this patent is extended or adjusted under 35 U.S.C. 154(b) by 849 days.

(21) Appl. No.: 11/705,808

(22) Filed: Feb. 12, 2007

Related U.S. Application Data

(63) Continuation of application No. 11/331,223, filed on Jan. 11, 2006, now abandoned.

(51) Int. Cl.
G06F 17/50 (2006.01)
(52) U.S. Cl. ............ 716/4; 716/1; 716/19; 703/13
(58) Field of Classification Search .......... 703/13; 716/1–2, 4, 19–21
See application file for complete search history.

(56) References Cited

U.S. PATENT DOCUMENTS

| | | | |
|---|---|---|---|
| 6,728,937 B2 | 4/2004 | Wakita et al. | |
| 7,266,800 B2 | 9/2007 | Sezginer | |
| 2004/0133871 A1 | 7/2004 | Granik et al. | |
| 2005/0015233 A1* | 1/2005 | Gordon | 703/13 |
| 2005/0114822 A1 | 5/2005 | Axelrad et al. | |
| 2005/0185159 A1 | 8/2005 | Rosenbluth et al. | |
| 2005/0204322 A1 | 9/2005 | Kotani et al. | |
| 2005/0216877 A1 | 9/2005 | Pack et al. | |
| 2005/0229125 A1 | 10/2005 | Tabery et al. | |
| 2006/0034505 A1 | 2/2006 | Luk-Pat et al. | |
| 2006/0248497 A1* | 11/2006 | Huang et al. | 716/21 |
| 2006/0269875 A1 | 11/2006 | Granik | |
| 2007/0198963 A1 | 8/2007 | Granik et al. | |
| 2007/0224526 A1* | 9/2007 | Brunner et al. | 430/30 |
| 2008/0059128 A1 | 3/2008 | Tejnil | |
| 2008/0134131 A1 | 6/2008 | Asano et al. | |
| 2009/0053621 A1* | 2/2009 | Socha | 430/5 |

FOREIGN PATENT DOCUMENTS

WO WO2005/098686 10/2005

OTHER PUBLICATIONS

Schetzen, Martin. "Nonlinear System Modeling Based on the Wiener Theory ", *Proceedings of the IEEE*, vol. 69, No. 12, Dec. 1981.
Cobb, Nicolas Bailey. "Fast Optical and Process Proximity Correction Algorithms for integrated Circuit Manufactoring," Ph. D. Dissertation, University of California at Berkeley, 1998.

(Continued)

*Primary Examiner* — Stacy A Whitmore
(74) *Attorney, Agent, or Firm* — Cooper & Dunham, LLP

(57) ABSTRACT

A method, system, and related computer program products and computer-readable numerical arrays for computer simulation of a photolithographic process is described. In one preferred embodiment, simulation of a photolithographic process is provided in which a computation time for computing each subsequent result for each subsequent combination of process variation values and/or target depths is significantly less than a computation time for computing an initial result for an initial combination of the process variation values and/or target depths. Accordingly, where computation for the initial combination requires a first time interval T, results for (N−1) subsequent combinations can be achieved such that a total time interval for the N results is substantially less than NT. Computation of a process model used for the computer simulation is also described, as well as calibration of the process model to a physical photolithographic processing system.

6 Claims, 30 Drawing Sheets

OTHER PUBLICATIONS

Martin, Patrick et al. "Exploring new high speed, mask aware RET verification flows," Proceedings of SPIE vol. 5853, pp. 114-123, 2005.

Pati, Y.C., et al. "Exploiting Structure in Fast Aerial Image Computation for Integrated Circuit Patterns," *IEEE Transactions on Semiconductor Manufactoring*, vol. 10, No. 1, pp. 62-74, Feb. 2007.

* cited by examiner

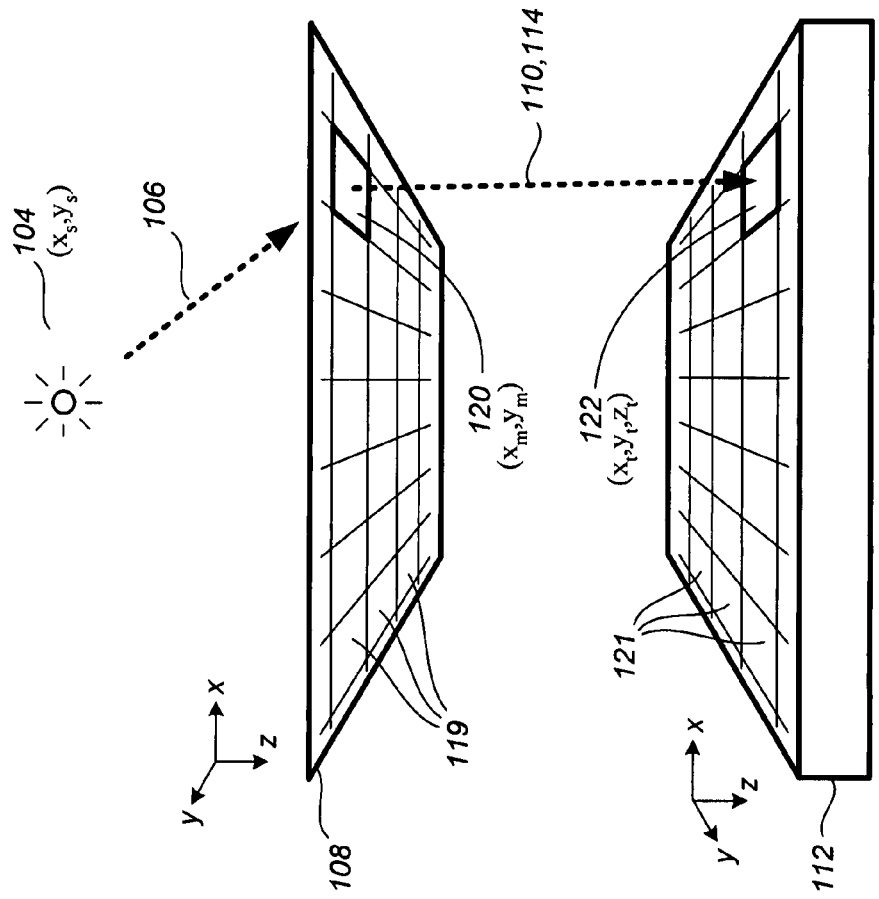
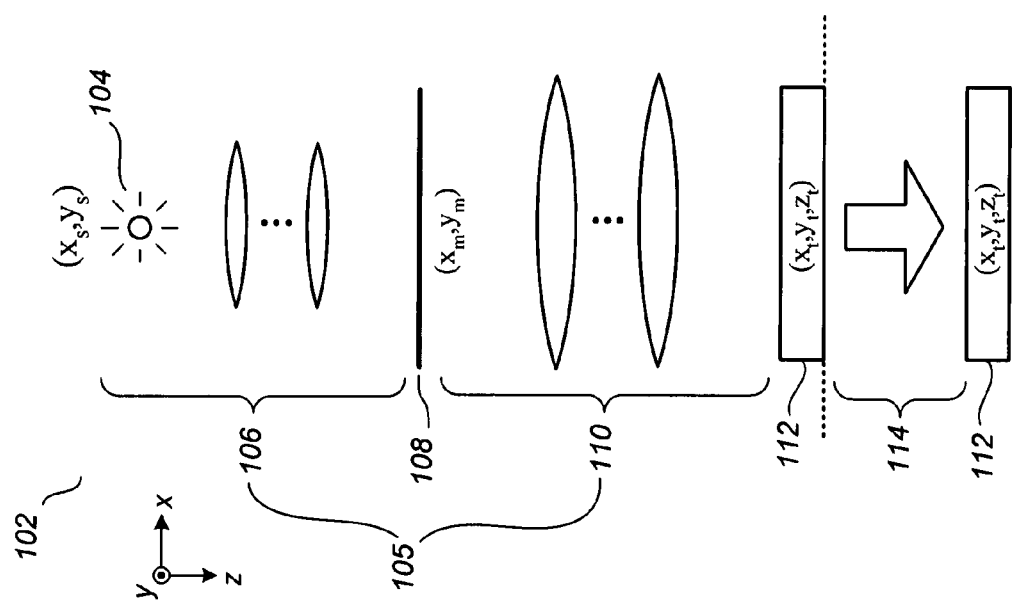
FIG. 1B
FIG. 1A

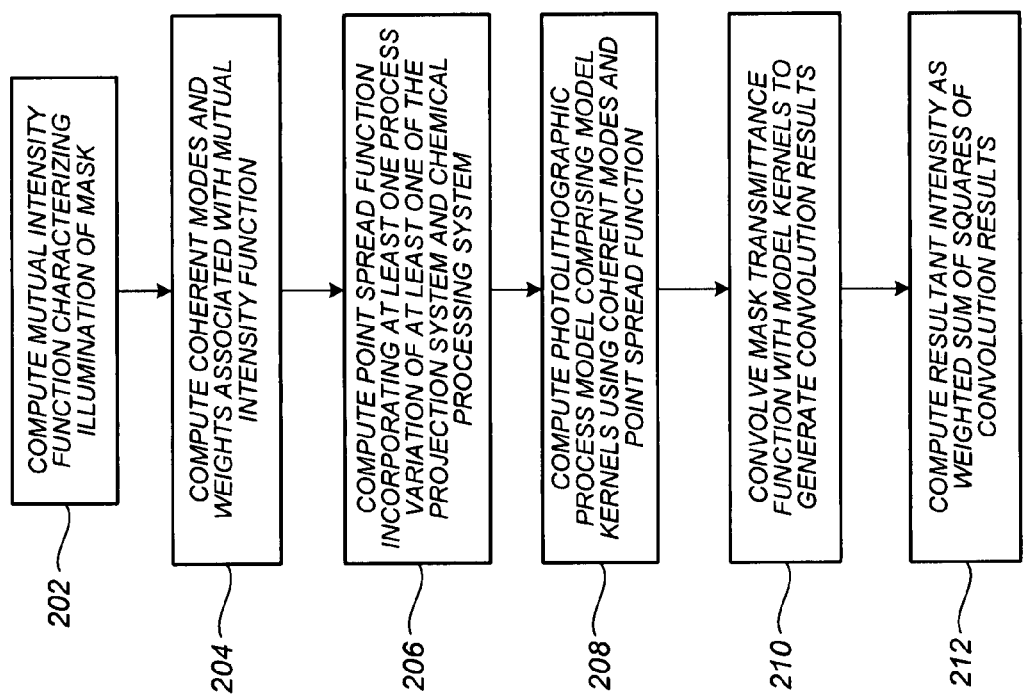

$$I_{TARGET}(x_t,y_t;z_t;var)_{122} = \underbrace{\iiiint}_{120} PSF^*(0,0;x_t-x_{m1},y_t-y_{m1};z_t;var) \; MASK^*(x_{m1},y_{m1}) \; I_M(x_t-x_{m2},y_t-y_{m2};x_t-x_{m1},y_t-y_{m1}) MASK(x_{m2},y_{m2}) \quad \{5c\}$$

$$\overset{OA}{=} \underbrace{\iiiint}_{120} PSF^*(0,0;x_t-x_{m1},y_t-y_{m1};z_t;var) \; MASK^*(x_{m1},y_{m1}) \underbrace{\sum_n \mu_n \xi_n^*(x_t-x_{m1},y_t-y_{m1};z_t;var)\xi_n(x_t-x_{m2},y_t-y_{m2})}_{306 \quad 308} MASK(x_{m2},y_{m2}) PSF(0,0;x_t-x_{m2},y_t-y_{m2};z_t;var) dx_{m1} dy_{m1} dx_{m2} dy_{m2} \quad \{5d\}$$

$$= \sum_n \mu_n \underbrace{\iiiint}_{120} PSF^*(0,0;x_t-x_{m1},y_t-y_{m1};z_t;var) \; MASK^*(x_{m1},y_{m1}) \; \xi_n^*(x_t-x_{m1},y_t-y_{m1};z_t;var) \xi_n(x_t-x_{m2},y_t-y_{m2}) MASK(x_{m2},y_{m2}) PSF(0,0;x_t-x_{m2},y_t-y_{m2};z_t;var) dx_{m1} dy_{m1} dx_{m2} dy_{m2} \quad \{5e\}$$

$$= \sum_n \mu_n \underbrace{\iiiint}_{120} MASK^*(x_{m1},y_{m1}) PSF^*(0,0;x_t-x_{m1},y_t-y_{m1};z_t;var)\xi_n^*(x_t-x_{m1},y_t-y_{m1}) MASK(x_{m2},y_{m2}) PSF(0,0;x_t-x_{m2},y_t-y_{m2};z_t;var)\xi_n(x_t-x_{m2},y_t-y_{m2}) dx_{m1} dy_{m1} dx_{m2} dy_{m2} \quad \{5f\}$$

*FIG. 5-2*

$$I_{TARGET}(x_t,y_t;z_t;var)|_{122} \cong \sum_n \mu_n \iint_{120} MASK^*(x_{m1},y_{m1})PSF^*(0,0;x_t-x_{m1},y_t-y_{m1};z_t;var)\xi^*_n(x_t-x_{m1},y_t-y_{m1}) \, dx_{m1}dy_{m1} \left[ \iint_{120} MASK(x_{m2},y_{m2})PSF(0,0;x_t-x_{m2},y_t-y_{m2};z_t;var)\xi_n(x_t-x_{m2},y_t-y_{m2})dx_{m2}dy_{m2} \right] \quad \{5g\}$$

$$= \sum_n \mu_n \iint_{120} MASK^*(x_m,y_m)PSF^*(0,0;x_t-x_m,y_t-y_m;z_t;var)\xi^*_n(x_t-x_m,y_t-y_m) \, dx_m dy_m \left[ \iint_{120} MASK(x_{m2},y_{m2})PSF(0,0;x_t-x_{m2},y_t-y_{m2};z_t;var)\xi_n(x_t-x_m,y_t-y_m)dx_m dy_m \right] \quad \{5h\}$$

$$= \sum_n \mu_n \left[ \iint_{120} MASK(x_m,y_m)PSF(0,0;x_t-x_m,y_t-y_m;z_t;var)\xi_n(x_t-x_m,y_t-y_m)dx_m dy_m \right]^* \left[ \iint_{120} MASK(x_{m2},y_{m2})PSF(0,0;x_t-x_{m2},y_t-y_{m2};z_t;var)\xi_n(x_t-x_m,y_t-y_m)dx_m dy_m \right] \quad \{5i\}$$

$$= \sum_n \mu_n \left| \iint_{120} MASK(x_m,y_m)PSF(0,0;x_t-x_m,y_t-y_m;z_t;var)\xi_n(x_t-x_m,y_t-y_m)dx_m dy_m \right|^2 \quad \{5j\}$$

FIG. 5-3

$$I_{TARGET}(x_t,y_t;z_t;\text{var})_{122} \approx \sum_n \mu_n \left| \iint_{120} \text{MASK}*(x_m,y_m)\text{PSF}*(0,0;x_t-x_m,y_t-y_m;z_t;\text{var})\xi*_n(x_t-x_m,y_t-y_m)dx_m dy_m \right|^2 \quad \{5k\}$$

$$= \sum_n \mu_n \left| \iint_{120} \text{MASK}(x_m,y_m)\text{PSF}(0,0;x_t-x_m,y_t-y_m;z_t;\text{var})\xi_n(x_t-x_m,y_t-y_m)dx_m dy_m \right|^2 \quad \{5l\}$$

$$I_{TARGET}(x_t,y_t;z_t;\text{var}) = \sum_n \mu_n \left| \text{MASK}(x_t,y_t) \circledast \left[ \text{PSF}(0,0;x_t,y_t;z_t;\text{var})\xi_n(x_t,y_t) \right] \right|^2 \quad \{5m\}$$

*FIG. 5-4*

$$PSF(0,0;x_t-x_m,y_t-y_m;0,z') = \underbrace{\mathcal{F}^{-1}\left\{\sum_{L=0}^{L=Lmax}\frac{[i2\pi z'SQRT(\eta^2-f_x^2-f_y^2)]^L}{L!}H_{MODEL}(f_x,f_y)\right\}}_{808} \quad \{8e\}$$

$$= \sum_{L=0}^{L=Lmax}\frac{z'^L}{L!}\mathcal{F}^{-1}\underbrace{\left\{[i2\pi SQRT(\eta^2-f_x^2-f_y^2)]^L H_{MODEL}(f_x,f_y)\right\}}_{} \quad \{8f\}$$

$$PSF(0,0;x_t-x_m,y_t-y_m;0,z') = \sum_{L=0}^{L=Lmax}\frac{z'^L}{L!}\underbrace{\mathcal{F}^{-1}\left[\underbrace{[i2\pi SQRT(\eta^2-f_x^2-f_y^2)]^L H_{MODEL}(f_x,f_y)}_{814}\right]}_{816} \quad \{8g\}$$

$$PSF(0,0;x_t-x_m,y_t-y_m;0,z') = \sum_{L}^{L=Lmax} f_{COEFF,L}(z')f_{BASIS,L}(x_t-x_m,y_t-y_m) \quad \{8h\}$$

*FIG. 8-3*

$$TCC(x_{m1},y_{m1};x_{m2},y_{m2};z_t;var) = \left[\sum_L f_{COEFF,L}(z_t;var)f_{BASIS,L}(x_{m1},y_{m1})\right]^* J_M^-(x_{m2},y_{m2};x_{m1},y_{m1})_{OA} \left[\sum_{L'} f_{COEFF,L'}(z_t;var)f_{BASIS,L'}(x_{m2},y_{m2})\right] \quad \{12d\}$$

$$= \sum_L \sum_{L'} f^*_{COEFF,L}(z_t;var) f_{COEFF,L'}(z_t;var) \underbrace{f^*_{BASIS,L}(x_{m1},y_{m1}) J_M^-(x_{m2},y_{m2};x_{m1},y_{m1})_{OA} f_{BASIS,L'}(x_{m2},y_{m2})}_{\overset{def}{=} TCC_{BASIS,L,L'}(x_{m1},y_{m1};x_{m2},y_{m2})} \quad \{12e\}$$

$$= \sum_L \sum_{L'} \underbrace{F_{COEFF,L,L'}(z_t;var)}_{} TCC_{BASIS,L,L'}(x_{m1},y_{m1};x_{m2},y_{m2}) \quad \{12f\}$$

$$\underset{1220}{\underbrace{}} \overset{k}{\underset{1219}{\underbrace{}}}$$

$$TCC(x_{m1},y_{m1};x_{m2},y_{m2};z_t;var) = \sum_k F_{COEFF,k}(z_t;var) \, TCC_{BASIS,k}(x_{m1},y_{m1};x_{m2},y_{m2}) \quad \{12g\}$$

FIG. 12-2

$$\text{TCC}_{\text{BASIS},k}(x_{m1},y_{m1};x_{m2},y_{m2}) = \sum_L \text{COEFF}_{k,L} \text{OPTKERN}^*_{k,L}(x_{m1},y_{m1})\text{OPTKERN}_{k,L}(x_{m2},y_{m2})$$

$\underbrace{\phantom{\text{TCC}}}_{1219}$ $\underbrace{\phantom{\sum}}_{1220}$ $\underbrace{\phantom{\text{COEFF}}}_{1224}$ $\underbrace{\phantom{\text{OPTKERN}}}_{1222}$  {12h}

$$I_{\text{TARGET}}(x_t,y_t;z_t;\text{var}) = \sum_k \sum_L F_{\text{COEFF},k}(z_t;\text{var})\, \text{COEFF}_{k,L} \left| \text{MASK}(x_t,y_t) \circledast \text{OPTKERN}_{k,L}(x_t,y_t) \right|^2$$

$$G(f_x, f_y; z_t; var) = \sum_L \sum_k f_{COEFF,L,k}(z_t; var) ZERNIKE_{L,k}(f_x, f_y) \quad \{17c\}$$

$$f_{COEFF,L,k}(z_t; var) = \iint ZERNIKE^*_{L,k}(f_x, f_y) G(f_x, f_y; z_t; var) df_x df_y \quad \{17d\}$$

$$PSF(0,0; x_t - x_m, y_t - y_m; z_t; var) = \mathcal{F}^{-1}\left\{ \sum_L \sum_k f_{COEFF,L,k}(z_t; var) ZERNIKE_{L,k}(f_x, f_y) H_{MODEL}(f_x, f_y) \right\} \quad \{17e\}$$

$$= \sum_L \sum_k f_{COEFF,L,k}(z_t; var) \underbrace{\mathcal{F}^{-1}\left\{ ZERNIKE_{L,k}(f_x, f_y) H_{MODEL}(f_x, f_y) \right\}}_{f_{BASIS,L,k}(x_t - x_m, y_t - y_m)} \quad \{17f\}$$

$$PSF(0,0; x_t - x_m, y_t - y_m; z_t; var) = \sum_n f_{COEFF,n}(z_t; var) f_{BASIS,n}(x_t - x_m, y_t - y_m) \quad \{17g\}$$

FIG. 17-2

PHOTOLITHOGRAPHIC PROCESS SIMULATION INCLUDING EFFICIENT RESULT COMPUTATION FOR MULTIPLE PROCESS VARIATION VALUES

This patent application is a continuation of U.S. Ser. No. 11/331,223, filed Jan. 11, 2006, now abandoned.

FIELD

This patent specification relates to computer simulation of photolithographic processes as may be employed, for example, in sub-wavelength integrated circuit fabrication environments.

BACKGROUND

Computer simulation has become an indispensable tool in a wide variety of technical endeavors ranging from the design of aircraft, automobiles, and communications networks to the analysis of biological systems, socioeconomic trends, and plate tectonics. In the field of integrated circuit fabrication, computer simulation has become increasingly important as circuit line widths continue to shrink well below the wavelength of light. In particular, the optical projection of circuit patterns onto semiconductor wafers, during a process known as photolithography, becomes increasingly complicated to predict as pattern sizes shrink well below the wavelength of the light that is used to project the pattern. Historically, when circuit line widths were larger than the light wavelength, a desired circuit pattern was directly written to an optical mask, the mask was illuminated and projected toward the wafer, the circuit pattern was faithfully recorded in a layer of photoresist on the wafer, and, after chemical processing, the circuit pattern was faithfully realized in physical form on the wafer. However, for sub-wavelength circuit line widths, it becomes necessary to "correct" or pre-compensate the mask pattern in order for the desired circuit pattern to be properly recorded into the photoresist layer and/or for the proper physical form of the circuit pattern to appear on the wafer after chemical processing. Unfortunately, the required "corrections" or pre-compensations are themselves difficult to refine and, although there are some basic pre-compensation rules that a human designer can start with, the pre-compensation process is usually iterative (i.e., trial and error) and pattern-specific to the particular desired circuit pattern.

Because human refinement and physical trial-and-error quickly become prohibitively expensive, optical proximity correction (OPC) software tools have been developed that automate the process of pre-compensating a desired circuit pattern before it is physically written onto a mask. Starting with the known, desired circuit pattern, an initial mask design is generated using a set of pre-compensation rules. For the initial mask design, together with a set of process conditions for an actual photolithographic processing system (e.g., a set of illumination/projection conditions for a "stepper" and a set of chemical processing conditions), a simulation is performed that generates a simulated image of the pattern that would appear on the wafer after the photoresist was exposed and chemically processed. The simulated image is compared to the desired circuit pattern, and deviations from the desired circuit pattern are determined. The mask design is then modified based on the deviations, and the simulation is repeated for the modified mask design. Deviations from the desired circuit pattern are again determined, and so on, the mask design being iteratively modified until the simulated image agrees with the desired circuit pattern to within an acceptable tolerance. The accuracy of the simulated image is, of course, crucial in obtaining OPC-generated mask designs that lead to acceptable results in the actual production stepper machines and chemical processing systems of the actual integrated circuit fabrication environments.

Photolithographic process simulation generally comprises optical exposure simulation and chemical processing simulation. During optical exposure simulation, the operation of a photolithographic processing system (e.g., stepper) is simulated to compute an optical intensity pattern in the photoresist. The computed optical intensity can be purely two-dimensional, i.e., a function of two variables that treats the photoresist layer as a single plane. Alternatively, the optical exposure simulation can treat the photoresist layer as a volume, and compute two-dimensional optical intensities for a plurality of planar levels within the photoresist volume. In still another alternative, the optical exposure simulation can provide a three-dimensional optical intensity.

During chemical processing simulation, the effects of chemical processing (which may include, for example, treating the exposed/unexposed resist, washing away the exposed/unexposed resist, wet or dry etching, etc.) are simulated to compute a resultant intensity pattern in the resist and/or the wafer. In some cases the chemical processing simulation is carried out in a very simple manner, such as by simply thresholding a purely two-dimensional optical intensity pattern by a fixed, predetermined value to generate a resultant intensity that is a binary or continuous pattern. In other cases, the chemical processing simulation can be more complex by processing the optical intensity pattern in location-dependent, pattern-dependent, or depth-dependent manners, or in other ways. In still other cases, such as during the design or troubleshooting of the stepper machines themselves by a stepper machine manufacturer, the chemical processing simulation is omitted altogether (i.e., is a null step in the photolithographic process simulation), with the two-dimensional or three-dimensional optical intensity pattern itself being of primary interest to the user.

For purposes of clarity and not by way of limitation, the output of an optical exposure simulation is referenced herein as an optical intensity. As used herein, resultant intensity refers to the output of an overall photolithographic process simulation. In cases where the chemical processing simulation is a null step in the overall photolithographic process simulation, the resultant intensity corresponds to an optical intensity. Depending on the particular need, the resultant intensity can represent any of a variety of different images or physical quantities including, but not limited to, an optical intensity, an aerial image, a latent image in a resist film, a developed resist pattern, a final semiconductor pattern, and an etch depth profile within a final semiconductor.

It is crucial to accurately compute the optical intensity pattern in the photoresist and to accurately compute the chemical processing effects in order to enable the overall photolithographic process simulation result to be accurate. In addition to the OPC software context, accurate photolithographic process simulation is also useful in other contexts including, but not limited to, resolution enhancement techniques (RETs) additional to OPCs, in which the effectiveness of a particular RET strategy can be verified by simulation.

One or more issues arise in relation to the simulation of a photolithographic process, at least one of which is resolved by at least one of the preferred embodiments described herein. It is to be appreciated, however, that the scope of the preferred embodiments is also widely applicable to a variety of different optical exposure processes, with or without subsequent chemical processing steps, and is not limited to the particular environment of integrated circuit fabrication. One key issue relates to computation time. For example, as indicated in US2005/0015233A1, which is incorporated by reference herein, computation of a single optical intensity for a single resist plane and a single set of process conditions using conventional methods can take hours or even days. In practice, it is often desired to compute the optical intensity for many different values of one or more exposure system variations, and/or to compute the optical intensity for many different resist planes. It is further often desired to compute the resultant intensity for many different values of one or more exposure system or chemical processing system variations, and/or to compute the resultant intensity for many different planes within the photoresist layer or the processed wafer. This can drastically increase the already-substantial computation time in order to compute the desired overall set of results. Other issues arise as would be apparent to one skilled in the art upon reading the present disclosure.

SUMMARY

A method, system, related computer program products, and related computer-readable numerical arrays for computer simulation of a photolithographic process are provided. In one preferred embodiment, a first resultant intensity for a first value of a process variation associated with the photolithographic process is computed by processing a mask transmittance function with a plurality of model kernels characterizing the photolithographic process. Subsequent resultant intensities for subsequent values of the process variation are computed in a manner that does not require additional processing of the mask transmittance function in conjunction with the model kernels, each subsequent resultant intensity being computed in a substantially shorter time than that needed to compute the first resultant intensity. Thus, where computation for a single process variation value requires a first time interval T, results for N different process variation values can be achieved within a second time interval that is substantially less than NT.

According to another preferred embodiment, a first resultant intensity for a first target depth is computed by processing a mask transmittance function with a plurality of model kernels characterizing the photolithographic process. Subsequent resultant intensities for subsequent target depths are computed in a manner that does not require additional processing of the mask transmittance function in conjunction with the model kernels, each subsequent resultant intensity being computed in a substantially shorter time than that needed to compute the first resultant intensity.

According to another preferred embodiment, a first resultant intensity for a first combination of values for at least two process variations is computed by processing a mask transmittance function with a plurality of model kernels characterizing the photolithographic process. Subsequent resultant intensities for subsequent combinations of values for the at least two process variations are computed in a manner that does not require additional processing of the mask transmittance function in conjunction with the model kernels, each subsequent resultant intensity being computed in a substantially shorter time than that needed to compute the first resultant intensity.

According to another preferred embodiment, a first resultant intensity for a first combination of values for a target depth and at least one process variation is computed by processing a mask transmittance function with a plurality of model kernels characterizing the photolithographic process. Subsequent resultant intensities for subsequent combinations of values for the target depth and the at least one process variation are computed in a manner that does not require additional processing of the mask transmittance function in conjunction with the model kernels, each subsequent resultant intensity being computed in a substantially shorter time than that needed to compute the first resultant intensity.

According to another preferred embodiment, a process model of a photolithographic process for use in a computer simulation thereof is computed, the photolithographic process having physical parameters associated therewith, the process model comprising model kernels. A transmission cross coefficient (TCC) is computed based on the physical parameters, the TCC characterizing the photolithographic processing system and incorporating a process variation and/or a target depth according to a series expansion having TCC basis spatial functions not dependent on that process variation and/or target depth and at least one TCC expansion coefficient dependent on that process variation and/or target depth. The model kernels are computed from the basis spatial functions.

According to another preferred embodiment, a process model of a photolithographic process for use in a computer simulation thereof is computed, the photolithographic process having physical parameters associated therewith, the process model comprising model kernels and model kernel weights. A mutual intensity function is computed based on the physical parameters, the mutual intensity function characterizing an illumination system that illuminates a mask. A plurality of coherent modes and a corresponding plurality of coherent mode weights associated with the mutual intensity function are computed. A point spread function based on the physical parameters is computed, the point spread function characterizing a projection system that projects the illuminated mask toward a target to expose the target. The point spread function may be further extended to include certain effects due to a chemical processing system that chemically processes the exposed target to generate a resultant intensity. The model kernels and model kernel weights are computed using the coherent modes, the coherent mode weights, and the point spread function. In other preferred embodiments, calibration methods are provided for calibrating process models to physical photolithographic processing systems.

BRIEF DESCRIPTION OF THE DRAWINGS

FIG. 1A illustrates a photolithographic processing system for simulation according to a preferred embodiment;

FIG. 1B illustrates a perspective view of the photolithographic processing system of FIG. 1A;

DETAILED DESCRIPTION

Figure 3:
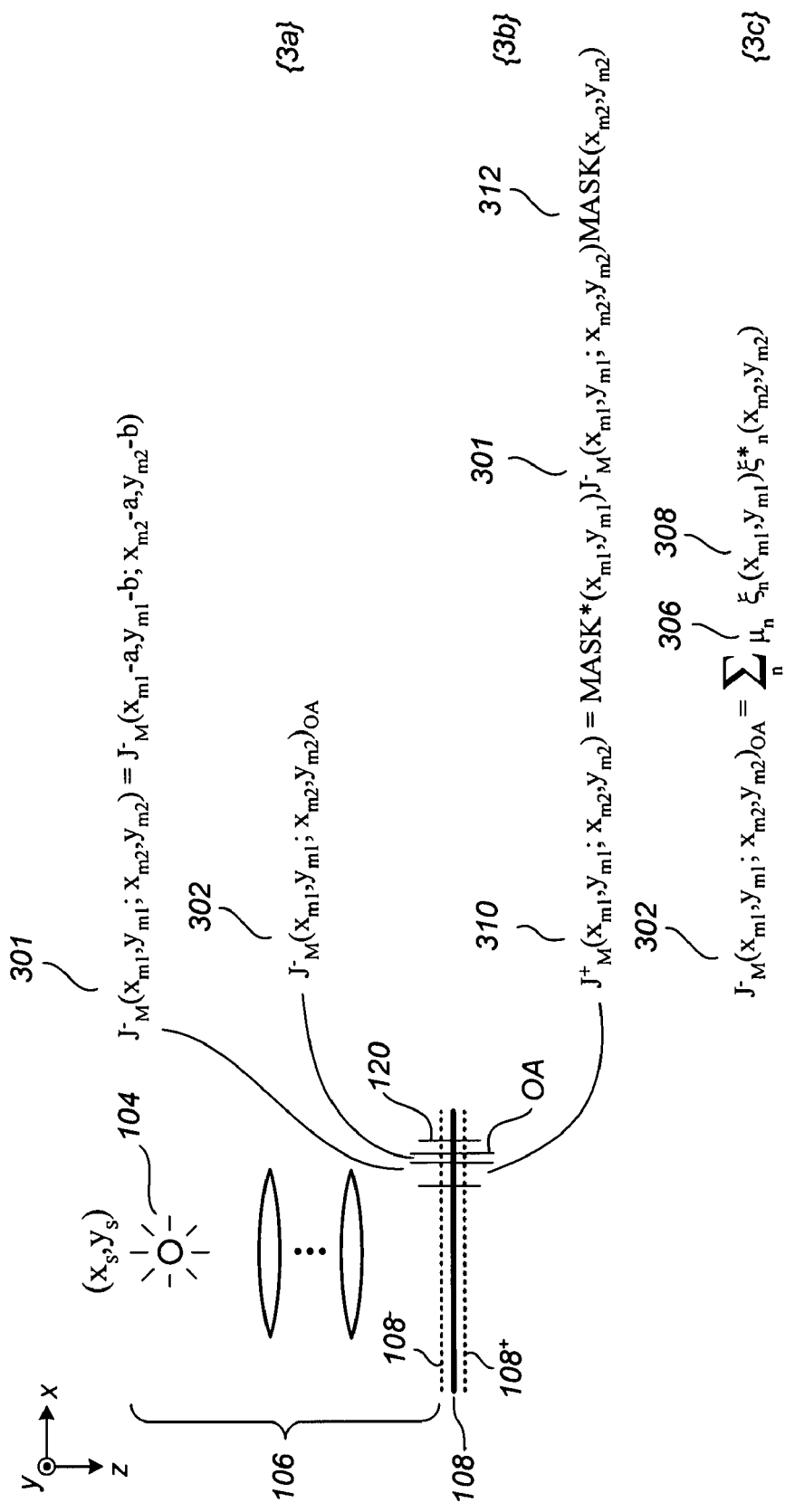
FIG. 3 illustrates an illumination system of a photolithographic processing system and expressions relating to describing photolithographic process simulation according to a preferred embodiment.

FIG. 1A illustrates a simplified representation of a photolithographic processing system 102 for computer simulation according to one or more of the preferred embodiments described herein. Photolithographic processing system 102 comprises an optical exposure system 105 and a chemical processing system 114. Optical exposure system 105 comprises an illumination system 106 that illuminates a mask 108, such as a photolithographic mask, and a projection system 110 that projects the illuminated mask toward a target 112 to expose the target 112. The illumination system 106 includes an optical source 104. The optical exposure system 105 may represent a photolithographic stepper machine ("stepper"), and the target 112 can be a semiconductor wafer covered with photoresist ("resist"), although the scope of the present teachings is not so limited.

Chemical processing system 114 comprises devices that chemically process the target 112 after exposure, and also represents the photochemical reaction of resist molecules upon absorption of exposure photons. Subsequent to the exposure process, the chemical processing is often performed after the target 112 has been physically removed from the optical exposure system 105. For clarity of presentation and not by way of limitation, the chemical processing system 114 is conceptually illustrated by an enlarged arrow beneath the projection system 110 in FIG. 1A. Prior to chemical processing (i.e., above the enlarged arrow in FIG. 1A) the effects of the photolithographic system 102 on the target 112 can be characterized by an optical intensity pattern. As used herein, an optical intensity value can be a time-constant or time-varying instantaneous value and/or can be a time integral of the instantaneous value. Subsequent to chemical processing (i.e., below the enlarged arrow in FIG. 1A) the effects of the photolithographic system 102 on the target 112 can be characterized by a resultant intensity pattern corresponding to any of a variety of physical results including, but not limited to, an aerial image, a latent resist image, a developed resist pattern, a final semiconductor pattern, and an etch depth profile within a final semiconductor. If the chemical processing is a null step (i.e., if chemical processing system 114 is not present or turned off), the resultant intensity for the target 112 corresponds to the optical intensity for the target 112.

In general, the simulation process comprises receiving known physical parameters of the photolithographic processing system 102, generating mathematical models that represent its operation, and applying those mathematical models to proposed transmittance functions of the mask 108 to compute resultant intensities. For purposes of generality, the target 112 is illustrated in FIG. 1A as a volumetric object. However, it is to be appreciated that optical intensities and resultant intensities can be either two-dimensional profiles for single planes thereon or therein, or can be three-dimensional profiles for the entire volume or a subvolume therein.

Among the advantages of at least one of the preferred embodiments described herein, easier computation of $I_{TARGET}(x_t,y_t,z_t;var)$ is provided, where $z_t$ represents a target depth into the target 112, and where var represents one or more process variations. Process variations include optical exposure system variations for the optical exposure system 105 and chemical processing variations for the chemical processing system 114. Optical exposure system variations include illumination system variations for the illumination system 106 and projection system variations for the projection system 110. Examples of illumination system variations include, but are not limited to, intensity/position variations of multiple emitters, source chromatic variations, coherence variations, and source positioning variations. Examples of projection system variations include, but are not limited to, defocus variations, lens aberrations, immersion medium refractive index variations, immersion medium attenuation coefficient variations, stack film thickness variations, stack film material refractive index variations, and stack film material attenuation coefficient variations. A defocus variation can arise, for example, from mechanical errors in the vertical position of a wafer-supporting platform in a stepper machine relative to the optics of the projection system 110. Examples of chemical processing variations include, but are not limited to, resist development variations and chemical etching process variations. Although just the single term "var" is often used herein to denote process variations, it is to be appreciated that "var" can represent a plurality of process variations var1, var2, var3, etc.

As used herein, value of a process variation refers broadly to any quantitative descriptor, index, or indicator reflecting an amount, degree, class, type, magnitude, direction, nature, or other characteristic associated with the process variation. Although in many cases the value of a process variation will be a scalar number (e.g., a scalar distance metric for the case of defocus variations), in other cases the value of a process variation may be a vector or multidimensional expression, an index into a lookup table, a percentage, a color, a shape, or other indicator, including a null value if the particular process variation does not exist, has no effect, or is not to be considered. It is to be appreciated that a value of a process variation, as that term is used herein, might only be abstractly related to the physical underpinnings of the process variation itself, provided only that some kind of change in the process variation is associated with some kind of change in the value.

According to one of the computational advantages of at least one of the preferred embodiments described herein, the number of computationally expensive convolutions of the mask transmittance function with model kernels does not increase with the number of different value combinations for one or more process variations and/or target depths for which target intensity results are desired. Instead, according to at least one of the preferred embodiments herein, only a single set of convolutions of the mask transmittance function with model kernels is required for computing target intensity results for a number of different value combinations for the one or more process variations and/or target depths. Once this single set of convolutions is computed for a first value combination (for example, var=[defocus$_1$,aberration$_1$] together with depth=depth$_1$), the same convolution results are then combined differently according to variation-dependent and/or depth-dependent weights for generating results for different value combination (for example, var=[defocus$_2$,aberration$_2$] together with depth=depth$_2$). Notably, combining the same convolution results with differing weights is substantially less computationally intensive than generating different convolution results for each different process variation value and/or target depth. Accordingly, when simulating a photolithographic process according to one or more of the preferred embodiments, substantial computation time is saved when resultant intensities are desired for several different value combinations for the one or more process variations and/or target depths.

For one or more of the preferred embodiments described herein, for an initial process variation value and/or an initial target depth, the number of model kernels with which the mask transmittance function is convolved can be larger than a number of optical kernels used in one or more prior art methods. Accordingly, for any particular mask transmittance function, if only a single aerial image is desired for a single process variation value for a single target depth, the computational advantages may not be readily apparent. However, for the more prevalent case in which results for several process variation values and/or target depths are desired, drastic computational advantages over the one or more prior art methods are realized.

Referring again to FIG. 1A, coordinates $(x_s, y_s)$ are used for the plane of the source 104, coordinates $(x_m, y_m)$ are used for the plane of the mask 108, and coordinates $(x_t, y_t)$ or $(x_t, y_t, z_t)$ are used for the target 112. FIG. 1B illustrates a conceptual view of the optical source 104, the mask 108, and the target 112. For clarity of presentation, image reversal and image reduction (e.g., 4:1) associated with the projection system 110 are not included in FIG. 1B and herein, as a person skilled in the art would be readily able to implement the preferred embodiments factoring in the appropriate image reversal/reduction in view of the present disclosure.

FIG. 1B illustrates the mask 108 and target 112 as subdivided for computational purposes into mask segments 119 and target segments 121, respectively. As known in the art, adjacent ones of mask segments 119 and target segments 121 may have slight overlaps according to an optical ambit of the projection system 110 and diffusion radius of the chemical processing system 114, respectively. Due to the spatially-limited optical ambit of the projection system 110, any particular one of the mask segments 119 (e.g., an exemplary mask segment 120) can be processed separately from the other mask segments 119 to compute a resultant intensity at a corresponding target segment 121 (e.g., an exemplary target segment 122 corresponding to the exemplary mask segment 120). By way of example, and not by way of limitation, for photolithographic simulation for chips of size $(1\ mm)^2$ to $(10\ mm)^2$ there may be between $(100)^2$ and $(1000)^2$ mask segments 119 and corresponding target segments 121, each having a size of about $(10\ \mu m)^2$. In turn, each mask segment 119 may comprise M×M numerical values representing mask transmittances within that segment, with M being about 100-1000, with resultant intensity values being computed for each of M×M corresponding target segment locations. Another suitable representation for the mask 108 is binary or phased polygons specified by coordinates of vertices. Typical sampling grid spacing for both mask and target may be on the order of 10-100 nm. The optical ambit for such cases may be on the order of 1 μm, corresponding to between 10 sample points and 100 sample points along each dimension. It is to be appreciated, however, that such computational array sizes and sampling grids are highly dependent on the particular nature of the exposure process being simulated, the type and speed of computing hardware being used, and other factors, and therefore can vary by orders of magnitude without departing from the scope of the preferred embodiments.

The computations for the different mask segments 119 and their corresponding target segments 121 can be performed separately and in parallel on separate computing devices to reduce the overall simulation time required. Under an assumption of global shift-invariance of the optical exposure system 105, the different computing devices can be programmed with the same simulation algorithm. However, the scope of the preferred embodiments is not limited to the use of the same simulation algorithm for different mask segments. Moreover, the scope of the preferred embodiments can include scenarios in which different mask segments are of different size and/or shape. As illustrated in FIG. 1B, the exposure process can be conceptually broken down into the illumination of an exemplary mask segment 120 by the illumination system 106, and the projection of the illuminated mask segment 120 onto the corresponding target segment 122.

Figures 1, 8:
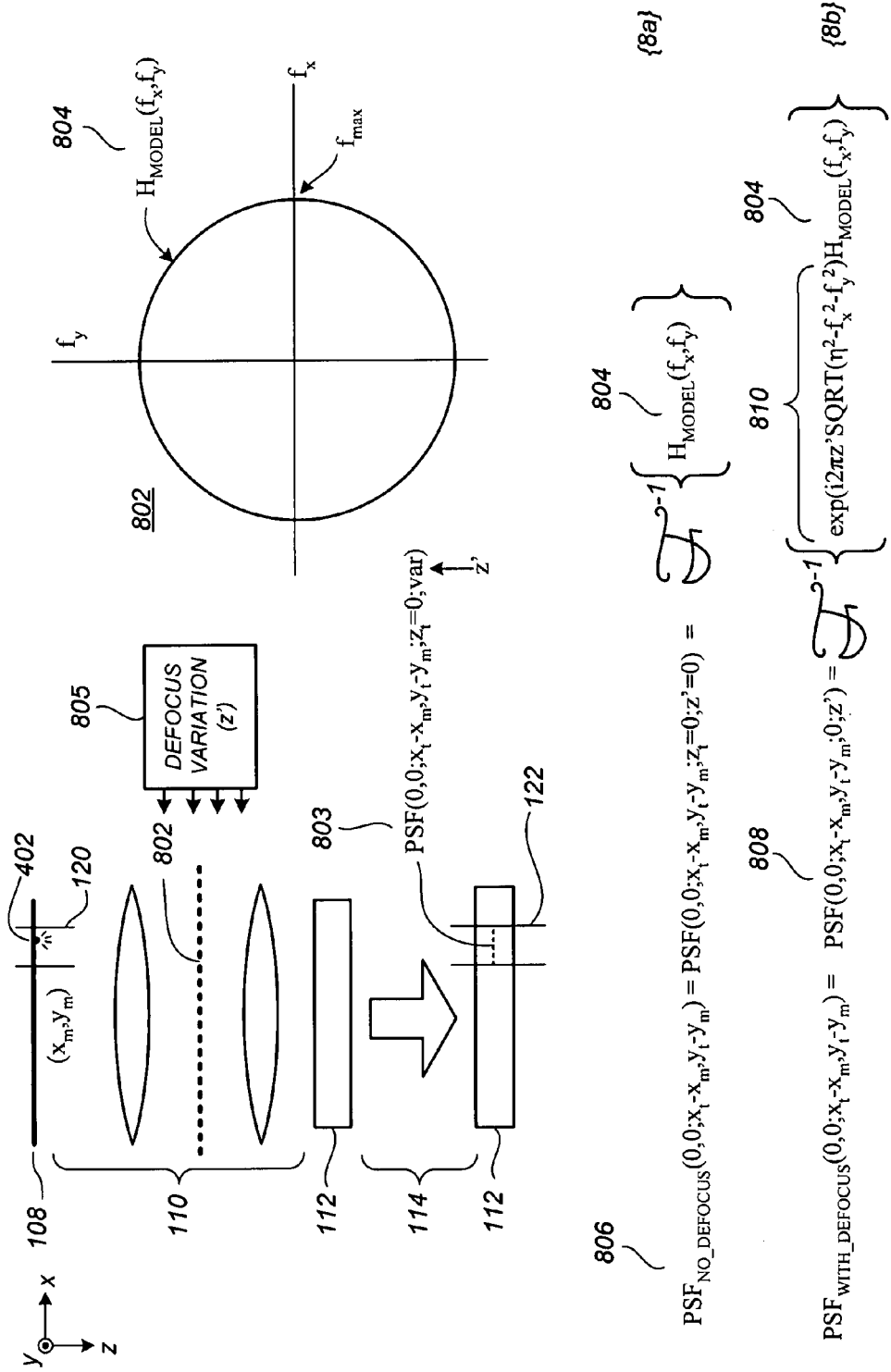
FIG. 8 illustrates a projection system and a chemical processing system of a photolithographic processing system, a plot of a model pupil aperture of the projection system, and expressions relating to describing photolithographic process simulation according to a preferred embodiment.
Figures 2, 8:
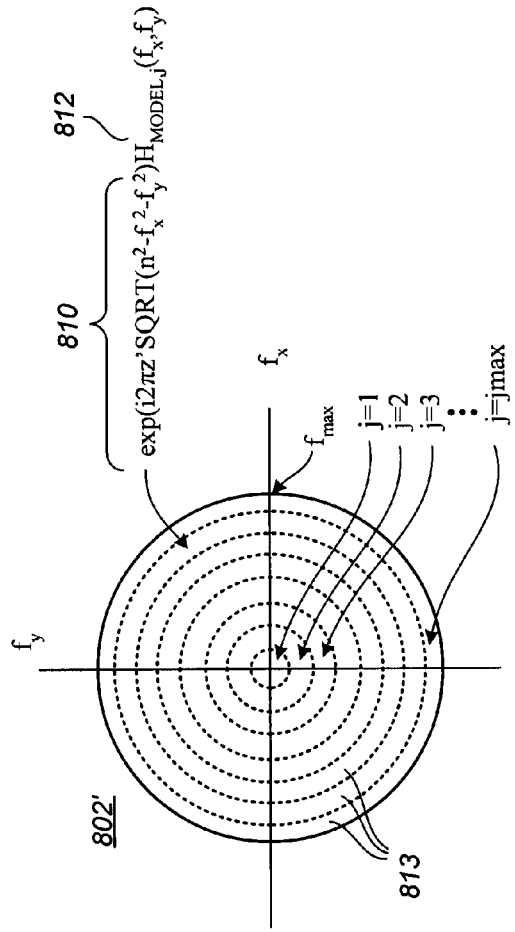
FIG. 2 illustrates simulating a photolithographic process according to a preferred embodiment.

FIG. 2 illustrates simulating a photolithographic process according to a preferred embodiment. At step 202, a mutual intensity function is computed characterizing illumination of the mask 108 by the illumination system 106. At step 204, a plurality of coherent modes and weights associated with the mutual intensity function are computed. Steps 202 and 204 are discussed further infra in relation to FIG. 3.

At step 206, a point spread function is computed that characterizes the projection system and the chemical processing system (if the chemical processing is not a null step), the point spread function incorporating at least one process variation for at least one of the projection system and the chemical processing system. At step 208, a process model is computed using the coherent modes and the point spread function, the process model comprising model kernels. At step 210, the mask transmittance function is convolved with the model kernels to generate convolution results. At step 212, a resultant intensity in the target 112 is computed as a weighted sum of the squares of the convolution results. Steps 206-212 are discussed further infra in relation to FIGS. 4-5. For a scenario in which the chemical processing is a null process (e.g., if the user presumes that the chemical processing system is not present, or is turned off, or if the chemical processing system is simulated separately from the optical exposure system), the process model is an optical model, the model kernels are optical kernels, and the resultant intensity is an optical intensity as those terms are used herein.

FIG. 3 illustrates a portion of the photolithographic processing system 102 of FIG. 1A and expressions relating to describing photolithographic process simulation according to a preferred embodiment. In particular, FIG. 3 illustrates the illumination system 106 and mask 108 of FIG. 1A together with a plane 108$^-$ immediately prior to the mask 108 and a plane 108$^+$ immediately subsequent to the mask 108. Also shown in FIG. 3 is a mutual intensity function 301 representing incident electromagnetic radiation at plane 108$^-$. Mutual intensity functions are discussed generally in M. Born and E. Wolf, *Principles of Optics*, 7$^{th}$ ed., Cambridge University Press (1999) at Chapter 10. As known in the art, a mutual intensity function at a particular plane is a complex-valued function of four variables (the x and y locations of two points within the plane) and carries substantially "more information" about the electromagnetic radiation than a "regular" optical intensity function, which is a non-negative, real-valued function of a single point within the plane and which represents a special case of the mutual intensity function when its two points are on top of each other. Although it is usually only necessary to compute the "regular" optical intensity function at the target (related to the resultant intensity through chemical processing effects, if present), consideration of mutual intensities at intermediate locations is advantageous for properly computing that optical intensity in accordance with a preferred embodiment.

The mutual intensity function 301 can be computed at step 202 of FIG. 2, supra, using known methods based on the physical parameters of the illumination system 106 including the optical source 104. Nominal or "starter" values for the illumination system physical parameters and projection system physical parameters are usually provided with each stepper device. Notably, the illumination system physical parameters that are used to generate the mutual intensity function 301 can be generated, derived, assumed, etc., by any of a variety of different methods without departing from the scope of the preferred embodiments. For example, during a simulator calibration process described further with respect to FIG. 15B, infra, the illumination system physical parameters can themselves be the subject of an optimization process in which they are iteratively refined.

The mutual intensity function 301 is shift-invariant which, in conjunction with a spatially limited optical ambit, allows windowing to a smaller size for computational purposes to form a windowed mutual intensity function 302. The window size for the windowed mutual intensity function 302 can be, for example, about twice the size of the optical ambit on a side. Referring to an example scenario in which the optical ambit is 1 μm and in which the sampling grid is 50 nm, the windowed mutual intensity function 302 would be an M'×M'×M'×M' array of complex values, where M' is about 40.

Shown at FIG. 3 (Eq. {3c}) is a representation of the windowed mutual intensity function 302 in terms of its coherent modes 308 and coherent mode weights 306, as computed at step 204 of FIG. 2, supra. In one preferred embodiment, the coherent modes 308 are eigenvectors of a linear operator with the windowed mutual intensity function 302 as a Hilbert-Schmidt kernel, and can be generated therefrom using known, off-the-shelf eigenanalysis software. Referring to the above example scenario in which the windowed mutual intensity 302 is an M'×M'×M'×M' array of complex values, each coherent mode 308 would be an M'×M' array of complex values and each coherent mode weight 306 would be a scalar quantity. The expansion shown in FIG. 3 (Eq. {3c}) can be referred to as the coherent mode representation of the partially coherent illumination field. Although the number of coherent modes 308 and coherent mode weights 306 may be theoretically infinite, acceptable results can be achieved by limiting the expansion to a maximum number nmax, with an example value of nmax being about 10.

Also illustrated in FIG. 3 is a mutual intensity function 310 representing electromagnetic radiation at plane 108$^+$. The mutual intensity function 310 is equal to the incident mutual intensity function 301 at plane 108$^-$ modified by point-wise post-multiplication with the mask transmittance function 312 and point-wise pre-multiplication with the conjugate of the mask transmittance function 312 as indicated in FIG. 3 Eq. {3b}).

Figure 4:
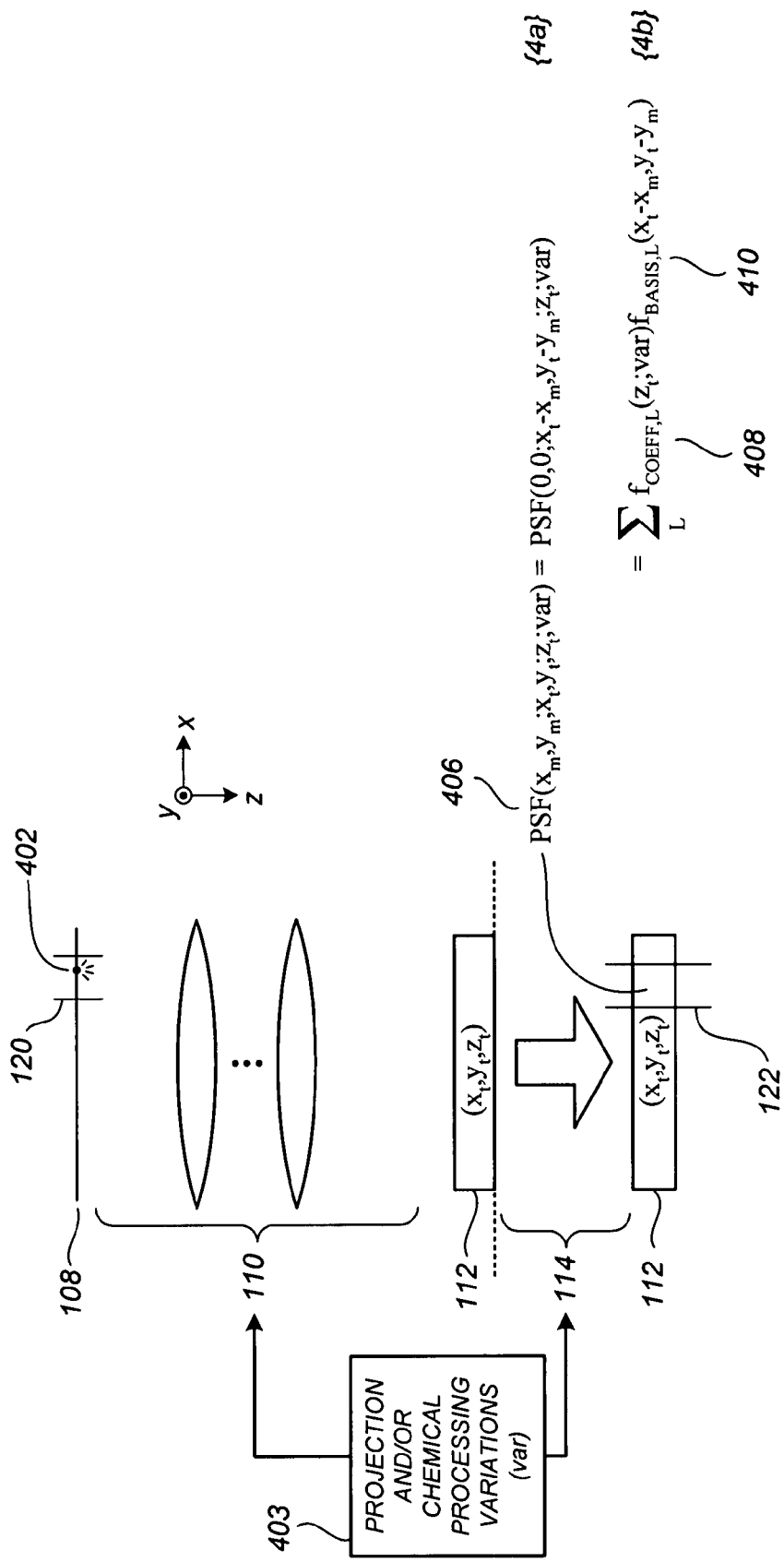
FIG. 4 illustrates a projection system and a chemical processing system of a photolithographic processing system and expressions relating to describing photolithographic process simulation according to a preferred embodiment.

FIG. 4 illustrates a portion of the photolithographic processing system 102 of FIG. 1A and expressions relating to describing photolithographic process simulation according to a preferred embodiment. In particular, FIG. 4 illustrates the mask 108, the projection system 110, the chemical processing system 114, and the target 112 of FIG. 1A. FIG. 4 also conceptually illustrates at least one process variation 403 ("var") representing projection system and/or chemical processing system variations. According to one preferred embodiment, the projection system 110 and chemical processing system 114 are characterized by a point spread function representing a response to a conceptual unit point emitter 402 at the mask plane 108, wherein the point spread function incorporates the at least one process variation. According to another preferred embodiment, the projection system 110 is characterized by a point spread function representing a response to the conceptual unit point emitter 402, wherein the point spread function incorporates a target depth for different target depths $z_t$. According to another preferred embodiment, the projection system 110 is characterized by a point spread function representing a response to the conceptual unit point emitter 402, wherein the point spread function incorporates both the at least one process variation and the target depth.

In accordance with the mask and target segmentations described supra in relation to FIG. 1B, for points having lateral locations $(x_t, y_t)$ within the target segment 122 it is usually only necessary to consider the effects of conceptual unit point emitters at locations $(x_m, y_m)$ within the mask segment 120, although the scope of the preferred embodiments is not so limited. Furthermore, it is only necessary to consider a small window of optical ambit with side equal to, say, twice the optical ambit, which has M'×M' sampling points, with M' being about 40, although the scope of the preferred embodiments is not so limited. Illustrated in FIG. 4 is a point spread function 406 that incorporates, in addition to the location arguments $(x_m, y_m)$ and $(x_t, y_t)$, the arguments $z_t$ and var. Preferably, the point spread function 406 is characterized as being shift-invariant such that its value depends on the relative locations of the points $(x_m, y_m)$ and $(x_t, y_t)$ rather than their absolute locations, as illustrated at FIG. 4 (Eq. {4a}).

Referring again to step 206 of FIG. 2, the point spread function 406 can be computed using any of a variety of methods, whether analytical, numerical, or both, as a function of the spatial indices $(x_m, y_m; x_t, y_t)$ and the depth and variation indices $(z_t, var)$. There are several ways that this can be achieved, as would be apparent to one skilled in the art in view of the present disclosure. In one preferred embodiment, the point spread function 406 is characterized as being dependent on the process variations/target depth (var,$z_t$) according to a series expansion having basis spatial functions 410 not dependent on the process variations/target depth (var,$z_t$) and having at least one expansion coefficient 408 dependent on the process variations/target depth (var,$z_t$), as illustrated at FIG. 4 (Eq. {4b}). The particular basis spatial functions 410 of FIG. 4, which correspond to the PSF, may be called PSF basis spatial functions, and the expansion coefficients 408 may be called PSF expansion coefficients. The PSF basis spatial functions 410 are also termed partial response functions 410 hereinbelow, while the PSF expansion coefficients 408 are also termed partial response coefficients 408 hereinbelow. One specific formulation for achieving such characterization when there is a defocus variation z' is described infra in relation to FIG. 8 (Eq. {8h}). Another formulation for achieving such characterization, which is for a more general case in which the process variations/target depth (var,$z_t$) can be modeled as affecting a model pupil function is described infra in relation to FIG. 17, although other methods may be used as well.

The terms basis spatial function and expansion coefficient are clarified here such that simple nomenclature adjustments will not cause departure from the scope of the preferred embodiments. Let a generic function f(x,y;var) be expandable in the form f(x,y;var)=$g_1$(var)$h_1$(x,y)+$g_2$(var)$h_2$(x,y)+$g_3$(var)$h_3$(x,y)+ . . . , where var represents one or more variation variables, and where (x,y) represent two or more spatial variables or indices into numerical arrays that depict spatially dependent values. Under nomenclature consistent with the description of FIG. 4 (Eq. {4b}), and as used herein, the functions $h_k$ are termed basis spatial functions and the functions $g_k$ shall be termed expansion coefficients.

Figures 1, 5:
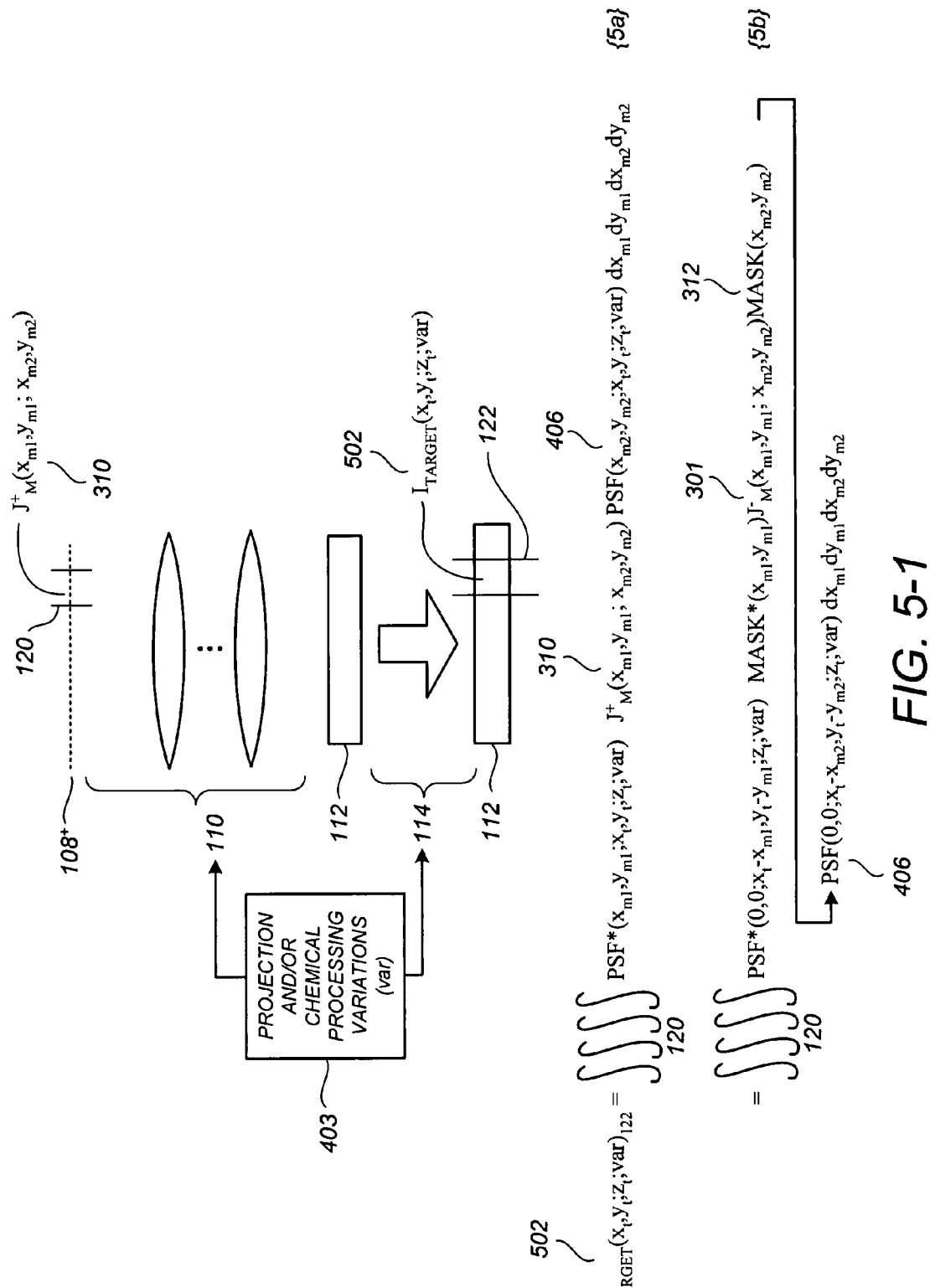
FIG. 5 illustrates a projection system and a chemical processing system of a photolithographic processing system and expressions relating to describing photolithographic process simulation according to a preferred embodiment.

FIG. 5 illustrates a portion of the photolithographic processing system 102 of FIG. 1A and expressions relating to describing photolithographic process simulation according to a preferred embodiment. In particular, FIG. 5 illustrates the plane 108⁺ immediately subsequent to the mask 108, as well as the projection system 110, the chemical processing system 114, and the target 112 of FIG. 1A. FIG. 5 also conceptually illustrates at least one process variation 403 ("var") representing projection system and/or chemical processing system variations. FIG. 5 also illustrates equations based upon which the target intensity 502 may be computed according to one or more of the preferred embodiments.

Beginning with a first-principle quadruple-integral at FIG. 5 (Eq. {5a}) based upon the post-mask mutual intensity function 310 and the point response function 406, and incorporating the photolithographic processing system characterizations described supra in relation to FIGS. 1A-4, FIG. 5 illustrates how the target intensity 502 can be computed in one or more ways according to one or more of the preferred embodiments. In one preferred embodiment, with reference again to steps 208-212 of FIG. 2, a formulation shown at FIG. 5 (Eq. {5m}) can be used. For step 208, a process model comprising model kernels and model kernel weights is computed using the coherent modes 308 and the point spread function 406. For one preferred embodiment consistent with FIG. 5 (Eq. {5m}), model kernels 507 are generated by multiplying the point spread function 406 with each of the coherent modes 308 generated at step 204 of FIG. 2, and the model kernel weights are set equal to the respective coherent mode weights 306. For step 210, the mask transmittance function 312 is convolved with each model kernel 507 to generate convolution results 504. Finally, for step 212, the squared magnitudes of the convolution results 504 are generated and a weighted sum thereof is generated according to the coherent mode weights 306, which form the model kernel weights for this embodiment.

Figure 6B:
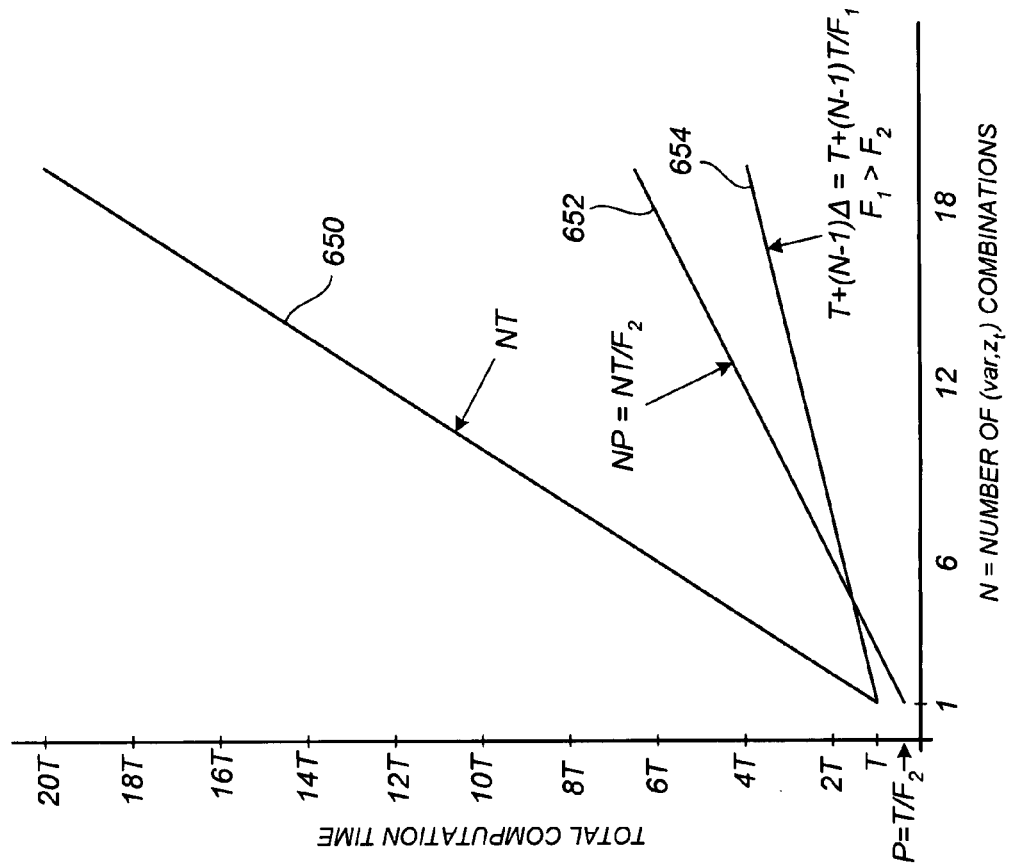
FIG. 6B illustrates a computation time plot relating to photolithographic process simulation according to a preferred embodiment.
Figure 6A:
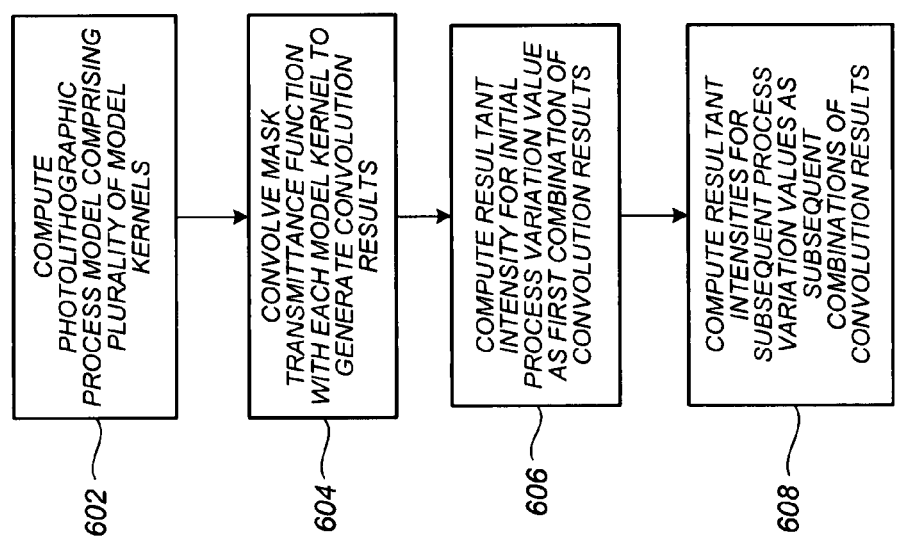
FIG. 6A illustrates simulating a photolithographic process according to a preferred embodiment.

FIG. 6A illustrates simulating an exposure process according to a preferred embodiment. At step 602, a process model is computed, the process model comprising a plurality of model kernels and model kernel weights. At step 604, the mask transmittance function is convolved with each model kernel to generate a plurality of convolution results. At step 606, an initial resultant intensity for an initial process variation value is computed as a first combination of the convolution results, e.g., combined using an initial set of model kernel weight values. Finally, at step 608, resultant intensities are computed for subsequent process variation values as subsequent combinations of the convolution results, e.g., combined using subsequent sets of model kernel weight values that numerically depend on the degree of process variation. In one preferred embodiment, the process variations are projection system variations. According to another preferred embodiment, steps similar to those of FIG. 6A are carried out in a manner that includes different target depths, separately or in various combinations (var,$z_t$) with the different process variation values.

A model kernel at least partially characterizes the manner in which a photolithographic processing system generates a resultant intensity from a mask. For one preferred embodiment, model kernel refers to one of a set of model kernels that yield a resultant intensity when processed in conjunction with a mask transmittance function, the processing comprising convolving the mask transmittance function with each model kernel to generate a plurality of convolution results and coherently and/or incoherently combining the convolution results. Preferably, the combination of the convolution results is carried out according to one or more model kernel weights associated with the plurality of model kernels. The photolithographic processing system may be with or without a chemical processing system.

Examples of model kernels include imaging kernels and optical kernels. An imaging kernel at least partially characterizes the manner in which a photolithographic processing system generates a resultant intensity from a mask. For one preferred embodiment, imaging kernel refers to one of a set of imaging kernels that yield a resultant intensity when processed in conjunction with a mask transmittance function, the processing comprising convolving the mask transmittance function with each image kernel to generate a plurality of convolution results and computing a weighted sum of the squared magnitudes of the convolution results according to one or more imaging kernel weights associated with the imaging kernels.

For the particular case in which no chemical processing is simulated (e.g., if the user presumes that the chemical processing system is not present, or is turned off, or if the chemical processing system is simulated separately from the optical exposure system), imaging kernels operate as optical kernels. An optical kernel at least partially characterizes the manner in which an optical exposure system generates an optical intensity from a mask. For one preferred embodiment, optical kernel refers to one of a set of optical kernels that yield a resultant intensity when processed in conjunction with a mask transmittance function, the processing comprising convolving the mask transmittance function with each optical kernel to generate a plurality of convolution results and computing a weighted sum of the squared magnitudes of the convolution results according to one or more optical kernel weights associated with the optical kernels. The resultant intensity so generated using optical kernels is, in particular, an optical intensity.

Examples of model kernels further include partial kernels. A partial kernel at least partially characterizes the manner in which a photolithographic processing system generates a resultant intensity from a mask. For one preferred embodiment, partial kernel refers to one of a set of partial kernels that yield a resultant intensity when processed in conjunction with a mask transmittance function, the processing comprising convolving the mask transmittance function with each partial kernel to generate a plurality of convolution results and combining the convolution results using both coherent and incoherent weighted sums according to one or more partial kernel weights associated with the partial kernels. More particularly, the combining of the convolution results comprises computing a plurality of coherent weighted sums across related groupings of the convolution results, and computing an incoherent weighted sum of the squared magnitudes of the coherent weighted sums, each of the coherent weighted sums and incoherent weighted sums being weighted according to partial kernel weights. In one example, the convolution results are grouped for purposes of coherent weighted summation according to a coherent mode expansion index associated with expansion of a mutual intensity function into coherent modes.

The preferred embodiment of FIG. 5, supra, represents one example for which the model kernels are imaging kernels and the model kernel weights are imaging kernel weights. The preferred embodiment of FIG. 7, infra, represents one example for which the model kernels are partial kernels and the model kernel weights are partial kernel weights. The preferred embodiment of FIG. 12, infra, represents one example for which the model kernels are optical kernels and the model kernel weights are optical kernel weights. The preferred embodiment of FIG. 16A, infra, represents another example for which the model kernels are imaging kernels and the model kernel weights are imaging kernel weights.

FIG. 6B illustrates a computation time plot for illustrating one of the features and advantages of photolithographic process simulation according to a preferred embodiment. In particular, FIG. 6B illustrates plots of total computation time versus the number of process variation value/target depth combinations (var,$z_t$) for which resultant intensities are computed for a particular mask. Advantageously, once the resultant intensity is computed for an initial combination (var,$z_t$), the resultant intensity for subsequent additional combinations are readily and relatively quickly computed by re-using the convolution results associated with the initial combination (var,$z_t$), because the computational complexity for data convolutions is, generally speaking, substantially higher that the computational complexity for operations such as squaring, weighting, and addition for the sizes of data involved in photolithographic simulations such those presented herein. By way of example, where computation for an initial combination requires a time T, computation time for each subsequent combination will require a time $\Delta=T/F_1$, where $F_1$ can be termed a subsequent computation time savings factor and is substantially greater than unity (e.g., between 5 and 10, for example, or even larger depending on the data sizes involved). Overall computation time for N different combinations using the preferred embodiment of FIG. 6A is therefore equal to $T+(N-1)\Delta$, which is substantially less than NT, as indicated by the plots 654 and 650 in FIG. 6B.

Also shown in FIG. 6B is a plot 652 representing computation time for N different (var,$z_t$) combinations according to one or more kernel-based prior art methods. Generally speaking, it is not impossible that there might be fewer kernels used in the one or more prior art methods. In such cases, if they exist, there can be fewer initial convolutions necessary than for the preferred embodiment of FIG. 6A. For purposes of illustration, such cases are reflected in the plot 652 by an initial computation time $P=T/F_2$, with $F_2$ being greater than unity. Notably, however, the subsequent computation time savings factor $F_1$ for the preferred embodiment of FIG. 6A will usually be greater than and so the initial time deficit for the preferred embodiment of FIG. 6A will be compensated as N increases, as shown at the crossover locations of the plots 654 and 650. In the particular example of FIG. 6B, for which $F_1$ is assumed to be about 6 and $F_2$ is assumed to be about 3, the overall time savings is realized as N rises above about 6.

It is often the case that a photolithographic process simulation is repeated for different combinations of process variation values and/or different target depths for selected areas or positions on a chip rather than for the whole chip, the selected areas or positions being irregularly and sparsely distributed. It has been found that even further computational efficiencies can be realized using the preferred embodiment of FIG. 6A when resultant intensities need to be calculated at such irregularly and sparsely distributed target points. Generally stated, these computational efficiencies can have the effect of drastically reducing the slope of the plot 654 of FIG. 6B toward a horizontal orientation (i.e., drastically increase the value of the subsequent computation time savings factor $F_1$). This effect is discussed further infra in the present disclosure.

Figure 7A:
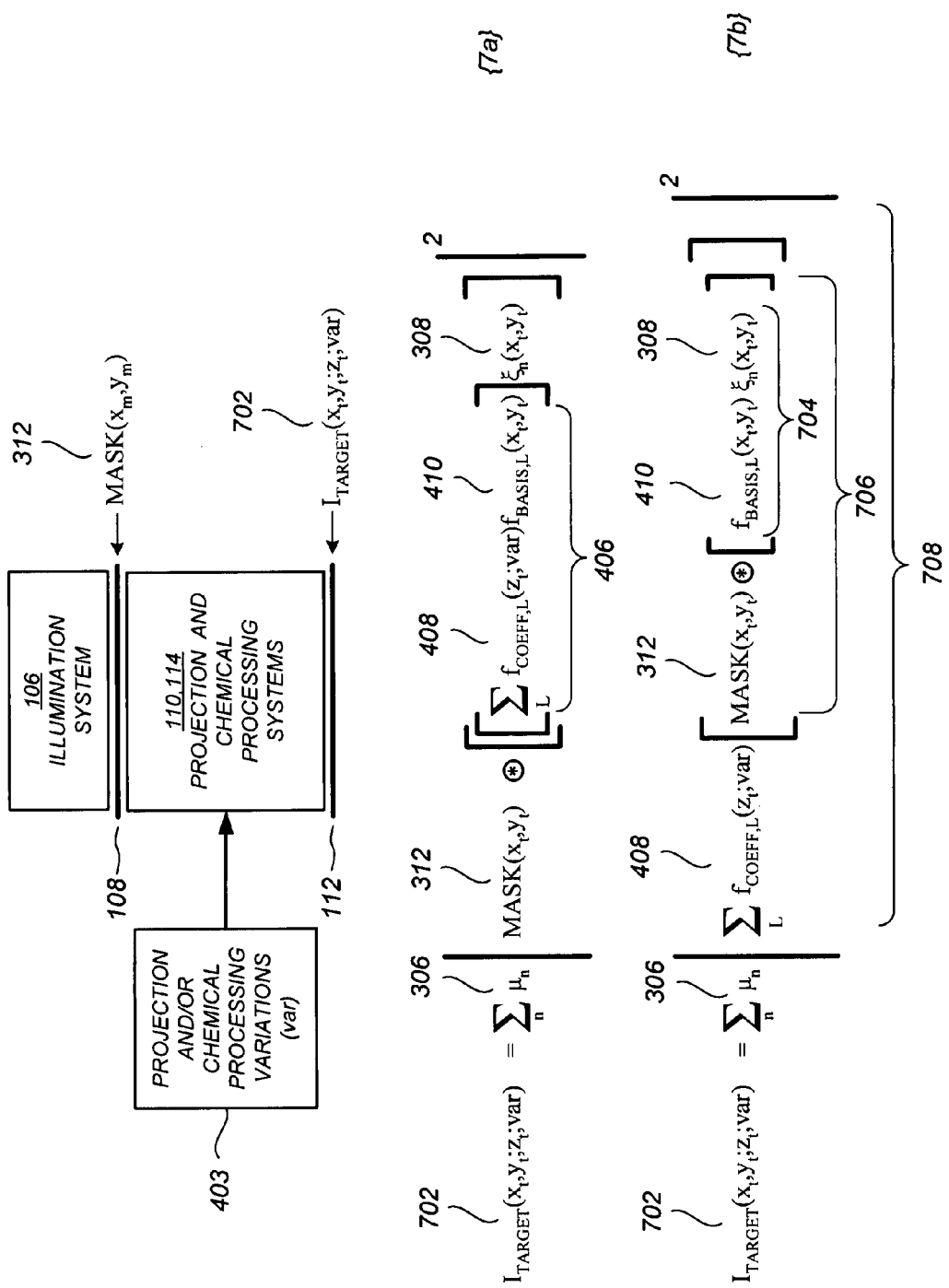
FIG. 7A illustrates a photolithographic processing system and expressions relating to describing photolithographic process simulation according to a preferred embodiment.

FIG. 7A illustrates a photolithographic processing system and expressions relating to describing photolithographic process simulation according to a preferred embodiment. More particularly, FIG. 7A illustrates a conceptual diagram of the photolithographic processing system of FIG. 1A in which the projection system 110 and chemical processing system 114 are in combined block form between the mask 108 and the target 112. Also illustrated are the illumination system 106 and the at least one process variation 403 ("var") representing a projection system and/or chemical processing system variation.

Generally speaking, FIG. 7A illustrates an example of a computational characterization for a resultant intensity 702 that is consistent with the method of FIG. 6A, wherein the model kernels are partial kernels and the model kernel weights are partial kernel weights. It is to be appreciated, however, that other computational characterizations consistent with the method of FIG. 6A are within the scope of the preferred embodiments, such as those described further infra. Shown in FIG. 7 (Eq. {7a}) is a recast version of FIG. 5 (Eq. {5m}) with the point spread function 406 replaced by the series expansion expression of FIG. 4 (Eq. {4b}). Terms are rearranged in accordance with standard algebraic principles to yield the expression of FIG. 7 (Eq. {7b}).

With reference again to FIG. 6A in view of FIG. 7A, the process model referenced at step 602 can be generated by (i) computing a plurality of partial kernels 704 by multiplying coherent modes 308 (referenced supra with respect to FIG. 3) and partial response functions 410 (referenced supra with respect to FIG. 4), and (ii) forming the partial kernel weights as a union of coherent mode weights 306 (referenced supra with respect to FIG. 3) and partial response coefficients 408 (referenced supra with respect to FIG. 4). For step 604, convolution results 706 are generated by convolving the mask transmittance function 312 with each of the partial kernels 704, the convolution results 706 being advantageously applicable for computation of results for both initial and subsequent process variation values.

For step 606, resultant intensity results are computed for the initial process variation value by combining the convolution results 706, the combining comprising (i) forming a plurality of coherent weighted sums 708 using a first portion of the partial kernel weights corresponding to the partial response coefficients 408, and (ii) computing an incoherent weighted sum of the squared magnitudes of the coherent weighted sums 708 using a second portion of the partial kernel weights corresponding to the coherent mode weights 306. Stated another way, the convolution results are grouped by coherent mode expansion index "n" for purposes of computing the coherent weighted sums 708, and then the incoherent weighted sum of the squared magnitudes of the coherent weighted sums 708 is computed using the coherent mode weights 306.

For step 608, resultant intensity results are computed for subsequent process variation values by combining the convolution results 706 in a manner similar to that described for step 606, except that the partial response coefficients 408 that make up the second portion of the partial kernel weights are different because they are dependent on the process variation. Advantageously, as evidenced at least by FIG. 7 (Eq. {7b}), the resultant intensity can be computed for different process variation values using the same mask transmittance function convolution results 706 that were computed for the first process variation value. Importantly, it is the convolutions involving the mask transmittance function, i.e., the convolutions that yield the convolution results 706, that represent the bulk of the computational complexity needed for the simulation. Other computation steps, such as weighting, squaring, and summing of convolution results 706, are of generally minor computational complexity compared to such convolutions. Accordingly, the step 608 for each subsequent process variation value takes substantially less time to achieve than the step 606 for the initial process variation value, because the convolution results 706 have already been computed prior to step 608. Similar advantages apply in another preferred embodiment in which steps similar to those of FIG. 6A are carried out in a manner that includes different target depths, separately or in various combinations (var,$z_t$) with the different process variation values.

Figure 7B:
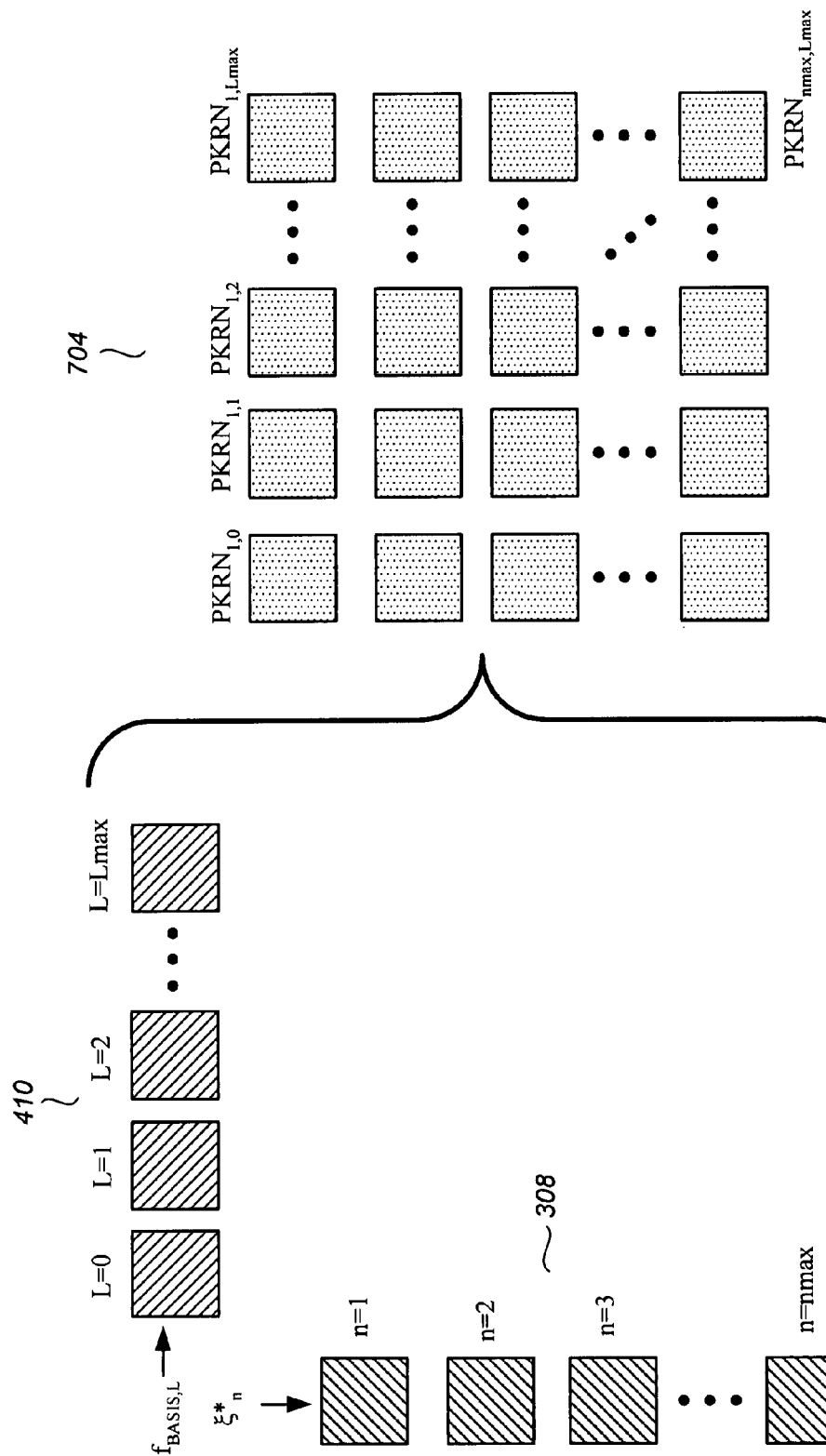
FIG. 7B illustrates a conceptual view of partial kernel formation according to a preferred embodiment.

FIG. 7B illustrates a conceptual view of the formation of the partial kernels 704 referenced supra with respect to FIG. 7A. At the left side of FIG. 7B is an (Lmax+1)-member set of partial response functions 410 and an nmax-member set of coherent modes 308 as derived supra for a particular set of physical parameters of the photolithographic process. Referring again to the M'×M' window of optical ambit scenario supra, the partial response functions 410 and coherent modes 308 would each be M'×M' arrays of complex values. At the right side of FIG. 7B is an (Lmax+1)(nmax)-member set of partial kernels 704, any particular member $PKRN_{n,L}$ comprising an point-wise product of the $n^{th}$ coherent mode and the $L^{th}$ partial response function. Importantly, in accordance with the features and advantages of at least one of the preferred embodiments, the partial kernels 704 do not depend on the process variation values, target depths, or mask transmittance function. Moreover, the convolution of a particular mask transmittance function with the partial kernels 704 only needs to be performed once for computing target intensities across many different process variation values and/or target depths.

FIG. 8 illustrates a portion of the photolithographic processing system 102 of FIG. 1A and expressions relating to describing photolithographic process simulation according to a preferred embodiment, for the purposes of illustrating one example of the manner in which a point spread function incorporating at least one process variation can be generated, for a particular example in which there is a defocus variation represented by z'. It is to be appreciated, however, that there are many ways for generating a point response function incorporating at least one process variation according to a preferred embodiment as would be readily apparent to a person skilled in the art in view of the present disclosure.

In particular, FIG. 8 illustrates the mask 108, the projection system 110, the chemical processing system 114, and the target 112 of FIG. 1A, with the projection system 110 being represented in "4F" format such that a model pupil aperture 802 is illustrated. For a variation-less projection system 110, the model pupil aperture 802 can be modeled by a pupil function 804 which is non-zero within a circular disc in the frequency domain, the pupil function 804 passing a maximum spatial frequency $f_{max}$ related to a numerical aperture of the projection system 110. Under an assumption of shift-invariance, a point response function 806 simply corresponds to an inverse Fourier transform of the pupil function 804. For a defocus variation z', however, there is a point response function 808 that is the inverse Fourier transform of the pupil function 804 as modified by a phase factor 810. The term η in FIG. 8 (Eq. {8b}) is a refractive index associated with material lying above the target 112 during the exposure process.

As illustrated in FIG. 8, the point response function 808 can be expressed as a sum of the responses through different annular portions 813 of the model pupil aperture 802 of the projection system 110 as modified according to the phase factor 810 corresponding to a process variation (defocus) of the projection system. Also, when each annular portion 813 is sufficiently narrow, the phase factor 810 may be approximated as a constant within each annular portion 813, as illustrated in FIG. 8 (Eq. {8d}), where $f'_j$ is a constant magnitude of a spatial frequency in the $j^{th}$ annular portion. Optionally, the phase factor 810 within each annular portion 813 may be further expanded into a truncated Taylor series with only a few terms. Alternatively, based on a Taylor series expansion of the phase factor 810 for the entire pupil aperture 802 (see FIG. 8 (Eq. {8e})), the point response function 808 can be characterized as being dependent on the defocus variation z' according to a series expansion having partial response functions 814 not dependent on the defocus variation z' and having at least one expansion coefficient 816 dependent on the defocus variation z', as illustrated at FIG. 8 (Eqs. {8g} and {8h}). Although the number of partial response functions 814 and partial response coefficients 816 are theoretically infinite, acceptable results can be achieved by limiting the expansion to a maximum number Lmax, with an example value of Lmax being about 5.

Figure 9:
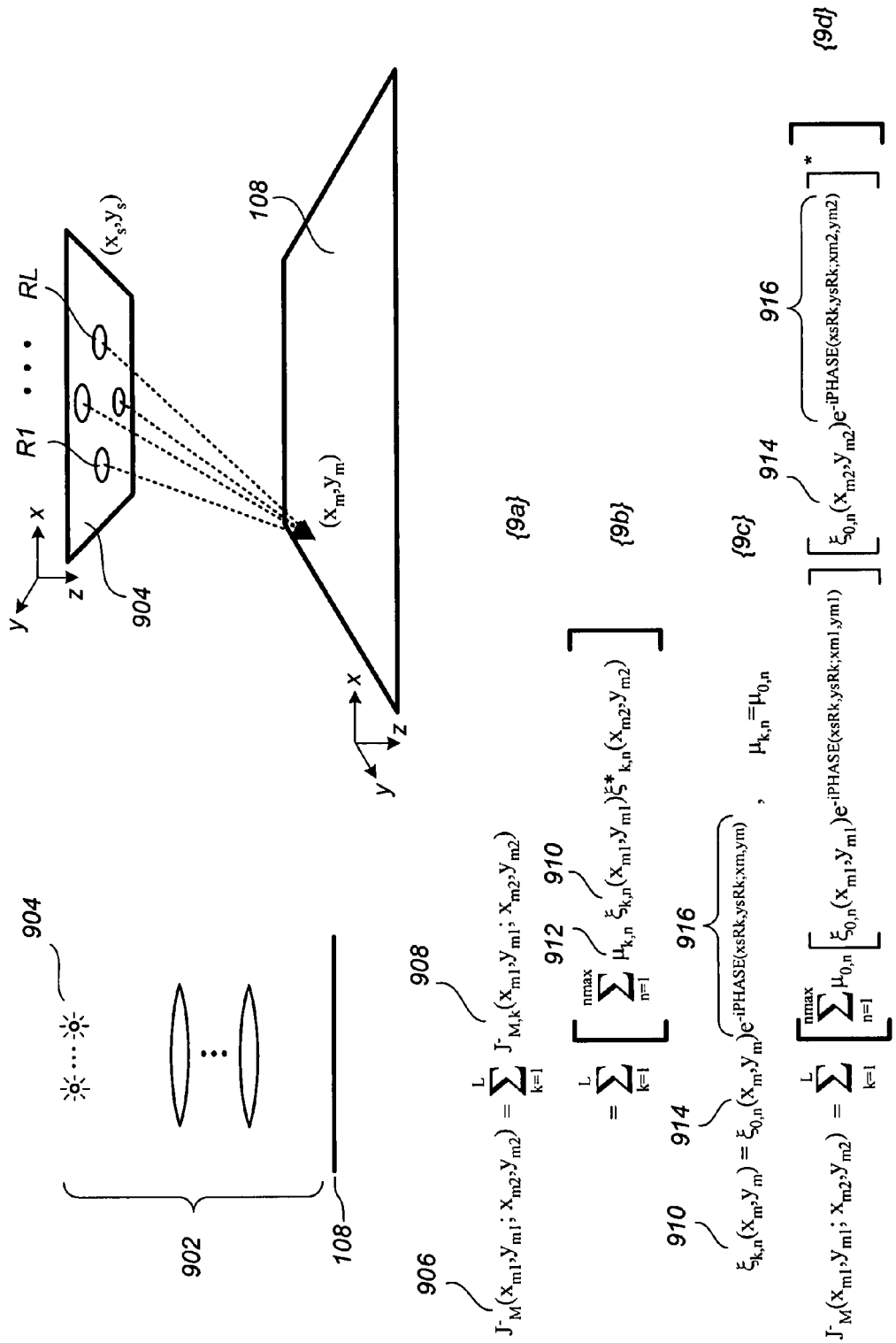
FIG. 9 illustrates a multi-emitter illumination system and expressions relating to describing photolithographic process simulation according to a preferred embodiment.

FIG. 9 illustrates a multi-emitter illumination system and expressions relating to describing photolithographic process simulation according to a preferred embodiment. In particular, FIG. 9 illustrates an illumination system 902 comprising an optical source 904 having multiple emitters R1, R2, ..., RL, some or all of which may be off-axis, along with expressions characterizing simplified coherent mode computation according to a preferred embodiment. As shown in FIG. 9, the mutual intensity 906 of radiation incident to the mask plane 108 can be expressed as a sum of contributions 908 from each individual emitter R1, R2, ... RL. The contribution 908 from each emitter can be expressed in terms of its coherent modes 910 and coherent mode weights 912, in accordance with a preferred embodiment. Under a first assumption of shift-invariance and a second assumption that the emitters are identical and translationally congruent, any particular $k^{th}$ one of the of the emitter coherent modes 910 can be expressed as a phase-shifted version of a common coherent mode 914, i.e., the common coherent mode 914 multiplied by a phase factor 916 equal to exp[-iPHASE($x_{sRK}, y_{sRk}; x_m, y_m$)]. As indicated by its arguments, the phase factor 916 is a function of mask point location ($x_m, y_m$) relative to the $k^{th}$ emitter location ($x_{sRk}, y_{sRk}$). Computations involving the coherent modes are advantageously simplified by about a factor of L, the number of geometrically congruent emitters at the source 904.

Figure 10:
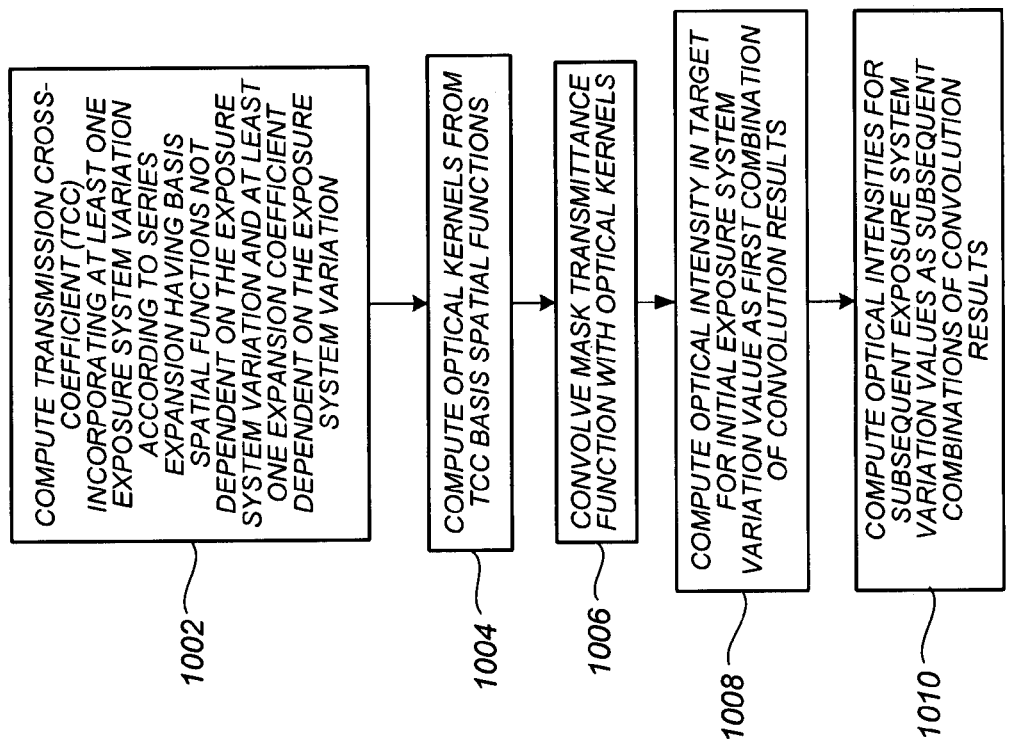
FIG. 10 illustrates simulating an optical exposure process according to a preferred embodiment.

FIG. 10 illustrates simulating an exposure process according to a preferred embodiment, the exposure process comprising illumination of a mask and projection of the illuminated mask toward a target by an optical exposure system. Notably, the steps of FIG. 10 represent one of several ways in which the method of FIG. 6A can be carried out in accordance with one or more of the preferred embodiments, for a case in which chemical processing is not simulated. At step 1002, a transmission cross-coefficient (TCC) is computed incorporating at least one exposure system variation in the optical exposure system according to a series expansion having basis spatial functions not dependent on the exposure system variation and at least one expansion coefficient dependent on the exposure system variation. Such basis spatial functions and expansion coefficients for a TCC may be termed TCC basis spatial functions and TCC expansion coefficients. At step 1004, optical kernels and associated optical kernel weights are computed from the TCC basis spatial functions. At step 1006, a mask transmittance function is convolved with each of the optical kernels to produce a set of convolution results. At step 1008, an optical intensity is computed for an initial exposure system variation value as a first combination of the convolution results. Finally, at step 1010, optical intensities are computed for subsequent exposure system variation values as subsequent combinations of the convolution results, e.g., combined using subsequent sets of optical kernel weight values that numerically depend on the process variation values. In one preferred embodiment, the process variations are optical variations of the projection system. According to another preferred embodiment, steps similar to those of FIG. 10 are carried out in a manner that includes different target depths, separately or in various combinations (var,$z_t$) with the different process variation values.

Figure 11:
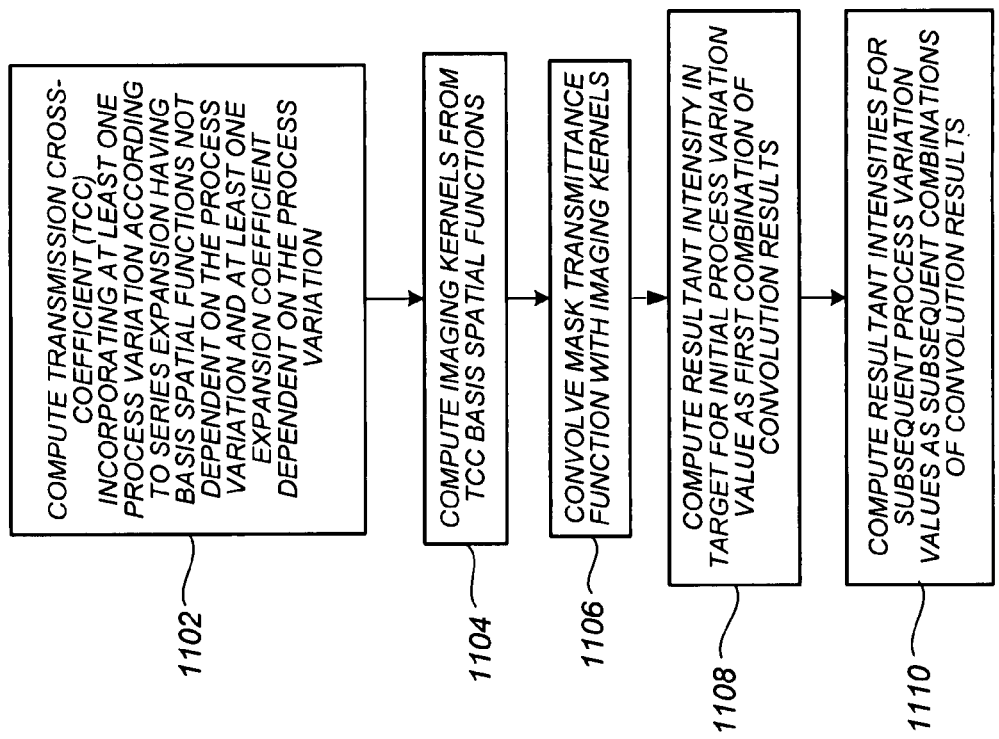
FIG. 11 illustrates simulating a photolithographic process according to a preferred embodiment.

FIG. 11 illustrates simulating a photolithographic process according to a preferred embodiment, the photolithographic process comprising illumination of a mask, projection of the illuminated mask toward a target, and chemical processing of the exposed target by a chemical processing system. Notably, the steps of FIG. 11 represent one of several ways in which the method of FIG. 6A can be carried out in accordance with one or more of the preferred embodiments, for a case in which chemical processing simulation is included. At step 1102, a transmission cross-coefficient (TCC) is computed incorporating at least one process variation associated with the photolithographic process according to a series expansion having basis spatial functions not dependent on the process variation and at least one expansion coefficient dependent on the process variation. At step 1104, imaging kernels and associated imaging kernel weights are computed from the TCC basis spatial functions. At step 1106, a mask transmittance function is convolved with each of the imaging kernels to produce a set of convolution results. At step 1108, a resultant intensity is computed for an initial process variation value as a first combination of the convolution results. Finally, at step 1110, resultant intensities are computed for subsequent process variation values as subsequent combinations of the convolution results, e.g., combined using subsequent sets of imaging kernel weight values that numerically depend on the process variation values. In one preferred embodiment, the process variation is a projection system variation and/or a chemical processing system variation. According to another preferred embodiment, steps similar to those of FIG. 11 are carried out in a manner that includes different target depths, separately or in various combinations (var,$z_t$) with the different process variation values.

Figures 1, 12:
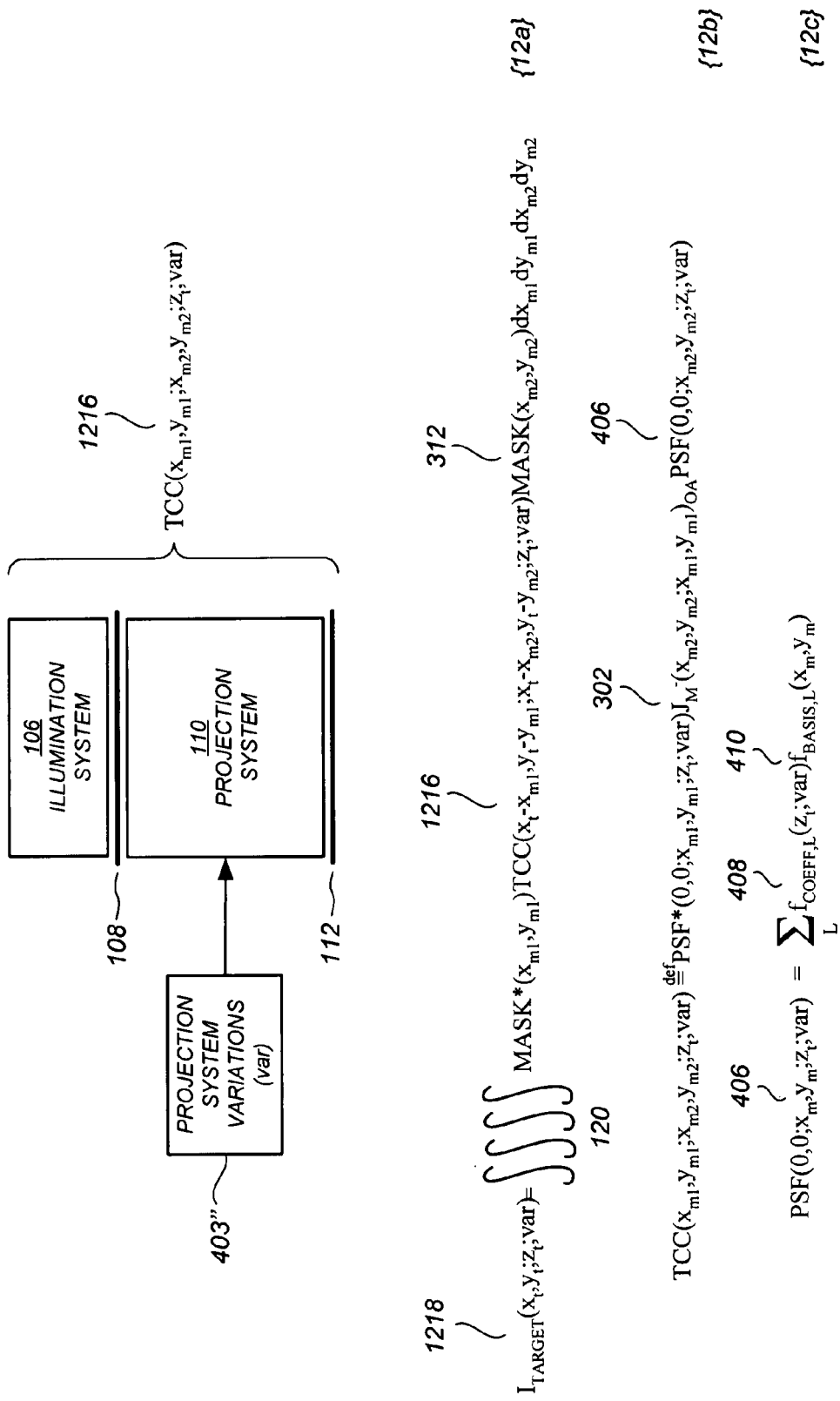
FIG. 12 illustrates an optical exposure system and expressions relating to describing optical exposure process simulation according to a preferred embodiment.

FIG. 12 illustrates portions of the photolithographic processing system 102 of FIG. 1A in block format, excluding the chemical processing system 114, along with expressions relating to describing optical exposure system simulation according to a preferred embodiment. Also shown in FIG. 12 are exposure system variations ("var") in the form of projection system variations 403". The optical exposure system is characterized by a TCC 1216 that, if used in a Hopkins formulation integral according to FIG. 12 (Eq. {12a} together with the mask transmittance function 312, would yield an output optical intensity 1218. Notably, according to a preferred embodiment, the integral of FIG. 12 (Eq. {12a}) is not itself required to be carried out. Although mask/target segmentations are not illustrated in FIG. 12, the computations described herein are preferably performed for each of a large number of mask segments and corresponding target segments similar to the mask segments 120 and target segments 122 of FIG. 1B, supra.

With reference to the steps of FIG. 10, supra, and FIG. 12 (Eq. {12b}) through FIG. 12 (Eq. {12h}), one particular method for accomplishing step 1002 is as follows. First, analytical and/or numerical expressions for the partial response functions 410 and partial response coefficients 408 are developed, wherein the partial response functions 410 are not dependent on the exposure system variations (var), and wherein the partial response coefficients 408 are dependent on the exposure system variations (var). These expressions could be readily developed by a person skilled in the art in view of the present disclosure, with one example for a defocus variation z' being provided at FIG. 8 (Eq. {8h}), supra, and another example for a generalized variation provided at FIG. 17, infra. Second, analytical and/or numerical expressions for the windowed mutual intensity function 302 incident upon the mask 108 (see FIG. 3, supra) are generated. This can be achieved either using methods known in the art or, optionally, by the coherent mode method described in relation to FIG. 3, supra. Third, using the relationships shown at FIG. 12 (Eq. {12e}) and substituting counter variables as shown, a set of kmax TCC basis spatial functions 1219 not dependent on the optical variations (var) and TCC expansion coefficients 1220 dependent on the exposure system variations (var) are generated. The TCC 1216 can thereby be expressed as illustrated at FIG. 12 (Eq. {12g}) according to a series expansion having basis spatial functions 1219 not dependent on the exposure system variations and expansion coefficients 1220 dependent on the exposure system variations.

With reference to FIG. 12 (Eq. {12h}), step 1004 of FIG. 10 can be carried out by performing a Mercer expansion for each $k^{th}$ TCC basis spatial function 1219 using known Mercer expansion methods. For each $k^{th}$ TCC basis spatial function 1219, a set of Lmax optical kernels 1222 and coefficients 1224 are generated. Notably, the number Lmax of optical kernels 1222 and optical kernel weights 1224 can itself vary with k, i.e., there can be different numbers of terms in the Mercer expansions for different ones of the TCC basis spatial functions 1219.

With reference to FIG. 12 (Eq. {12j}), step 1006 is carried out by convolving the mask transmittance function 312 with each of the optical kernels 1222 to generate convolution results 1226. Step 1008 can then be carried out by computing a weighted sum of the squared magnitudes of the convolution results 1226 as weighted by a corresponding plurality of optical kernel weights 1228, the optical kernel weights 1228 being computed, in turn, from the TCC expansion coefficients 1220 and the coefficients 1224 associated with the Mercer expansion of the TCC basis spatial functions, for the initial projection system condition.

Notably, the convolution results 1226 are not dependent on the exposure system variations (var), whereas the optical kernel weights 1228 are dependent on the exposure system variations (var) by virtue of the TCC expansion coefficients 1220. Accordingly, for step 1010, target optical intensities can be computed for different values of the exposure system variation (var) simply by re-combining the same set of convolution results 1226 using the associated different optical kernel weights 1228. According to another preferred embodiment, steps similar to described with respect to FIGS. 10 and 12 are carried out in a manner that includes different target depths, separately or in various combinations (var,$z_t$) with the different process variation values.

Figure 13:
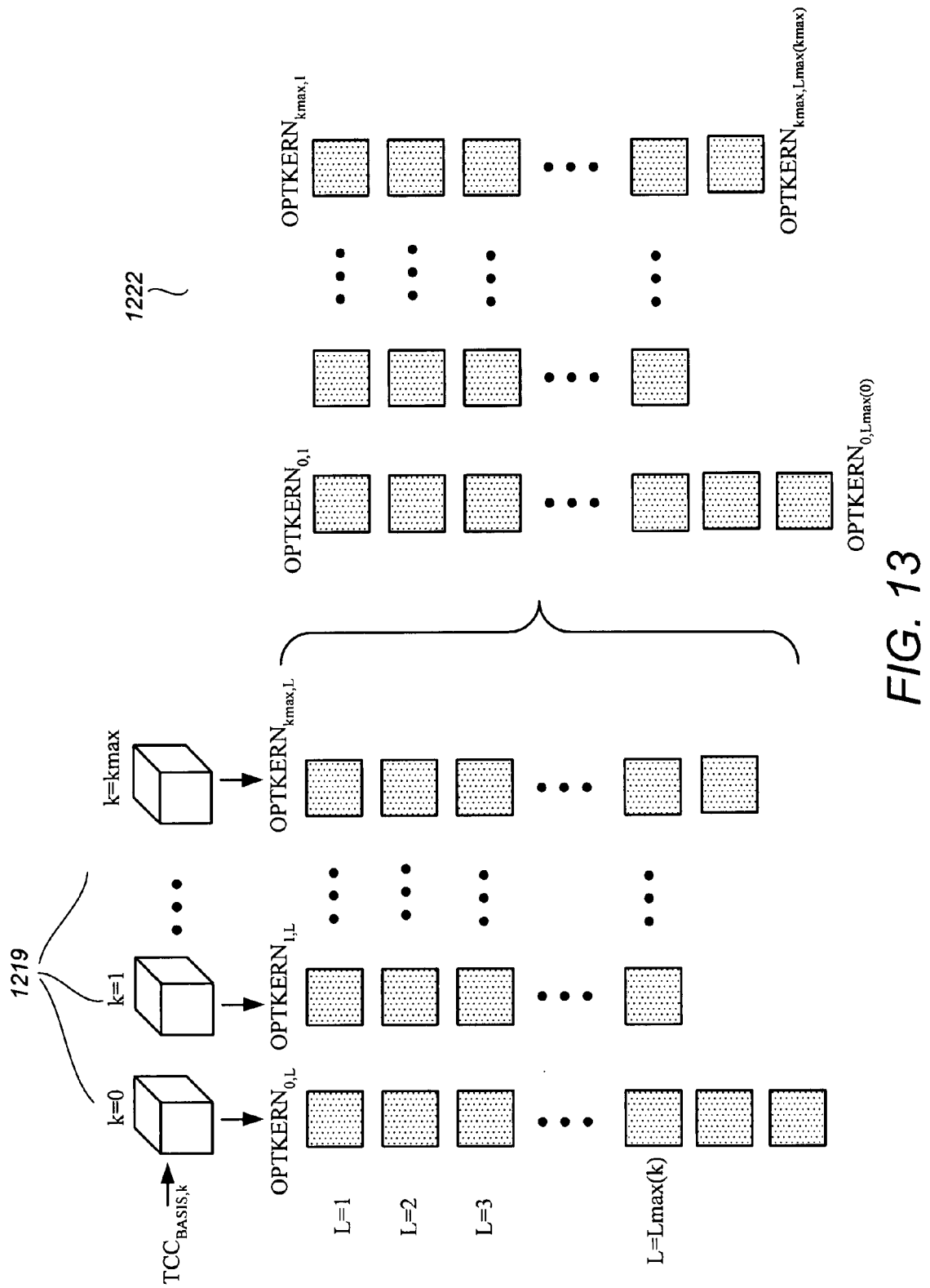
FIG. 13 illustrates a conceptual view of optical kernel formation according to a preferred embodiment.

FIG. 13 illustrates a conceptual view of the formation of the optical kernels 1222 referenced supra with respect to FIG. 12. At the left side of FIG. 13 is a (kmax+1)-member set of TCC basis spatial functions 1219, represented as cubes to denote that each is a function of four variables ($x_{m1}, y_{m1}; x_{m2}, y_{m2}$). For each $k^{th}$ basis spatial function 1219, a set of optical kernels OPTKERN$_{k,1}$, OPTKERN$_{k,2}$, . . . OPTKERN$_{k,Lmax(k)}$, which can be generated by Mercer expansion, for example, is illustrated. The number of optical kernels for each $k^{th}$ TCC basis spatial function 1219 can vary with k, and therefore there are Lmax(k) elements for each $k^{th}$ TCC basis spatial function 1219. Referring again to the example M'×M' window of optical ambit scenario, the optical kernels OPTKERN$_{k,L}$ would each be M'×M' arrays of complex values. At the right side of FIG. 13 is the set of optical kernels 1222 reproduced as a group, which is precomputed for a particular optical exposure system. Importantly, in accordance with the features and advantages of at least one of the preferred embodiments, the optical kernels 1222 do not depend on the exposure system variations, and the convolution of a particular mask transmittance function with the optical kernels 1222 only needs to be performed once for computing resultant intensity values across many different exposure system variation values.

Figure 14:
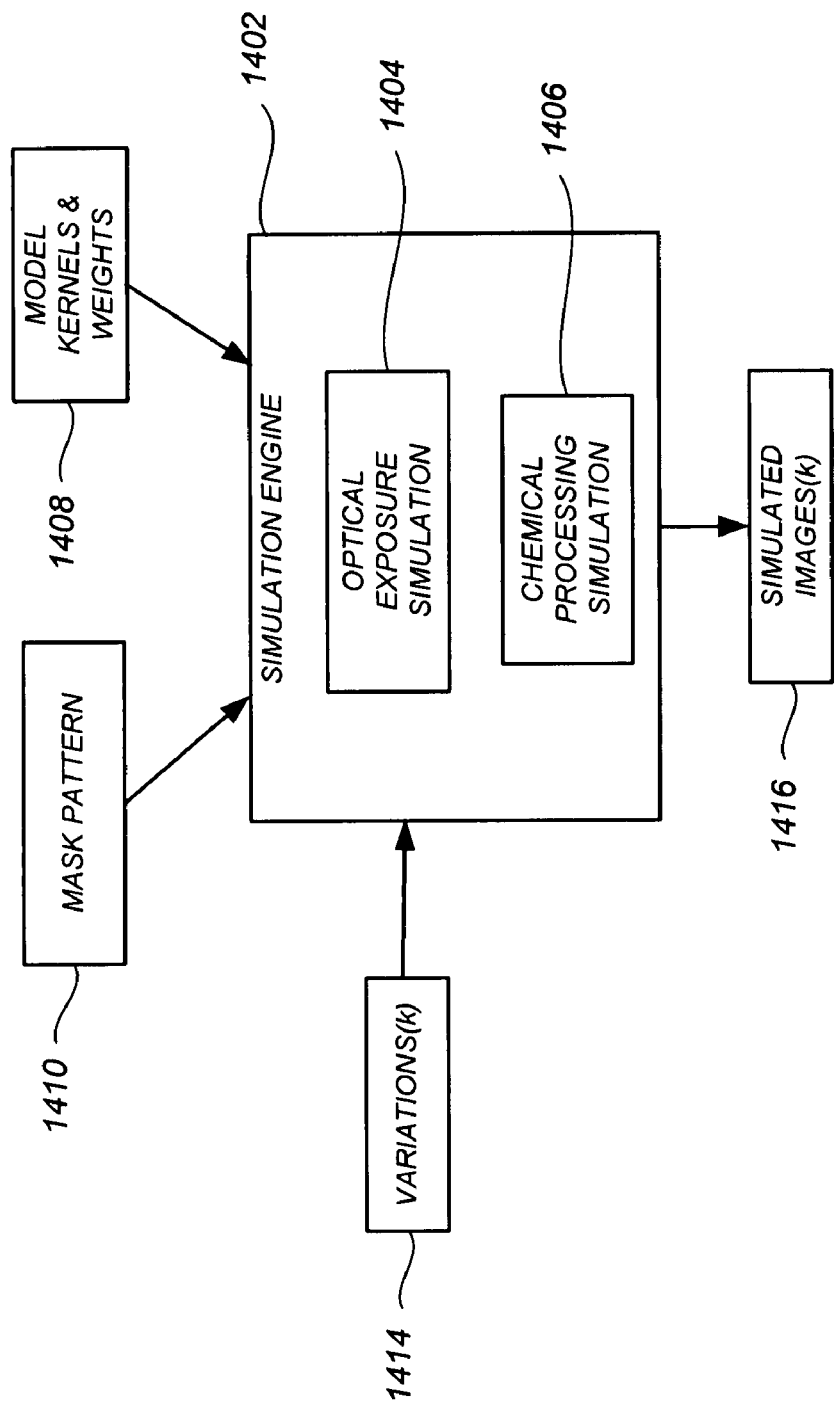
FIG. 14 illustrates use of a photolithographic process simulation engine according to a preferred embodiment.

FIG. 14 illustrates a conceptual diagram of the use of a photolithographic process simulation engine 1402 according to a preferred embodiment. The photolithographic process simulation engine 1402 is used, for example, as part of a larger optical proximity correction (OPC) tool used by a semiconductor fabrication facility that is presented with a desired circuit pattern for a production run. The semiconductor foundry often possesses several photolithographic processing systems, each having their own particular variations and not processing mask patterns in precisely the same way. The characteristics for a typical photolithographic processing system are embodied in a set of model kernels and weights 1408 that have been developed or calibrated based on its particular physical parameters using one or more of the preferred embodiments described supra (and infra with respect to FIGS. 15A-15B). Based on the desired circuit pattern, the OPC tool has developed a particular mask pattern 1410, usually as part of a larger overall iterative process. As part of the larger overall iterative process, it is now desired to simulate how the current mask pattern 1410 will be treated by the particular photolithographic processing system in question, for the purposes of perfecting the mask pattern for producing the desired circuit pattern on the wafer using that photolithographic processing system.

The photolithographic process simulation engine 1402 comprises an optical exposure simulation engine 1404 and a chemical processing simulation engine 1406. Based on the model kernels and weights 1408 and the mask pattern 1410, the optical exposure simulation engine 1404 computes a target resist optical intensity pattern that would be generated by the particular stepper device in question, in accordance with one or more of the preferred embodiments described supra, for a mask pattern 1410. Based on the computed optical intensity pattern, the chemical processing simulation engine 1406 simulates the subsequent chemical processing of the exposed photoresist and the underlying semiconductor wafer so that a simulated image 1416 is generated.

Because a photolithographic processing system in question will inevitably incur process variations during a production run (for example, defocusing due to vertical placement errors of the wafer relative to the stepper device optics), and for other reasons, it may be desirable to compute simulated images for a variety of different process variations from an initial process condition. Also, to improve the accuracy of any particular simulated image, it may be desirable to compute resultant intensities for several different target depths. Advantageously, in accordance with a preferred embodiment, simulated images 1416 for a plurality of values for such variations 1414 (which includes both process variations and multiple resist depths) can be generated in an overall computation time that is not substantially greater than the computation time for a single variation value. For example, where computation for a single variation value requires a first time interval T, results for N different variation values can be achieved within a second time interval that is substantially less than NT.

Figure 15A:
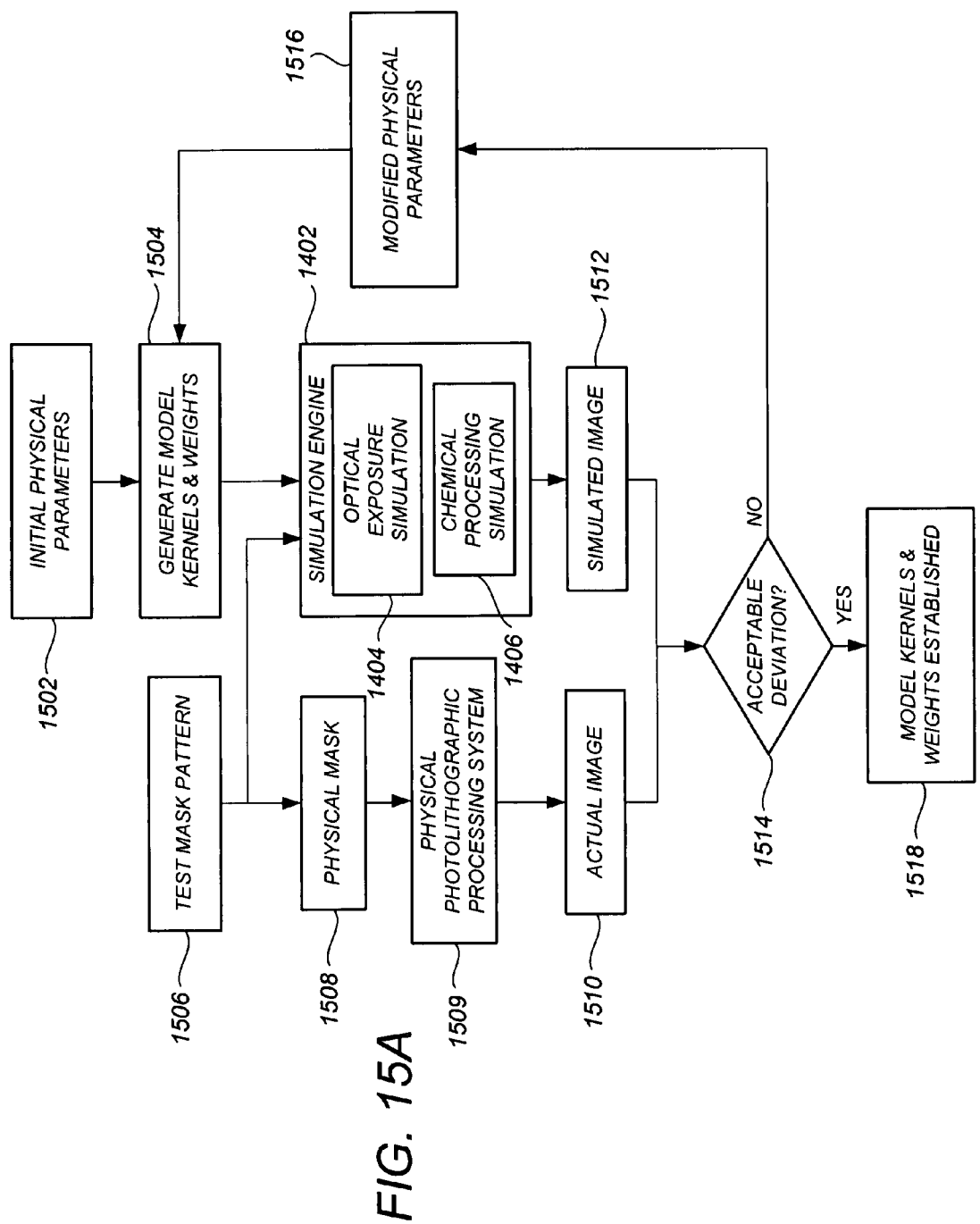
FIG. 15A illustrates calibration of a photolithographic process simulation engine according to a preferred embodiment.

FIG. 15A illustrates a conceptual diagram for the calibration of a photolithographic process simulation engine 1402, the photolithographic process simulation engine 1402 comprising an optical exposure simulation engine 1404 capable of simulating a photolithographic process for a plurality of different process and/or depth variations in an overall computation time that is not substantially greater than the computation time for a single process and/or depth condition in accordance with a preferred embodiment. As used herein, calibration refers to the generation of model kernels and weights customized for a photolithographic processing system for simulating the operation of that photolithographic processing system. For a photolithographic processing system, such calibration could be performed, for example, by the semiconductor fabrication facility upon receipt, modification, or repair of a stepper device, or at other times for other reasons as circumstances warrant.

Based on initial physical parameters 1502 for a subject physical photolithographic processing system 1509, as may be obtained from information sources including stepper device manufacturers, initial model kernels and weights are computed at block 1504 in accordance with one or more of the preferred embodiments. A mask pattern 1506 is provided to the simulation engine 1402, and is also physically written to a physical mask 1508. The physical mask 1508 is inserted into the subject photolithographic processing system 1509, and a physical result (actual image 1510) is generated using the photolithographic processing system. Meanwhile, a simulated image 1512 is generated by the simulation engine 1402 based on the test mask pattern 1506 and the initial model kernels and weights generated at block 1504. The actual image 1510 and simulated image 1512 are compared at block 1514. If the deviation between the actual image 1510 and the simulated image 1512 is within an acceptable tolerance, then the model kernels and weights 1518 are established for that photolithographic processing system for use in future simulations on actual proposed mask patterns for actual desired circuit designs. If the deviation is not acceptable, then at block 1516 a modification process is carried out that modifies the physical parameters and sends the modified physical parameters to block 1504 which, in turn, generates the modified model kernels and weights. The simulation engine 1402 then generates another simulated image based on the test mask pattern 1506 and the modified model kernels and weights, and the process is repeated until the simulated image 1512 is sufficiently similar to the actual image 1510.

Figure 15B:
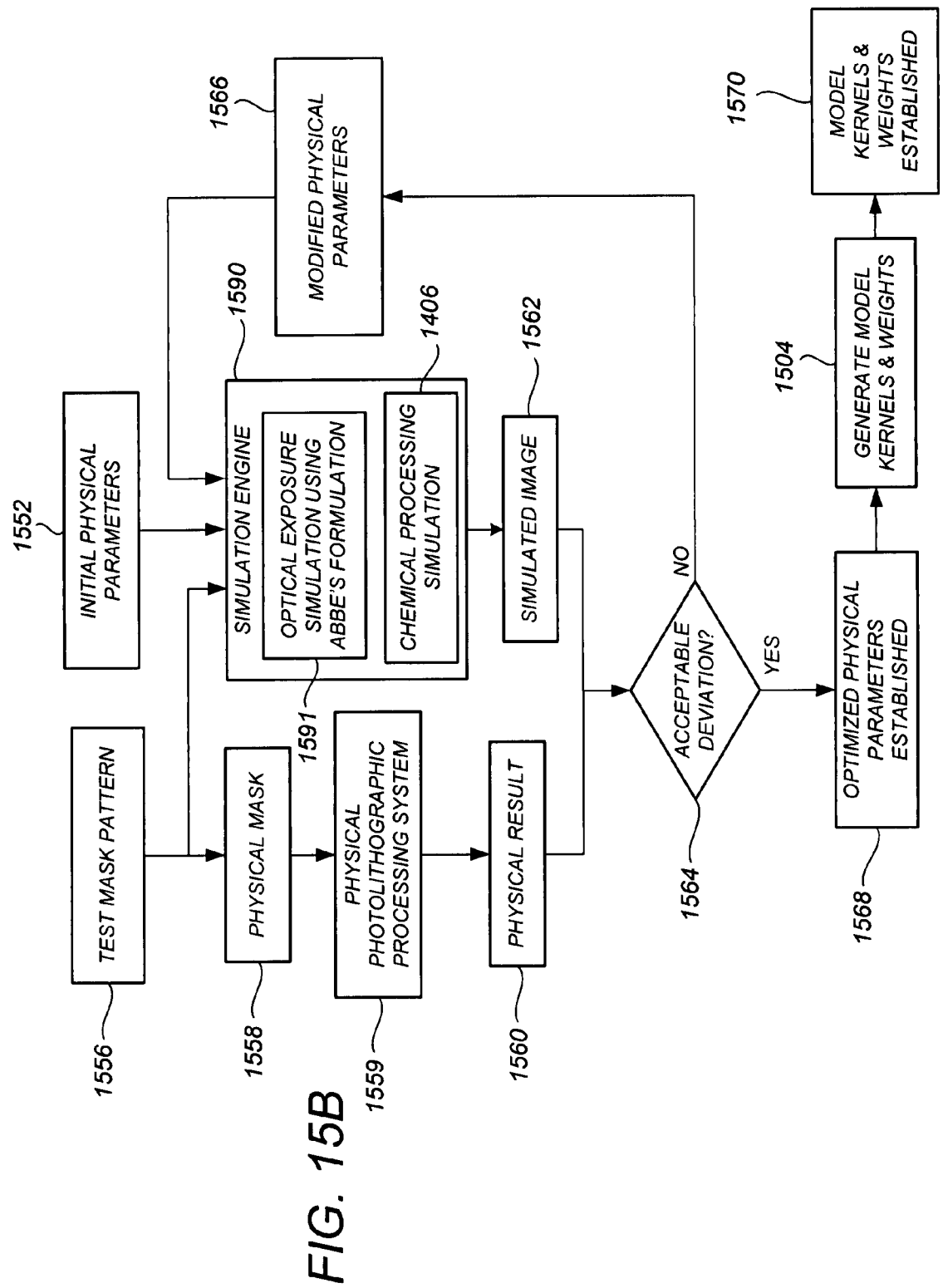
FIG. 15B illustrates calibration of a photolithographic process simulation engine according to a preferred embodiment.

FIG. 15B illustrates calibrating a first process model to a photolithographic processing system according to a preferred embodiment, the first process model corresponding to a first photolithographic process simulator and comprising a plurality of model kernels. An actual image (i.e., physical result) is generated by operation of the photolithographic processing system on a physical mask derived from a test mask pattern (blocks 1556, 1558, 1559, 1560). An initial parameter set 1552 at least partially characterizing the photolithographic processing system is received. An optimized parameter set is generated using the initial parameter set 1552, a second photolithographic process simulator 1590 different from the first photolithographic process simulator, the test mask pattern 1506, and the physical result 1560, using a comparison at block 1564 between computed resultant intensities 1562 and the physical result 1560 and making associated physical parameter modifications at block 1566. In one preferred embodiment, the second photolithographic process simulator 1590 uses an Abbe's formulation method for optical exposure simulation at block 1591. Finally, the plurality of model kernels along with associated model kernel weights is computed from the optimized physical parameters using, for example, one or more methods described hereinabove with respect to FIGS. 2-6A and FIGS. 7A-13 (blocks 1504 and 1570).

Figure 16A:
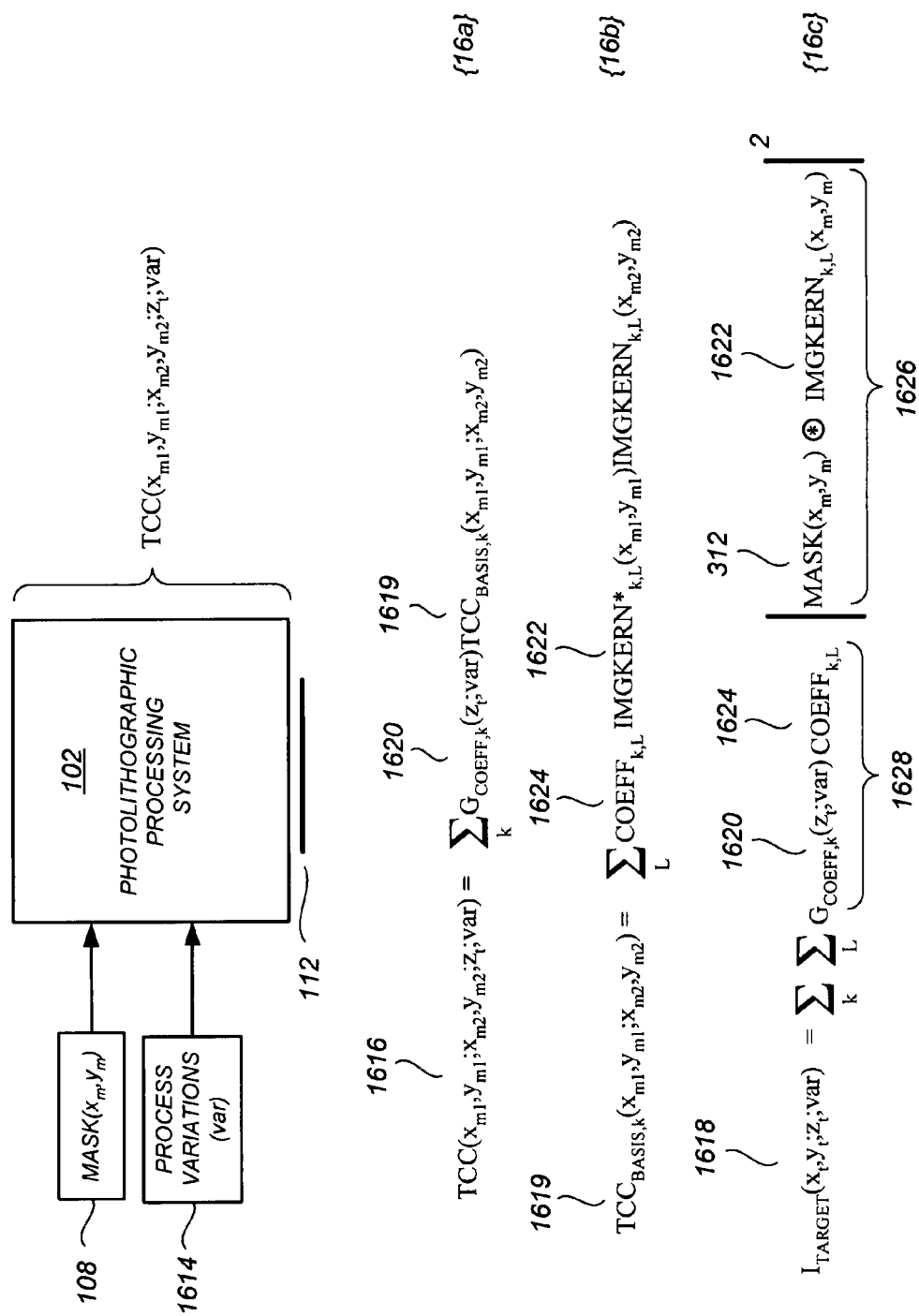
FIG. 16A illustrates a photolithographic processing system and expressions relating to describing photolithographic process simulation according to a preferred embodiment.

FIG. 16A illustrates the photolithographic processing system 102 of FIG. 1A in a block format and expressions relating to describing photolithographic process simulation according to a preferred embodiment, including process variations (var) 1614 associated with one or more of the illumination system, projection system, and chemical processing system. According to a preferred embodiment and as described further infra, a TCC 1616 that describes the photolithographic processing system and that also incorporates the process variations is characterized as a series expansion having basis spatial functions 1619 not dependent on the process variation and at least one expansion coefficient 1620 dependent on the process variations, even where it is not necessarily the projection system's point spread function that incorporates the process variations as with the preferred embodiment of FIG. 12, supra. Each TCC basis spatial function 1619 can then be Mercer-expanded to form imaging kernels 1622 and expansion coefficients 1624.

Thus, for a general process variation, a set of imaging kernels 1622 and imaging kernel weights 1628 are computed according to a preferred embodiment, the imaging kernel weights 1628 being computed, in turn, from the TCC expansion coefficients 1620 and the coefficients 1624 associated with the Mercer expansion of the TCC basis spatial functions, the imaging kernel weights 1628 being dependent on the process variations. For an initial process variation value, the resultant intensity 1618 can be computed by convolving the mask transmittance function 312 with each of the imaging kernels 1622 to generate a plurality of convolution results 1626, which are then combined according to the imaging kernel weights 1628 for the initial process variation value. For subsequent process variation values, resultant intensities 1618 can be computed simply by re-combining the same set of convolution results 1626 using the different values for imaging kernel weights 1628. According to another preferred embodiment, similar steps are carried out in a manner that includes different target depths, separately or in various combinations (var,$z_t$) with the different process variation values.

Figure 16B:
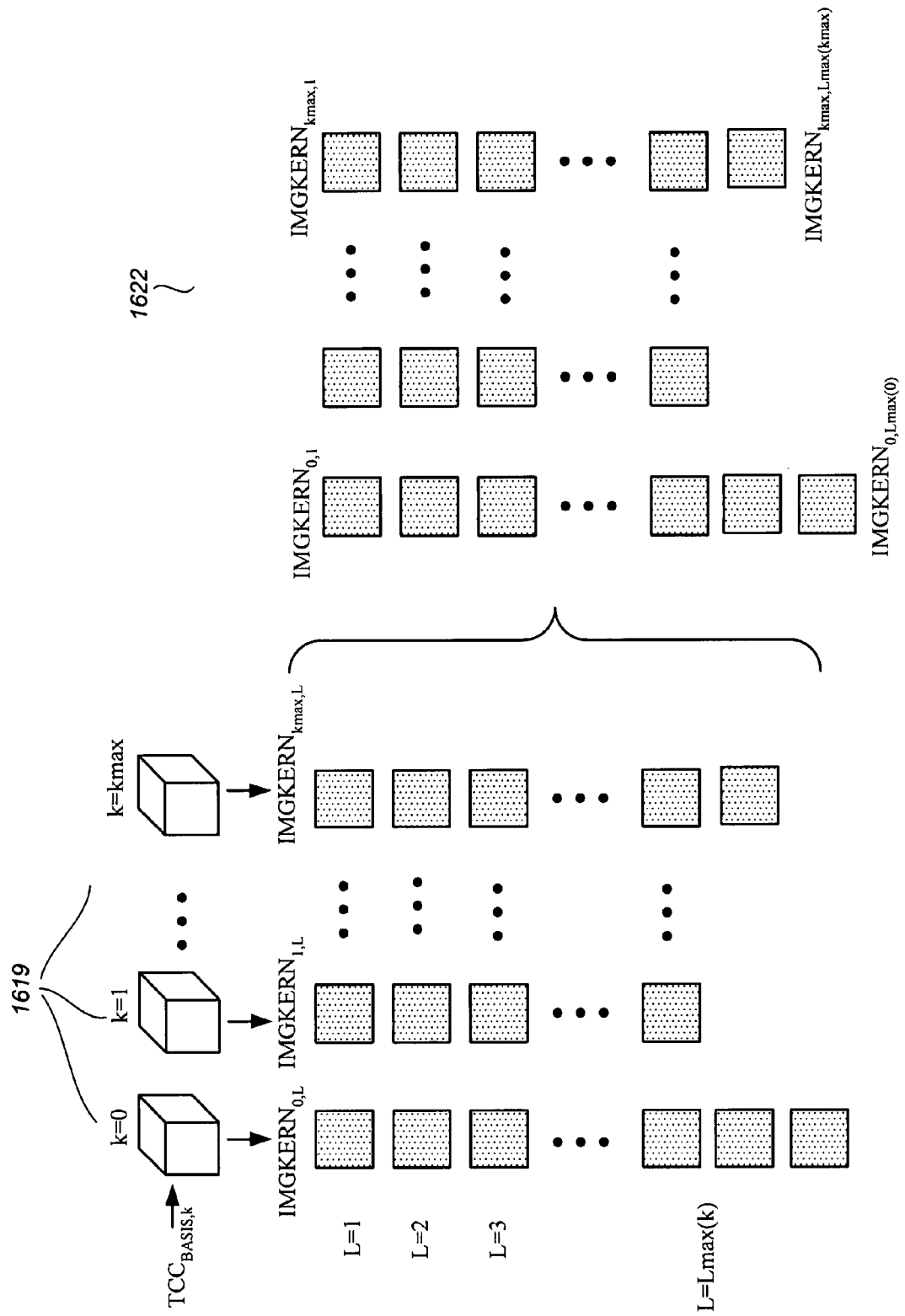
FIG. 16B illustrates a conceptual view of imaging kernel formation according to a preferred embodiment.

FIG. 16B illustrates a conceptual view of the formation of the imaging kernels 1622 referenced supra with respect to FIG. 16A. At the left side of FIG. 16B is a (kmax+1)-member set of TCC basis spatial functions 1619, represented as cubes to denote that each is a function of four variables ($x_{m,1},y_{m1}$; $x_{m2},y_{m2}$). For each $k^{th}$ TCC basis spatial function 1619, a set of imaging kernels IMGKERN$_{k,1}$, IMGKERN$_{k,2}$, ... IMGKERN$_{k,Lmax(k)}$, which can be generated by Mercer expansion, for example, is illustrated. The number of imaging kernels for each $k^{th}$ TCC basis spatial function 1619 can vary with k, and therefore there are Lmax(k) elements for each $k^{th}$ TCC basis spatial function 1619. Referring again to the example M'×M' window of optical ambit scenario, the imaging kernels IMGKERN$_{k,L}$ would each be M'×M' arrays of complex values. At the right side of FIG. 16B is the set of imaging kernels 1622 reproduced as a group, which is precomputed for a particular photolithographic processing system. Importantly, in accordance with the features and advantages of at least one of the preferred embodiments, the imaging kernels 1622 do not depend on the process variations, and the convolution of a particular mask transmittance function with the imaging kernels 1622 only needs to be performed once for computing resultant intensity values across many different process variation values and target depths.

Figures 1, 17:
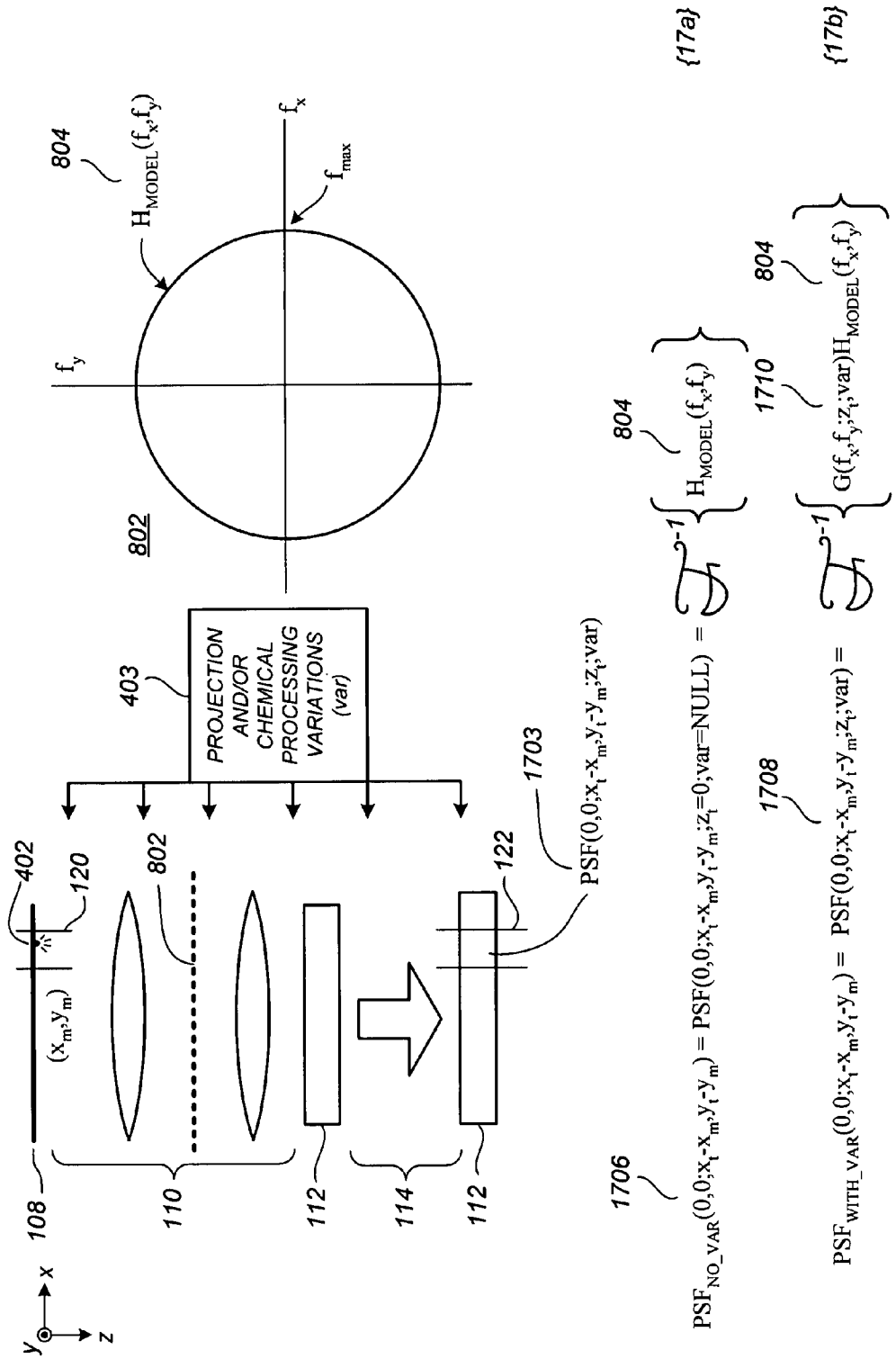
FIG. 17 illustrates a projection system and a chemical processing system of a photolithographic processing system and expressions relating to describing photolithographic process simulation according to a preferred embodiment.

FIG. 17 illustrates a portion of the photolithographic processing system 102 of FIG. 1A and expressions relating to describing photolithographic process simulation according to a preferred embodiment, for the purposes of illustrating another example, in addition to the example supra of FIG. 8, of the manner in which a point spread function incorporating at least one process variation can be provided. In contrast to the example supra of FIG. 8, FIG. 17 illustrates a generalized example in which the process variation can be expressed as a generalized frequency plane perturbation 1710 times the model pupil function 804. As shown in FIG. 17 (Eq. {17b}), the point spread function 1708 can be expressed as an inverse Fourier transform of the product of the frequency plane perturbation 1710 and the model pupil function 804. As illustrated in FIG. 17 (Eqs. {17c}-{17d}), the generalized frequency plane perturbation 1710 can be expressed as a summation of, for example, Zernike polynomials 1714 as weighted by expansion coefficients 1712, wherein the Zernike polynomials 1714 depend only on spatial frequencies, and wherein the expansion coefficients 1712 depend only on the process variations (var) and/or the target depth $z_t$. This results in the desired expression of FIG. 17 (Eq. {17g}) in which the point spread function 1708 is expressed as a series expansion having basis spatial functions 1716 that do not depend on the process variation or target depth and expansion coefficients 1712 dependent on the process variation and/or target depth. The basis spatial functions 1716 can be computed as the inverse Fourier transforms of products of the Zernike polynomials 1714 and the model pupil function 804. The expansion coefficients 1712 can be computed using the relationship shown in FIG. 17 (Eq. {17d}).

For one or more of the preferred embodiments described supra, features and advantages presented with respect to process variations can also be applied in the context of multiple target depths. For example, according to one preferred embodiment, simulation of a photolithographic process is provided in which computation time for computing the results for several different target depths is not significantly greater than the computation time for computing the results for a single target depth. Computation of model kernels and model kernel weights proceeds in accordance with one or more of the preferred embodiments supra. A mask transmittance function is convolved with each model kernel to generate a plurality of convolution results. A first resultant intensity for a first target depth is computed as a first combination of the convolution results, e.g., combined using a first set of model weight values. Resultant intensities are subsequently computed for different target depths as subsequent combinations of those convolution results, e.g., combined using subsequent sets of model weight values that numerically depend on the target depth.

According to another preferred embodiment, simulation of an exposure process is provided in which computation time for computing the results for several process variation values for each of a plurality of different process variations, as well as for several different resist planes, is not significantly greater than the computation time for computing the results for a single value for each of the process variations and a single target depth. Computation of model kernels and model kernel weights proceeds in accordance with one or more of the preferred embodiments supra. A mask transmittance function is convolved with each model kernel to generate a plurality of convolution results. A first resultant intensity for an initial value for each of the process conditions, as well as an initial target depth, is computed as a first combination of the convolution results, e.g., combined using a first set of model weight values. Resultant intensities are subsequently computed for subsequent values of each of the process variations and for different target depths as subsequent combinations of those convolution results, e.g., combined using subsequent sets of model weight values that numerically depend on the process variation values and the target depth.

Whereas many alterations and modifications of the present invention will no doubt become apparent to a person of ordinary skill in the art after having read the descriptions herein, it is to be understood that the particular preferred embodiments shown and described by way of illustration are in no way intended to be considered limiting. By way of example, references to convolution operations hereinabove also encompass mathematical operations including, but not limited to, transformation into the frequency domain, multiplication, and inverse transformation from the frequency domain, designed to achieve results similar to spatial domain convolution methods. Therefore, reference to the details of the preferred embodiments are not intended to limit their scope, which is limited only by the scope of the claims set forth below.

Figure 20:
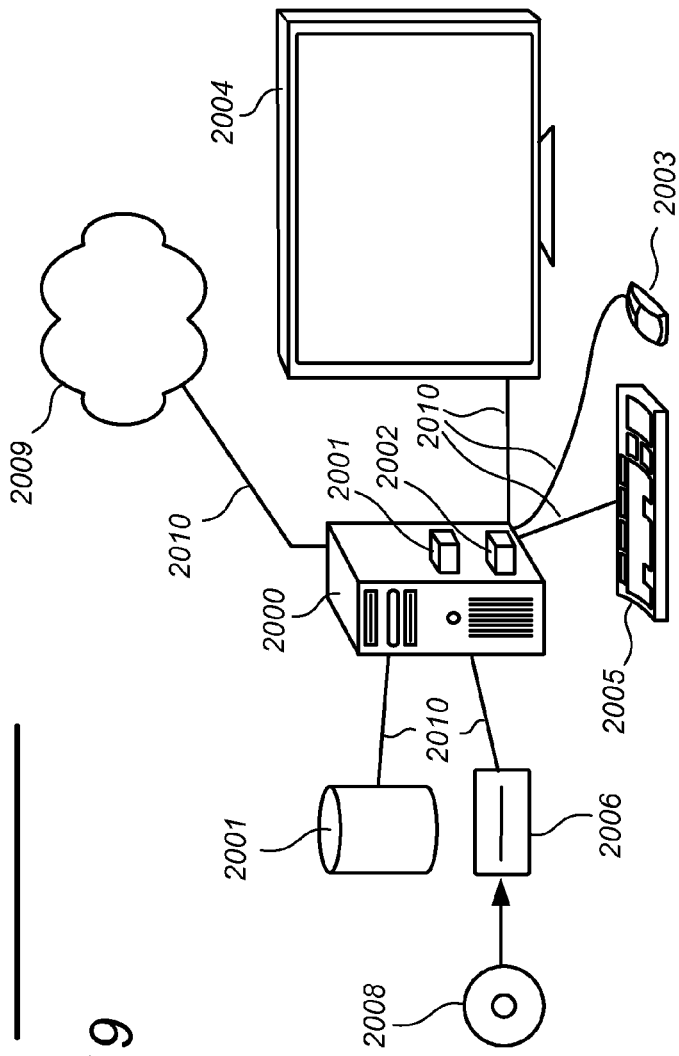
FIG. 20 illustrates a schematic diagram of a computer system capable of implementing the methods of the present invention.

FIG. 20 illustrates a schematic diagram of a computer system capable of implementing the methods of the present invention. Methods of simulation in accordance with the present invention may be implemented in machine readable code (i.e. software or computer program product) and performed on a computer, such as, but not limited to, the type illustrated in FIG. 20, wherein a central processing unit (CPU) 2000 is connected by means of a bus, network or other communications means 2010 to storage devices such as disk(s) 2001, or memory 2002, as well as connected to various input/output devices, such as a display monitor 2004, a mouse 2003, a keyboard 2005, and other I/O devices 2006 capable of reading and writing data and instructions from machine readable media 2008 such as tape or compact disk (CD). In addition, there may connections via a network 2010 to other computers and devices, such as may exist on a network of such devices, e.g. the Internet 2009. Software to perform the simulation steps described herein may be implemented as a program product and stored on machine readable media 2008.

General Discussion

The feature size of integrated circuits (ICs) has been kept shrinking at a steady pace by technology advancements in photolithography and mask design, so to sustain the ongoing growth of circuit complexity and running speed of semiconductor chips. In the so-called deep-sub-micron regime, the features on wafers are so tiny (less than 100 nm) and so dense that it becomes increasingly difficult to create wafter patterns resembling the design patterns (created by IC design engineers/tools) with high fidelity. In a traditional IC design flow, design rule checking tools are used to check the design patterns against a set of design rules, and extraction tools are employed to estimate electric parameters of to-be-fabricated devices directly from the design patterns, the electric parameters are then used to perform timing analysis, signal integrity check, power and thermal analyses for the IC under design. In view of the inevitable difference between the design and wafer patterns, it makes more sense to employ a computer model simulating the manufacturing process, and to predict the wafer patterns using computer simulations, then to check the predicted wafer patterns against the design rules, and to extract electric parameters of devices based on the predicted wafer patterns.

Generally speaking, a currently available computer simulation process model can be considered as falling into one of two classes, as discussed in C. A. Mack, "30 years of lithography simulation," Proc. SPIE, vol. 5754, pp. 1-12, 2005. One class is physically based, simulating the processes of optical imaging, resist development, and chemical etching in what can be called an ab initio ("from the beginning") manner, or from first-principles. Such process models are fairly accurate but rather computation-intensive because they simulate the physics in a mechanical fashion, hence can often overload themselves with data manipulation and number crunching without the help of analytical or semi-analytical solutions. As a result, these process models are generally too slow to run full-chip simulations for most production applications, such as optical proximity correction (OPC) of masks and other resolution enhancement techniques (RETs), RET verification, etc. However, they are useful research tools to run simulations on a small chip area on the order of microns to tens of microns squared, to assist process development and to benchmark other simulation tools. The other class of process models is used in production tools, that is designed with high running speed and sacrificed simulation accuracy. A reason for such speed improvement and accuracy loss is that the models are not all ab initio, rather, they often are based upon or incorporate empirical assumptions about the processes of optical imaging, resist development, and chemical etching, that are not general principles governing the underlying physical and chemical processes. Apart from lower accuracy, the applicability of the process models for production tools is usually limited to a small region of the parameter space of process variations, because the models are calibrated using test data under a single, usually the best, process condition, and efforts are made to add and tweak empirical formulas and parameters until the best fit to the measured data is reached. A model built in this manner may reasonably predict the process behavior under the calibrated condition. However, the empirical assumptions often lack the generality to make reliable predictions when simulating process deviations away from the calibrated condition.

Consequently, existing OPC and RET verification products are often only capable of modelling a manufacturing process and simulating the wafer patterns under one (usually the best) process condition. For example, the simulations usually assume a process under the best focus of the optical exposure system (often referred as the optical stepper) and ideal intensity/position settings of multiple emitters. However, practical manufacturing inevitably involves process variations. Defocus, that is deviation of the wafer position from the best focal surface, and intensity/position variations of multiple emitters, are exemplary sources of process variations among others. Such process variations could degrade the quality of photolithographic pattern transfer, resulting in wafer patterns that fall out of certain design rules, which eventually lead to yield loss. Accordingly, there is a need for OPC and RET verification tools to be able to accurately model process variations and to sample over a large space of such variations by tuning continuously at least two process parameters, then to predict wafer patterns under variations of process parameters, eventually to calculate or optimize the so-called process windows. A hardware system has been available for full-chip process window qualifications, as discussed in M. J. Brodsky et al., "Process-window sensitive full-chip inspection for design-to-silicon optimization in the sub-wavelength era," Proc. SPIE, vol. 5756, pp. 51-60, 2005. A software counterpart for a similar purpose could be equally useful, more cost-effective, more convenient to use, while offering more and readily expandable functionalities with faster turnaround. It would be desirable to provide a numerical algorithm that provides both accuracy and speed simultaneously to run full-chip simulations over a large space of process variations. It would be further desirable to provide a numerical algorithm that supports continuous sampling of at least two process variations. One approach that has actually been tried in several commercial products is to employ multiple empirical models calibrated separately at discrete process conditions, as discussed in J. Schacht et al., "Calibration of OPC models for multiple focus conditions," Proc. SPIE, vol. 5377, pp. 691-702, 2004; J. A. Torres et al., "Process window modeling using compact models," Proc. SPIE, vol. 5567, pp. 638-648, 2004; J. Word et al., "Lithography yield enhancement through optical rule checking," Proc. SPIE, vol. 5645, pp. 142-153, 2005; N. Lafferty et al., "Physically-based compact models for fast lithography simulation," Proc. SPIE, vol. 5754, pp. 537-542, 2005; A. Borjon et al., "High accuracy 65 nm OPC verification: full process window model vs. critical failure ORC," Proc. SPIE, vol. 5754, pp. 1190-1201, 2005; M. Cote et al., "Process centering OPC using design intent to improve yield," Proc. SPIE, vol. 5756, pp. 331-339, 2005; and P. Martin et al., "Exploring new high speed, mask aware RET verification flows," Proc. SPIE, vol. 5853, pp. 114-123, 2005. However, a collection of discretely calibrated models may not support continuous tuning of process parameters because it becomes questionable when extrapolating empirical models into conditions other than where they are calibrated. Furthermore, multiple models generally require significantly more effort to calibrate, and may induce higher computational complexity to applications using them.

For the known existing software approaches identified above, one disadvantage is that, if N is the number of discrete sampling points of process variations, for example the number of different defocus values, or different values of lens abberations, and combinations of values of multiple process variations, then those known existing software approaches need to generate and use N sets of process models, each process model comprising a set of model kernels, which collectively characterize the photolithographic process from a mask to a resultant image of the mask (e.g., an aerial image, or a planar image at a certain depth in resist, or a three-dimensional (3D) distribution of optical intensity in resist, or a latent image in resist, or a set of developed resist patterns, or a set of final silicon patterns). For each discrete sampling point of process variation, each model kernel may be convolved with a mask transmittance function and the convolution results may be squared and combined in a weighted manner to yield the resultant image of the mask. The resultant image of the mask may be used to make predictions about the developed resist patterns or the final silicon patterns. Such software approaches generally suffer from stiff increases of computational complexity when the number N of discrete sampling points of process variations becomes large. The computational complexity of a computational task may be measured by the total computation time of all computers used for the task, so that the complexity measure is substantially independent of the number of computers used, so long as all computers are substantially equivalent in computational power. When the same or similar computational task is repeated under different values of process variations, excluding the computation time needed for initial preparations, such as reading files and preparing mask data, let $T(1)$ denote the computational complexity for simulating one sampling point of process variations, and $T(N)$, $N \geq 2$ be the total computational complexity for simulating N sampling points of process variations, then the following formula holds true for such software approaches, $$T(N)=T(1) \times N, N \geq 2. \quad (1)$$

That is, the computational complexity is directionally proportional to the number of sampling points of process variations, when the same or similar computational task is repeated. By repeating the same or similar computational task under process variations, it is meant that the computational task is repeated with the same or similar specifications including but not limited to input data and desired output data, except for changing the values of a set of process variations. For an example scenario, the distribution of resultant intensity within a chosen area on a wafer substrate may be calculated repeatedly under different values of defocus, where the fixed output data may be discretely sampled intensity values on a fixed mesh of target points over the chosen area on wafer, whereas the fixed input data may include the mask layout, especially the portion that corresponds to the chosen area on wafer, parameters related to chemical processing, and the configurations of the stepper machine such as the illumination setting and the numerical aperture of the projection lens, except for the distance from the last projection lens to the wafer substrate, namely the defocus value, which changes from one repetition to another. A known existing software tool tackles such simulation task for each value of defocus separately and independently, thus incurs a complexity cost that is directly proportional to the number of repetitions, that is, the number of different values of defocus. Such high computational complexity imposes a substantial limitation to such software approaches in simulating photolithographic processes under variations.

Another scenario may be that different mask layouts or different portions of the same mask layout are input for different sampling points of process variations, namely, repetitions of a computational task with different values of a set of selected process variations, while other (non-selected) parameters of stepper configurations and chemical processing remain the same. The output data may no longer be fixed under such scenario. Rather, each repetition may output resultant intensities of different target areas, corresponding to different portions of a mask layout or simply different mask layouts. Furthermore, the resultant intensity may be irregularly and sparsely chosen by a user or application software, and the irregular distribution of chosen target points may vary from one repetition, namely, one sampling point of process variations, to another. Consequently, the total computation time may vary a lot from one to another sampling point of process variations. However, it is often the case that the total computation time divided by the total number of target points, called the average cost of computational complexity per target point, or cost per point (CPP) in short, remains approximately the same from one sampling point of process variations to another. Therefore, the CPP may serve as another suitable measure for the efficiency or computational complexity of an algorithm or software for photolithographic simulations under process variations, especially with irregularly and sparsely distributed target points. The CPP is generally dependent on the method for computing convolutions of model kernels and a mask transmittance function. One method uses fast Fourier transform (FFT) and computes the convolutions as simple function multiplications in the spatial frequency domain, which is suitable for calculating resultant intensities at regularly and densely sampled target points, and achieves a rather low CPP by virtue of dividing the total computation time by a large number of target points. However, when the target points are irregularly and less densely distributed, such FFT-based method incurs an increase in CPP, because convolution results may have to be evaluated at regularly and densely distributed target points anyway, even though the calculation of resultant intensities is required for a much less number of target points that are irregularly and sparsely distributed. Another method is polygon-based, suitable for the case of irregularly distributed target points with low density, which has amplitude distributions pre-computed and tablized for a predetermined finite set of "primitive" mask shapes. During a photolithographic simulation with a mask layout, for each individual target point, such polygon-based method firstly lists the polygons of the mask layout that falls into a so-called "window of optical ambit" centered at the target point, and decomposes the polygons into primitive mask shapes, then obtains amplitude values for the target point with respect to the primitive mask shapes by looking up the pre-computed tables, and coherently sums the amplitude values associated with each model kernel, finally squares the coherent sums and sums the squares together to get a resultant intensity. The CPP with such polygon-based method is independent of the density and distribution of target points, rather, the CPP is proportional to the average number of primitive mask shapes within a window of optical ambit. For a known existing software of photolithographic simulation under process variations, let CPP be the cost per point regardless of which method is used for convolutions, and let $\Sigma$ be the average number of target points per repetition, namely, per sampling point of process variations, then the total computation time T(N) for the known existing software to simulate $N \geq 2$ sampling point of process variations is given by, $$T(N) = CPP \times \Sigma \times N, N \geq 2. \tag{2}$$

Once again, T(N) is roughly proportional to the number N of sampling points of process variations, which represents a high computational cost for known existing softwares to simulate the photolithographic effects of process variations.

Provided in accordance with one or more of the preferred embodiments is a fast ab initio simulation engine that calculates the 3D image in a resist, and simulates the processes of resist development and chemical etching, all from first-principles. The simulation engine is highly accurate yet sufficiently fast to perform full-chip simulations within standard turn-around-time (on the order of hours) of production tools. Incorporated into one or more of the preferred embodiments is a finding that many computational problems in optical imaging, resist development, and chemical etching are actually amenable to analytical or semi-analytical solutions, which help to greatly reduce the amount of necessary numerical calculations. In particular, the defocus behavior and the 3D image distribution in the resist of a partially coherent imaging system may be represented semi-analytically in terms of series expansions, where a typical term comprises one function of spatial coordinate(s) that does not depend on the defocus distance and/or depth into the resist film and another function that depends on the defocus distance and/or depth into the resist film. The functions of spatial coordinate(s) need only to be numerically calculated once, then the 3D image distribution under variable defocus may be more readily computed by series summation. The provided algorithm evaluates 3D image under arbitrary defocus (as well as abberations and other process variations) without incurring a computational complexity much higher than a conventional calculation of two-dimensional (2D) image under a fixed defocus. Also incorporated into one or more of the preferred embodiments is a finding that 3D image calculation is the major contributor of computational cost for a process simulation. Once a 3D latent image is available, the subsequent ab initio simulations of resist development and chemical etching induce a generally insignificant increase of computational cost. Also provided in accordance with one or more of the preferred embodiments is an efficient and common tree structure for mask data as well as image fields and wafer patterns, which increases data locality and tightly correlates numerical operations with their relevant data, and reduces data dependency among computations on different chip areas. Such data structure is well suited for distributed processing. Also provided in accordance with one or more of the preferred embodiments is efficient data processing by the combination of FFT and tree codes. Resultant amplitudes are calculated once by convolving mask data with pre-computed model kernels using FFT, and results are stored on regular grid points on a tree structure of image points on wafer. Such grid points storing image data are on a higher hierarchical level of the tree structure, where points on the lower hierarchical levels including the leaf nodes have no image information yet. In a latter stage, when image values are needed for a selected set of points on lower hierarchical levels of the tree, image data are pushed down the hierarchy using tree codes.

Provided in accordance with one or more of the preferred embodiments are algorithms that enable fast, first-principle, and full-chip ($F^3$) simulations of photolithographic processes. It is believed that $F^3$ engine will benefit the following applications as well as others: a) yield-oriented silicon fidelity checking (SiFiC), which computes the common process window of a chip or cell by sampling over a space of variable process parameters and checking predicted wafer patterns against a set of design rules; when a probability distribution of process variations is available, such yield-oriented SiFiC may then estimate a yield probability by integrating the probability density over the calculated process window; b) yield-oriented optical proximity correction, which uses a yield-oriented SiFiC-like routine to estimate the process window and yield probability, and selects mask corrections to optimize the process window and yield; c) chip-specific optimization of stepper machines and photolithographic processes, which runs a yield-oriented SiFiC-like routine over the whole chip of a specific chip design, repeatedly under changing stepper configurations and process parameters, until the best configurations and parameters are identified which optimize the predicted yield or process windows; d) virtual device and chip testing based on ab initio simulations, which predicts wafer patterns and extracts electric parameters for devices, then uses a circuit simulator to test the functionality and performance of the IC under design; e) benchmark process models embedded in physical design tools, which are fast simulators of manufacturing processes to guide design optimizations for design for manufacturing (DFM) and design for yield (DFY).

Mathematical Theory of Optical Imaging

Optical Setup of a Stepper

Figure 18:
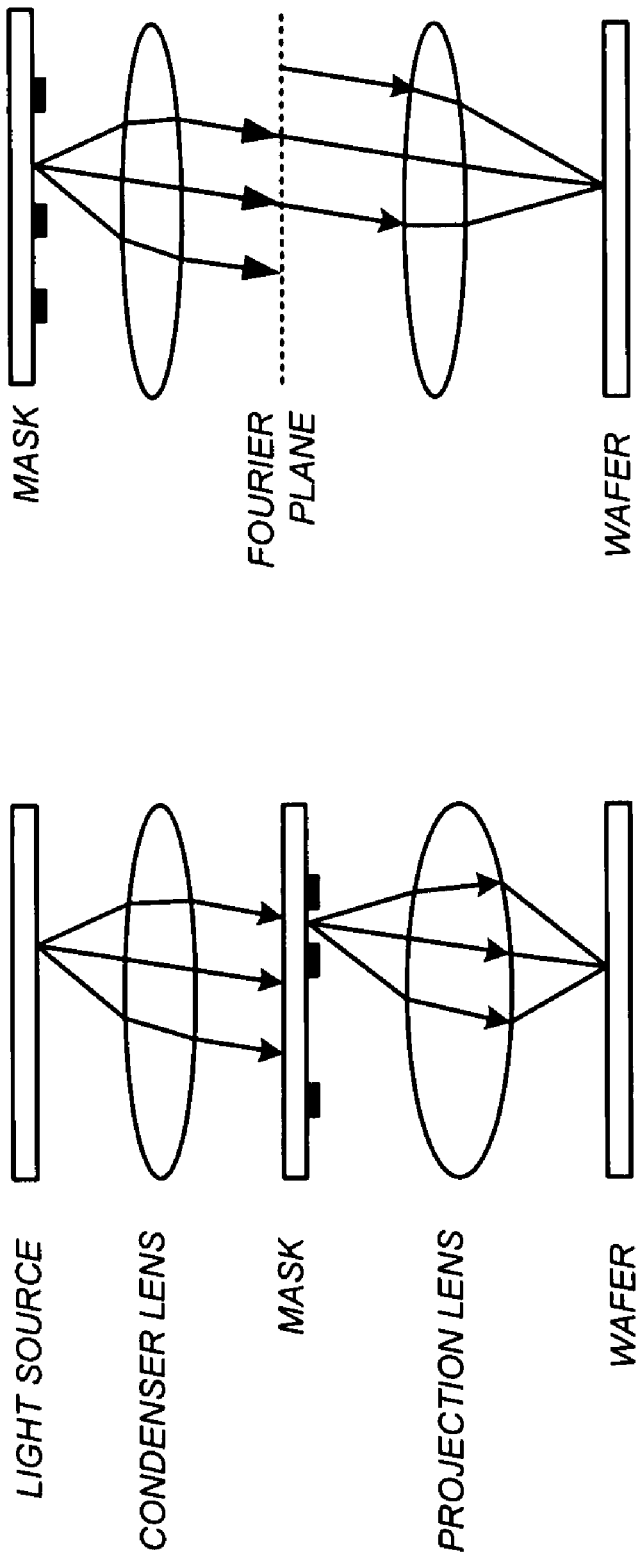
FIG. 18 illustrates an optical exposure system and an equivalent 4F image projection system associated with a projection system thereof.

A stepper machine has a rather complicated optical system, which however, may be modelled as comprising of a spatially extensive illumination source placed on the focal plane of a condenser lens, a mask being illuminated by the condensed light, and a projection lens forming an M times reduced image of the mask onto a wafer, as shown by the left picture of FIG. 18. Many systems are with the reduction factor M=4. Even though a real projection system may have tens of lens pieces, it may be well represented by a two-lens setup, with one lens having a focal length F and the other MF, M≧1. The mask is placed at the input focal plane of the MF lens, the output focal plane of which coincides with the input focal plane of the F lens, where the Fourier transform of the mask transmittance function is formed. The semiconductor wafer is placed at the output focal plane of the F lens to receive the image of the mask. Some advanced designs have the last projection lens and the wafer immersed in a liquid, such as water, with an index of refraction $\eta_0 > 1$. No matter how the imaging system may be designed, it is usually the numerical aperture N.A.=$\eta_0 \sin\theta_{max}$ of the last projection lens that limits the resolution of the system, where $\theta_{max}$ is the largest angle made by an optical ray with respect to the z-axis, which comes off the last projection lens and propagates toward the semiconductor wafer. The z-axis is the optical axis of the lens system, which is normal to the mask and wafer planes. The projection system from the mask down may be modelled by an equivalent 4F and 1:1 system as depicted by the right picture of FIG. 18, where the mask is reduced by M times from its actual size, a pupil may be placed on the Fourier plane to limit the numerical aperture, and the whole system, including the mask, is immersed in the liquid with index $\eta_0$. We stress that such completely immersed, 4F and 1:1 projection system is not the actual configuration of any real machine, rather it serves as a good model for real-world stepper systems, as far as the physics of optical imaging is concerned.

The condenser transforms the light of each source point indexed by $(x,y)=\rho(\cos\alpha, \sin\alpha)$, with $\rho=(x^2+y^2)^{1/2}$ and $\alpha \in [0,2\pi)$, into a coherent plane wave $\sqrt{I(x,y)}\exp(i2\pi f'\cdot r)$, with the spatial frequency $f' \overset{def}{=} (f'_x, f'_y, f'_z) = \lambda^{-1}(\cos\theta, \sin\theta\cos\alpha, \sin\theta\sin\alpha)$, where $I(x,y)$ denotes the intensity of the source point, $r \overset{def}{=} (x,y,z)$ is the spatial coordinate, $\lambda$ is the light wavelength in vacuum, $\theta=\arctan(\rho/F_c)$ is the angle between the z-axis and the propagation direction of the plane wave, $F_c$ is the focal length of the condenser lens, and $$f' \cdot r \overset{def}{=} (f'_x x + f'_y y + f'_z z)$$

is the scalar product between f' and r. Because of the one-to-one correspondence between the location of a source point and the spatial frequency of the plane wave that it generates after the conderser lens, it is possible (and industrial custom) to index the source points by the spatial frequency coordinate. It is further possible to place the frequency-indexed source pattern on the Fourier plane of the projection system as shown in the picture on the right side of FIG. 18, after scaling up $(f'_x, f'_y)$ of the source "coordinate" to $(f_x, f_y) = (Mf'_x, Mf'_y)$, because the mask has been sized down by M times. Then it makes sense to talk about the relative positions and sizes of the source and pupil aperture of the projection system, all in a bounded region on the Fourier plane. The bound in the frequency domain reflects the bandlimiting nature of the system. In particular, $$\sigma_{max} \overset{def}{=} \max\{\lambda(f_x^2 + f_y^2)^{1/2}\}$$

corresponds to the outmost source point from the optical axis, which generates the most off-axis illuminating beam, making an angle $\sin^{-1}(\sigma_{max}/M)$ with respect to the optical axis.

General Theory of Partially Coherent Imaging

There are two mathematical formulations commonly used for partially coherent imaging. One is Abbe's formulation, the other is Hopkins' formulation, as discussed generally in M. D. Smith and C. A. Mack, "Methods for benchmarking photolithography simulators," Proc. SPIE, vol. 5040, pp. 57-68, 2003; and R. J. Socha, "Resolution enhancement techniques," in B. G. Eynon, Jr. and B. Wu, *Photomask Fabrication Technology*, McGraw-Hill, New York, 2005, at Chapter 7. In Abbe's formulation, a spatially extensive illumination source is divided into non-overlapping pixels that are naturally incoherent, where each pixel is sufficiently small to be treated as a single coherent point source. Through the condenser lens, each pixel as a point source generates a parallel beam, or called a plane wave, to illuminate the mask, with the incident angle of the beam determined by the position of the source pixel. Such plane wave multiplied by the mask transmittance function generates an input amplitude field to the projection system, which then forms an output amplitude distribution on the target, whose magnitude squared becomes a contributory resultant intensity distribution for the mask image due to the source pixel. Since different source pixels are mutually incoherent, all contributory intensity distributions due to individual source pixels are summed together to yield the total intensity distribution for the mask image on the target. By contrast, Hopkins' formulation does not divide the illumination source into pixels, instead it uses a Hilbert-Schmidt kernel function called the transmission cross coefficient (TCC) to incorporate the effects of both the illumination and the projection systems together. See, generally, H. H. Hopkins, "On the diffraction theory of optical images," Proc. Roy. Soc. Lond. A, vol. 217, pp. 408-432, 1953; and M. Born and E. Wolf, *Principles of Optics,* 7th ed., Cambridge University Press, 1999, at Chapter 10.

To establish a general framework with Hopkins' formulation, we start from the mutual intensity of two points $r_1$ and $r_2$ on a surface $S_1$, which is illuminated by light coming from a surface $S_0$ of incoherent source points, $$J_1(r_1, r_2) \overset{def}{=} \langle E_1^*(r_1, t)E_1(r_2, t)\rangle = \int_{S_0} K_{01}^*(s, r_1)K_{01}(s, r_2)I_0(s)ds, \quad (3)$$

where $E_1(r,t)$ is the light electric field at a point r=(x,y,z), $\langle \rangle$ denotes time and statistical average, $I_0(s)$ is the intensity per unit area of the source at a point $s \in S_0$, $K_{01}(s,r)$ is the optical propagation amplitude from the source point s to the target point r. See, generally, as referenced supra, H. H. Hopkins; and M. Born and E. Wolf. The symbol "*" denotes the complex conjugate for a scaler quantity, and more generally the Hermitian conjugate for a vector, a matrix, or an operator. The following describes the propagation of mutual intensity from one surface $S_1$ to another surface $S_2$, $$J_2(q_1,q_2) = \int_{S_1}\int_{S_1} K^*_{12}(r_1,q_1)J_1(r_1,r_2)K_{12}(r_2,q_2)dr_1 dr_2, \quad (4)$$

where $q_1, q_2 \in S_2$, and $K_{12}(r,q)$ is the optical propagation amplitude from $r \in S_1$ to $q \in S_2$.

Now let $S_1$ be the plane where a mask is located, and $S_2$ be the image surface (that is the wafer surface for lithography). Equation (3) may be used to calculate the mutual intensity immediately before the mask, which is denoted as $J_1^-(r_1,r_2)$, $r_1, r_2 \in S_1$. The mask is assumed to multiply the input light field $E_1(r,t)$, $r \in S_1$ by a complex transmittance function $u(r)$, $r \in S_1$. So the mutual intensity immediately after the mask is given by, $$J_1^+(r_1, r_2) = \langle u^*(r_1)E_1^*(r_1, t)E_1(r_2, t)u(r_2)\rangle \quad (5)$$

$$= u^*(r_1)u(r_2)\int_{S_0} K_{01}^*(s, r_1)K_{01}(s, r_2)I_0(s)\,ds$$

$$= u^*(r_1)J_1^-(r_1, r_2)u(r_2).$$

According to equation (4), the mutual intensity for two points $q_1, q_2 \in S_2$ would be, $$J_2(q_1,q_2) = \int_{S_1}\int_{S_1} u^*(r_1)K_{12}^*(r_1,q_1)J_1^-(r_1,r_2)K_{12}(r_2,q_2)u(r_2)\,dr_1 dr_2. \quad (6)$$

Instead of the general mutual intensity, we are actually interested in the resultant intensity distribution $I_2(q)=J_2(q,q)=\langle E_2^*(q,t)E_2(q,t)\rangle$, for which the formula is slightly simpler, $$I_2(q)=\int_{S_1}\int_{S_1} u^*(r_1)K_{12}^*(r_1,q)J_1^-(r_1,r_2)K_{12}(r_2,q)u(r_2)\,dr_1 dr_2. \quad (7)$$

Imaging systems under our consideration are usually made shift-invariant in space, namely, $$J_1^-(r_1,r_2) \equiv J_1^-(r_1-r, r_2-r), \forall r_1, r_2, r \in S_1, \quad (8)$$

$$K_{12}(r,q) \equiv K_{12}(r-q|S_1, 0), \forall r \in S_1, \forall q \in S_2, \quad (9)$$

where $q|S_1$ is the point on $S_1$ that is optically conjugate to $q$, namely, $q|S_1$ is the source point on $S_1$ whose geometrical optics image on $S_2$ is $q$. For plane-to-plane and 1:1 imaging, $q|S_1 \stackrel{def}{=} (x,y,z_1) \in S_1$, $\forall q=(x,y,z_2) \in S_2$. With such shift invariance, equation (7) may be rewritten as, $$I_2(q) = \int_{S_1}\int_{S_1} u^*(r_1)K_{12}^*(r_1 - q|S_1, 0)J_1^-(r_1 - q|S_1, r_2 - q|S_1) \times K_{12}(r_2 - q|S_1, 0)u(r_2)\,dr_1 dr_2. \quad (10)$$

With substitutions $r_1 \to r_1+q|S_1$, $r_2 \to r_2+q|S_1$, equation (10) may be further rearranged into, $$I_2(q) = \int_{S_1}\int_{S_1} u^*(r_1 + q|S_1)K_{12}^*(r_1, 0)J_1^-(r_1, r_2)K_{12}(r_2, 0)u(r_2 + q|S_1)\,dr_1 dr_2 \quad (11)$$

$$= \int_{S_1}\int_{S_1} u^*(r_1 + q|S_1)T(r_1, r_2)u(r_2 + q|S_1)\,dr_1 dr_2$$

$$= \int_{S_1}\int_{S_1} u_{q|S_1}^*(r_1)T(r_1, r_2)u_{q|S_1}(r_2)\,dr_1 dr_2,$$

with $T(r_1, r_2)$ being the so-called TCC and represented as, $$T(r_1, r_2) \stackrel{def}{=} K_{12}^*(r_1, 0)J_1^-(r_1, r_2)K_{12}(r_2, 0) \quad (12)$$

$$= \int_{S_0} K_{12}^*(r_1, 0)K_{01}^*(s, r_1)K_{01}(s, r_2)K_{12}(r_2, 0)I_0(s)\,ds,$$

and $u_q(r)$ being the transmittance function of the same mask with shifted coordinate, $$u_q(r) \stackrel{def}{=} u(r+q), \forall r, q \in S_1. \quad (13)$$

To simplify mathematical notations, we shall adopt the scale-normalized (Seidel) coordinate system and consider an equivalent 1:1 imaging system. We shall index points on any plane that is perpendicular to the z-axis by the same set $P=\{(x,y):x\in R, y\in R\}$. P is actually a projective plane, in which an element $q=\overline{(x,y,0)}$ is the equivalent class of all 3D points $(x,y,z)$ with arbitrary z. For convenience in dealing with mathematical convergence, P is further assumed to be bounded, that is, $$P \stackrel{def}{=} \{(x, y) : |x| \leq L, |y| \leq L\},$$

where $L>0$ is sufficiently large so that the imaging system is not affected by the finiteness of the plane. A typical element $q \in P$ is herein referred to as a planar spatial coordinate. Both surfaces $S_1$, $S_2$, and more that may be introduced later, are equivalent co-sets to P, and shall be identified with P as a convention. Mathematical formulas may be simplified by such collapse of parallel surfaces into one projective plane and indexing all points by the same projective planar coordinate. However, when the actual z coordinate is needed, the information may be obtained from the context. In particular for our propagation amplitudes $K_{ji}(\cdot,\cdot)$, $i,j=0,1,\ldots$, the subscripts i and j imply the propagation of light from one surface at $z=z_i$ to another at $z=z_j$. Under said convention, equation (11) may be rewritten as, $$I_2(q)=\int_P\int_P u_q^*(r_1)T(r_1,r_2)u_q(r_2)\,dr_1 dr_2, \forall q \in P, \quad (14)$$

and the TCC may be calculated as, $$T(r_1,r_2)=K_{12}^*(0,-r_1)J_1^-(r_1,r_2)K_{12}(0,-r_2), \quad (15)$$

where the propagation amplitude $K_{12}(0,r)$, $r \in P$ is actually the impulse response, also known as the point-spread function (PSF), of the optical projection system. It is to be appreciated that in one or more of the preferred embodiments, the PSF could be rendered (i.e., generalized) to incorporate some effects of photochemistry of resist molecules and post-exposure chemical processing and thereby characterizes the response of both the projection and chemical processing systems. By way of example and not by way of limitation, the PSF may be associated with the formation of any of the following resultant images: an aerial image, an optical intensity distribution in resist, a latent image in resist, a developed resist pattern, a final silicon pattern, and other responses. The PSF may be 2D, 3D, four- and even higher-dimensional where a dependence on time, defocus and/or other parameters is to be considered. For clarity of explanation in the present example, the PSF is considered as to form an optical intensity distribution (i.e., the chemical processing step is a null step) at one depth in the resist layer, hence to be 2D.

Formulations Using Functional Analysis

Using the language of functional analysis, both the amplitude of light on a surface and the transmittance function of a mask may be regarded as elements in the Hilbert space $L_2(P)$, that is the set of square Lebesgue-integrable functions on P with an inner product $\langle \cdot \| \cdot \rangle$ represented as, $$\langle u \| v \rangle \stackrel{def}{=} \int_P u^*(r)v(r)\,dr, \forall u, v \in L^2(P), \quad (16)$$

where the so-called "bra" and "ket" notation, as widely used in quantum mechanics, has been adopted. Namely, the ket symbol $|u\rangle$ denotes a vector u in the Hilbert space, whereas the bra symbol $\langle u|$ denotes the vector conjugate to u in the dual space. We will also be concerned with linear operators, or called linear maps, from $L^2(P)$ to itself. For any linear operator $O:L^2(P) \to L^2(P)$, there is an adjoint operator, denoted by $O^*$, that acts on the dual Hilbert space, in the bra and ket notation, $$O|u\rangle \overset{def}{=} |Ou\rangle, \langle u|O \overset{def}{=} O^*\langle u| \overset{def}{=} \langle (Ou)|, \quad \forall u \in L^2(P). \tag{17}$$

Regarded as Hilbert-Schmidt kernels, the TCC $T(r_1, r_2)$ and propagation amplitudes $K_{ij}(r,q)$, $i,j=0,1,\ldots$ may be associated with linear operators, called the TCC operator and propagators, denoted by $T$ and $K_{ij}$, $i,j=0,1,\ldots$ respectively, as in the following, $$T|u\rangle(r_1) \overset{def}{=} \int_P T(r_1, r_2)u(r_2)dr_2, \tag{18}$$

$$K_{ij}|u\rangle(q) \overset{def}{=} \int_P u(r)K_{ij}(r,q)dr, \tag{19}$$

$\forall u \in L^2(P)$, $\forall i,j=0,1,\ldots$ The TCC operator T is Hermitian, and the propagators $K_{ij}$ are unitary operators, namely, $T^*=T$, $K^*_{ij}=K_{ij}^{-1}$, where $K_{ij}^{-1}$ denotes the inverse operator of $K_{ij}$. In terms of the associated Hilbert-Schmidt kernels, we have the following, $$T(r_1, r_2) = T^*(r_2, r_1), \quad \forall r_1, r_2 \in P, \tag{20}$$

$$K_{ij}^{-1}(q,r) = K^*_{ij}(r,q), \quad \forall r, q \in P. \tag{21}$$

Moreover, the TCC operator T is positive definite, as equation (14) is a positive definite quadratic form of elements $u_q \in L^2(P)$, or in the abstract notation, $$I_2(q) = \langle u_q | T | u_q \rangle = \langle u_q \| T u_q \rangle = \langle T u_q \| u_q \rangle \geq 0, \forall q \in P. \tag{22}$$

Being compact, Hermitian, and positive definite, the TCC operator T has positive eigenvalues $\lambda_1 \geq \lambda_2 \geq \ldots > 0$ with corresponding eigenvectors $\phi_n \in L^2(P)$, $n=1,2,\ldots$ Moreover, T may be represented as a sum of projection operators, $$T = \sum_{n \geq 1} \lambda_n |\phi_n\rangle\langle\phi_n|, \tag{23}$$

and equivalently, there is the Mercer expansion for the Hilbert-Schmidt kernel, $$T(r_1, r_2) = \langle r_1 | T | r_2 \rangle = \sum_{n \geq 1} \lambda_n \phi_n(r_1)\phi_n^*(r_2), \tag{24}$$

with which, equation (22) becomes, $$I_2(q) = \sum_{n \geq 1} \lambda_n \langle u_q \| \phi_n \rangle\langle \phi_n \| u_q \rangle = \sum_{n \geq 1} \lambda_n |\langle \phi_n \| u_q \rangle|^2 \geq 0, \quad \forall q \in P. \tag{25}$$

This is the so-called "decomposition of a partially coherent imaging system into an Incoherent Sum Of Coherent Systems" (ISOCS), which may be used to speedup the calculation of resultant intensities with the eigenvectors $\{\phi_n(r)\}_{n \geq 1}$ pre-computed. Imaging kernels refer herein to mathematical functions that characterize a photolithographic process, or a general optical imaging process, where each imaging kernel may be convolved (or correlated using inner product) with a mask transmittance function to yield an amplitude distribution as a convolution result, then the convolution result may be squared to get a contributory resultant intensity distribution, finally the contributory intensities of different imaging kernels may be summed together to generate the intensity distribution for the resultant image of the mask. It follows that the functions $\{\phi_n(r)\}_{n \geq 1}$ are imaging kernels of the partially coherent imaging system. Moreover, the imaging kernels $\{\phi_n(r)\}_{n \geq 1}$ are mutually orthogonal, and they form an orthogonal basis for the functional space $L^2(P)$. The problem of computing resultant intensity reduces to calculating convolutions of a mask transmittance function with pre-computed imaging kernels. The convolutions may be efficiently computed as simple function multiplications in the spatial frequency domain, with the help of FFT to transform between the two domains of real space and spatial frequency. Working in the spatial frequency domain will be discussed in details below. Other approaches of resultant intensity calculation rely on decomposing mask polygons into primitive geometric shapes, such as corners, rectangles, or triangles, pre-computing and storing convolution results, which may be called pre-images, of the primitive shapes with the imaging kernels, and calculating the amplitudes of a mask image by summing up pre-images of all primitive shapes constituting the mask. Then the resultant intensity is simply the sum of the amplitudes squared. In such approaches, imaging kernels may not be directly stored numerically in physical devices, rather the pre-images of primitive shapes could be stored and transferred between physical devices of computer memory. However, the imaging kernels may be recovered by differentiating the pre-images, or calculating the image of a tiny pixel on mask, for example a 1 nm×1 nm square, using the pre-images.

It may be noted that the inner product representation, $$\langle \phi_n \| u_q \rangle = \int_P \phi_n^*(r)u(r+q)dr, \tag{26}$$

for a typical $n \geq 1$, is not a convolution in the strict traditional sense, rather it is usually called the correlation function of $\phi_n(r)$ and $u(r)$. However, by a change of variable $r \to -r$, the inner product representation of equation (26) may be interpreted as a convolution between $\phi^*_n(-r)$ and $u(r)$ strictly in the conventional sense, $$\langle \phi_n \| u_q \rangle = \int_P \phi_n^*(-r)u(q-r)dr. \tag{27}$$

Such change of variable and convolutional interpretation are applicable throughout this description to all inner products between imaging kernels (as well as other model kernels) and a coordinate-shifted mask transmittance function $u_q(r)$. As a consequence, in this description we shall not differentiate between the conventional convolution and correlation function of two functions. Rather we will use the two representations interchangeably and refer to them commonly as convolution.

It is also possible to reformulate the mathematical equations to manifest convolution structures explicitly in the conventional sense. To that end, one may start from equation (7) and work with the scale-normalized coordinate system, $$\begin{aligned}
I_2(q) &= \int_P \int_P u^*(r_1) K_{12}^*(r_1, q) J_1^-(r_1, r_2) K_{12}(r_2, q) u(r_2) dr_1 dr_2 \\
&= \int_P \int_P u^*(r_1) K_{12}^*(0, q-r_1) J_1^-(r_1, r_2) K_{12}(0, q-r_2) u(r_2) dr_1 dr_2 \\
&= \int_P \int_P u^*(r_1) K_{12}^*(0, q-r_1) J_1^-(q-r_2, q-r_1) K_{12}(0, q-r_2) u(r_2) dr_1 dr_2 \\
&= \int_P \int_P u^*(r_1) T_-(q-r_1, q-r_2) u(r_2) dr_1 dr_2,
\end{aligned} \tag{28}$$

where $T_-(r_1,r_2)$ is a reformulated TCC, $$T_-(r_1, r_2) \stackrel{def}{=} T(-r_1, -r_2) = K_{12}^*(0, r_1)J_1^-(r_2, r_1)K_{12}(0, r_2). \quad (29)$$

Using reformulated functions, $$\phi_n(r) = \phi^*_n(-r), \forall n \geq 1, \quad (30)$$

$T_-(r_1,r_2)$ may be Mercer-expanded as, $$T_-(r_1, r_2) = \quad (31)$$
$$T(-r_1, -r_2) = \sum_{n\geq 1} \lambda_n \phi_n(-r_1)\phi_n^*(-r_2) = \sum_{n\geq 1} \lambda_n \Phi_n^*(r_1)\Phi_n(r_2),$$

which may be plugged into equation (28) to yield, $$I_2(q) = \sum_{n\geq 1} \lambda_n \int_P \int_P u^*(r_1)\Phi_n^*(q-r_1)\Phi_n(q-r_2)u(r_2)dr_1 dr_2 = \quad (32)$$
$$\sum_{n\geq 1} \lambda_n |u(q) \star \Phi_n(q)|^2, \quad \text{with}$$

$$u(q) \star \Phi_n(q) = \quad (33)$$
$$\Phi_n(q) \star u(q) \stackrel{def}{=} \int_P u(r)\Phi_n(q-r)dr = \int_P \Phi_n(r)u(q-r)dr, \quad \forall_n \geq 1,$$

being convolutions represented strictly in the conventional sense.

Formulations in the Spatial Frequency Domain

Sometimes it may be convenient to work in the frequency domain. One advantage of working in the frequency domain is that the plane waves are eigenvectors of the spatial shift-invariant propagators, so that the action of a propagator on a plane wave is simply a scaling of amplitude and a shift of phase. A spatial frequency $(f_x, f_y, f_z)$ may be associated with a plane wave $\exp[i2\pi(f_x x+f_y y+f_z z)]$, with (x,y,z) coordinating the 3D real space. If x, y, and z are measured in units of $\lambda$, the wavelength of the source light in vacuum, then $(f_x, f_y, f_z)$ lies on a spherical surface with radius $\eta$, that is, $f_x^2 + f_y^2 + f_z^2 = \eta^2$, where $\eta$ is the refractive index of the medium transmitting the wave. In a spherical coordinate system, the spatial frequency may be represented as $(f_x, f_y, f_z) = \eta(\cos\theta, \sin\theta\cos\phi, \sin\theta\sin\phi)$, $\theta \in [0,\pi]$, $\phi \in [0,2\pi]$. When restricted to a plane with $z=z_0$, the plane wave becomes $e^{i2\pi f_z z_0}|f\rangle$ with $|f\rangle$ being the ket notation for a wave function, $$\langle r | f \rangle \stackrel{def}{=} \exp(i2\pi f \cdot q) = \exp[i2\pi(f_x x + f_y y)], \quad (34)$$

where $$r = (x, y) \in P, f \stackrel{def}{=} (f_x, f_y) \in F,$$
$$\text{with } F \stackrel{def}{=} \{(f_x, f_y) : f_x^2 + f_y^2 \leq f_{max}^2\}$$

being the space of bounded 2D spatial frequencies, where $$f_{max} \stackrel{def}{=} N.A. + \sigma_{max}.$$

It is obvious that $|f\rangle \in L^2(P)$ because of the finiteness of P in our convention. It should be noted that there is never an actual 2D wave corresponds to any $|f\rangle$, $f \in F$, which is just a slice of a 3D wave on a plane with constant z. Light propagates with the phase velocity $c/\eta$ in a medium with index $\eta$, where c is the speed of light in vacuum. With this understanding, however, we shall often use $|f\rangle$ with $f=(f_x,f_y)$ to denote either a 3D wave $\exp[i2\pi(f_x x+f_y y+f_z z)]$ or a slice of it on a plane with constant z, so long as the context provides information about which surface z=constant is concerned, or which medium with what refractive index is transmitting the wave. Such convention is backed up by the fact that the x- and y-directional spatial frequency $f_x$ and $f_y$ are conserved by reflection/refraction at interfaces perpendicular to the z-axis between media with different refractive indices, due to or manifested by Snell's law of reflection/refraction.

We shall use frequently the following pair of Fourier and inverse Fourier transforms and their nature extensions to higher-dimensional spaces, $$U(f) = \mathcal{F}[u(x)] \stackrel{def}{=} \int u(x)\exp(-i2\pi f x)dx, \quad (35)$$

$$u(x) = \mathcal{F}^{-1}[U(f)] \stackrel{def}{=} \int U(f)\exp(i2\pi f x)df. \quad (36)$$

By applying the operator identity $\int_F |f\rangle\langle f|df = 1$ twice, equation (22) may be rewritten as, $$I_2(q) = \langle u_q | T | u_q \rangle \quad (37)$$
$$= \int_F \int_F \langle u_q | f_1 \rangle\langle f_1 | T | f_2 \rangle\langle f_2 | u_q \rangle df_1 df_2$$
$$= \int_F \int_F \bigcup_q^*(f_1)T(f_1, f_2) \bigcup_q(f_2) df_1 df_2,$$

where, $$T(f_1, f_2) \stackrel{def}{=} \langle f_1 | T | f_2 \rangle = \int_P \int_P \langle f_1 | r_1 \rangle\langle r_1 | T | r_2 \rangle\langle r_2 | f_2 \rangle dr_1 dr_2 \quad (38)$$
$$= \int_P \int_P e^{-i2\pi f_1 \cdot r_1} T(r_1, r_2) e^{i2\pi f_2 \cdot r_2} dr_1 dr_2$$
$$= \int_P \int_P e^{-i2\pi f_1 \cdot r_1} K_{12}^*(0, -r_1)J_1^-(0, r_2 - r_1)K_{12}(0, -r_2)$$
$$\quad e^{i2\pi f_2 \cdot r_2} dr_1 dr_2$$
$$= \int_P \int_P e^{i2\pi f_1 \cdot r_1} K_{12}^*(0, r_1)J_1^-(0, r_1 - r_2)$$
$$\quad K_{12}(0, r_2) e^{-i2\pi f_2 \cdot r_2} dr_1 dr_2$$
$$= \int_F \int_P \int_P e^{i2\pi f_1 \cdot r_1} K_{12}^*(0, r_1)J(f)e^{i2\pi f \cdot (r_1 - r_2)}K_{12}(0, r_2)$$
$$\quad e^{-i2\pi f_2 \cdot r_2} dr_1 dr_2 df$$
$$= \int_F K_{12}^*(f + f_1)J(f)K_{12}(f + f_2) df,$$

and the Fourier transforms are represented as, $$U_q(f) \stackrel{def}{=} \mathcal{F}[u_q(r)] = \int_P \langle f | r \rangle \langle r | u_q \rangle dr = \int_P u_q(r) e^{-i2\pi f \cdot r} dr, \quad (39)$$

$$K_{12}(f) \stackrel{def}{=} \mathcal{F}[K_{12}(0, r)] = \int_P K_{12}(0, r) e^{-i2\pi f \cdot r} dr, \quad (40)$$

$$J(f) \stackrel{def}{=} \mathcal{F}[J_1^-(0, r)] = \int_P J_1^-(0, r) e^{-i2\pi f \cdot r} dr. \quad (41)$$

The inverse Fourier transforms are of course, $$u_q(r) = F^{-1}[U_q(f)] = \int_F U_q(f)(r)e^{i2\pi f \cdot r} df, \quad (42)$$

$$K_{12}(0,r) = F^{-1}[K_{12}(f)] = \int_F K_{12}(f)e^{i2\pi f \cdot r} df, \quad (43)$$

$$J_1^-(0,r) = F^{-1}[J(f)] = \int_F J(f)e^{i2\pi f \cdot r} df. \quad (44)$$

$K_{12}(f)$ is called the (frequency) transfer function of the projection system. As mentioned before, there is a one-to-one relationship between the coordinate $s \in S_0$ of a source point and the spatial frequency $f \in F$ of the parallel beam generated by it. When $\sigma_{max}/M$ is small, the relationship may be approximated as linear, namely, $s \approx fF_c/M$, with which equation (3) becomes, $$J_1^-(r_1,r_2) = J_1^-(0,r_2-r_1) = \text{constant} \times \int_F I_0(fF_c/M) e^{i2\pi f \cdot (r_2-r_1)} df, \quad (45)$$

and evidently, $$J(f) = \text{constant} \times I_0(fF_c/M). \quad (46)$$

The function $T(f_1,f_2)$ may be regarded as the Hilbert-Schmidt kernel of the linear operator $FTF^{-1}:L^2(F) \to L^2(F)$, which is still Hermitian and positive definite, and has the same eigenvalues $\lambda_1 \geq \lambda_2 \geq \ldots > 0$, with the corresponding eigenvectors, $$\psi_n(f) \stackrel{def}{=} \mathcal{F}[\phi_n(r)] = \int_P \phi_n(r)e^{-i2\pi f \cdot r} dr, n = 1, 2, \ldots, \quad (47)$$

since $F$ maps an orthonormal basis onto an orthonormal basis. Indeed, we have the following, $$T(f_1, f_2) = \langle f_1 | T | f_2 \rangle = \sum_{n \geq 1} \lambda_n \langle f_1 | \phi_n \rangle \langle \phi_n | f_2 \rangle = \sum_{n \geq 1} \lambda_n \psi_n(f_1) \psi_n^*(f_2), \quad (48)$$

and for the resultant intensity distribution, $$I_2(q) = \quad (49)$$

$$\sum_{n \geq 1} \lambda_n |\langle \phi_n | u_q \rangle|^2 = \sum_{n \geq 1} \lambda_n |\langle \mathcal{F}\phi_n | \mathcal{F}u_q \rangle|^2 = \sum_{n \geq 1} \lambda_n |\langle \psi_n | U_q \rangle|^2 =$$

$$\sum_{n \geq 1} \lambda_n \left| \int_F \psi_n^*(f) U_0(f) e^{i2\pi f \cdot q} df \right|^2 = \sum_{n \geq 1} \lambda_n |\mathcal{F}^{-1}[\psi_n^*(f)U_0(f)]|^2,$$

where we have used, $$U_q(f) = \int_P u(r+q)e^{i2\pi f \cdot r} dr = e^{i2\pi f \cdot q} U_0(f). \quad (50)$$

For numerical simulations, $J(f)$ is calculated in the frequency domain according to equation (46), then the mutual intensity $J_1^-(r_1,r_2) = J_1^-(0,r_2-r_1)$ in the spatial domain may be obtained through an inverse FFT. It is also convenient to describe a projection system by its transfer function $K_{12}(f)$ for several reasons: a) the bandlimited system is well characterized by a pupil function within a region bounded by N.A.; b) abberation effects may be readily included in the pupil function; c) wave propagation between two planes perpendicular to the z-axis is simply an $f_z$-dependent phase shift, with the $(f_x,f_y)$ components of spatial frequency conserved so long as the media are uniform in the x and y directions. Then the PSF $K_{12}(0,r)$ may be obtained through an inverse FFT. However, it may not be efficient to calculate the TCC in the frequency domain directly using equation (38), because equation (38) involves 2D numerical integration. It is more efficient to compute $T(r_1,r_2)$ using equation (15). The TCC operator may then be eigen-analyzed to get the eigenvalues $\lambda_1 \geq \lambda_2 \geq \ldots > 0$ and eigenvectors (imaging kernels) $\{\phi_n(r)\}_{n \geq 1}$. When imaging kernels in the frequency domain $\{\psi_n(f)\}_{n \geq 1}$ are needed, they may be readily obtained by applying FFT to $\{\phi_n(r)\}_{n \geq 1}$ as in equation (47). As noted above, one way to compute the resultant intensity distribution $I_2(q)$ is using equation (49) and FFT: firstly computing the mask spectrum $U_0(f)$, then multiplying $U_0(f)$ with the frequency representations of the imaging kernels and performing inverse Fourier transform, finally squaring the amplitudes and summing the squares together.

A Different Approach—Decomposing $J_1^-(r_1,r_2)$ into Coherent Modes

To calculate the resultant intensity at any target point $q=(q_1,q_2) \in P$, it is sufficient to consider $J_1^-(r_1,r_2)$ and $J_1^+(r_1,r_2)$ in a $2a_0 \times 2a_0$ square region, $$A_q \stackrel{def}{=} \{(x,y) \in P : q_1 - a_0 < x < q_1 + a_0, q_2 - a_0 < y < q_2 + a_0\}, \quad (51)$$

where $a_0$ is a predetermined constant, called the "diffraction radius" that characterizes the critical distance between two points on a mask (usually scaled), beyond which the optical proximity effect between the two points may be neglected. The constant $a_0$ has been called by various names besides diffraction radius, including "optical ambit" or simply "ambit", and "halo radius" or simply "halo". In this description, the two terms "diffraction radius" and "optical ambit" are used, and in a synonymous and interchangeable manner. Because of shift-invariance, it is sufficient to consider $J_1^-(r_1,r_2)$ restricted in the region $A_0 \stackrel{def}{=} A_{q=(0,0)}$, namely, $$J_1^-(r_1,r_2)|_{A_0} = \begin{cases} J_1^-(r_1,r_2) & r_1, r_2 \in A_0, \\ 0, & \text{otherwise,} \end{cases} \quad (52)$$

and using the following to calculate $J_1^+(r_1,r_2)$ with $r_1, r_2 \in A_q$, $$J_1^+(r_1+q, r_2+q) = u_q^*(r_1) J_1^-(r_1,r_2) u_q(r_2), \forall q \in P, \quad (53)$$
$$r_1, r_2 \in A_0.$$

More generally, $J_1^-(r_1,r_2)$ may be multiplied by a smoother window function to yield a smoother version of windowed mutual intensity. In particular, a gradually varying and non-negative (or equivalently, non-positive) window function $W(r)$ may be employed, which traces approximately the envelope of $K_{12}(0,r)$ and satisfies, $$\begin{cases} W(r) > 0, & \forall r \in A_0, \\ W(r) = 0, & \text{otherwise.} \end{cases} \quad (54)$$

For example, $W(r)$ may be a truncated Gaussian function $$W(r) = \begin{cases} \exp(-\beta_1 |r|^2 / a_0^2), & \forall r \in A_0, \\ 0, & \text{otherwise,} \end{cases} \quad (55)$$

or a raised cosine window function represented as, $$W(r) = \begin{cases} 1, & 0 \leq |r| < (1-\beta_2)b_0, \\ \frac{1}{2} + \frac{1}{2}\cos\pi\left[\frac{|r|-(1-\beta_2)b_0}{2\beta_2 b_0}\right], & (1-\beta_2)b_0 \leq |r| < (1+\beta_2)b_0, \\ 0, & |r| \geq (1+\beta_2)b_0, \end{cases} \quad (56)$$

where $a_0$ is the previously mentioned diffraction radius, $b_0 = a_0/(1+\beta_2)$, $\beta_1 > 0$ and $0 \leq \beta_2 \leq 1$ are constant parameters controlling the shape and width of the windows. Another example of $W(r)$ may be a gradually varying function which coincides with the local maximum points of $|K_{12}(0,r)|$ inside $A_0$ and vanishes outside $A_0$. Namely, if $r'_0, r'_1, r'_2, \ldots$ are the locations inside $A_0$ at which $|K_{12}(0,r)|$ reaches local maximum, then $W(r)$ may be a gradually varying function satisfying $W(r'_n)=|K_{12}(0,r'_n)|$ for all $n=0,1,2,\ldots$. In any case, once a window function $W(r)$ is chosen, a mutual intensity restricted by $W(r)$ may be calculated as, $$J_1^-(r_1, r_2)|_W \overset{def}{=} W(-r_1) J_1^-(r_1, r_2) W(-r_2), \tag{57}$$

and a PSF restricted by $W(r)$ may be represented as, $$K_{12}(0, r)|_W \overset{def}{=} \begin{cases} K_{12}(0, r)/W(r), & \forall r \in (1-\beta_3)A_0, \\ 0, & \text{otherwise}, \end{cases} \tag{58}$$

where $\beta_3 \in [0,1)$ is a small number to clip a small portion of $K_{12}(0,r)$ close to the edge of $A_0$, as merely one way to prevent potential amplitude runaway of $K_{12}(0,r)|_W$ around the edge. Equations (57) and (58) may be plugged into equation (15) as well to calculate a TCC restricted by $W(r)$, $$T(r_1, r_2) \approx T(r_1, r_2)|_W \overset{def}{=} \tag{59}$$
$$K_{12}^*(0, -r_1)|_W \ J_1^-(r_1, r_2)|_W \ K_{12}(0, -r_2)|_W.$$

The approximation $T(r_1,r_2) \approx T(r_1,r_2)|_W$ may be justified by the fact that $|K_{12}(0,r)|$ becomes negligibly small outside $A_0$. Note that $J_1^-(r_1,r_2)|_{A_0}$ in equation (52) may be regarded as a special case of $J_1^-(r_1,r_2)|_W$ in equation (57) with a hard-cut window function, $$W(r) \overset{def}{=} \begin{cases} 1, & r \in A_0, \\ 0, & \text{otherwise}. \end{cases} \tag{60}$$

Regarded as a Hilbert-Schmidt kernel, a windowed mutual intensity $J_1^-(r_1,r_2)|_W$ may also be associated to a linear operator $J_1^-:L^2(P) \to L^2(P)$ as in the following, $$\langle r_1 J_1^- | r_2 \rangle = J_1^-(r_1,r_2)|_W, \forall r_1, r_2 \in P. \tag{61}$$

It follows that $J_1^-$ is Hermitian because $J_1^-(r_2,r_1)|_W = [J_1^-(r_1,r_2)|_W]^*$ and positive definite as a result of equation (3). As a consequence, $J_1^-$ has eigenvalues $\mu_1 \geq \mu_2 \geq \ldots > 0$, and corresponding eigenvectors $\epsilon_1(r), \epsilon_2(r), \ldots$, which decomposes the Hilbert-Schmidt kernel $J_1^-(r_1,r_2)|_W$ as, $$J_1^-(r_1, r_2)|_W = \sum_{n \geq 1} \mu_n \xi_n(r_1) \xi_n^*(r_2), \forall r_1, r_2 \in P. \tag{62}$$

Such Mercer's expansion for $J_1^-(r_1,r_2)|_W$ is called the coherent-mode representation of the partially coherent illumination field, where different modes are statistically independent (i.e., incoherent), while the spatial amplitude distribution is perfectly coherent within each mode. Furthermore, any linear (possibly lossy) propagation of the illumination field may still be represented by an incoherent combination of the coherent modes linearly propagated. As far as the second-order coherence theory is concerned, the partially coherent illumination field is physically indistinguishable from a group of lasers each oscillating with one of the coherent modes, and with the relative phase (as a time series) between any two lasers uniformed distributed in $[0,2\pi)$. The coherent-mode representation of $J_1^-(r_1,r_2)|_W$ may be plugged into equation (59) to decompose the TCC, $$T(r_1, r_2) \approx T(r_1, r_2)|_W = \sum_{n \geq 1} \mu_n \varphi_n(r_1) \varphi_n^*(r_2), \forall r_1, r_2 \in P, \tag{63}$$

$$\varphi_n(r) \overset{def}{=} [K_{12}(0, -r)|_W]^* \xi_n(r), \forall n \geq 1, \forall r \in P. \tag{64}$$

Even though $\{\psi_x(r)\}_{n \geq 1}$ may no longer be mutually orthogonal, nor they may be eigenvectors of the TCC operator T with $\{\mu_n\}_{n \geq 1}$ as eigenvalues, the kernel decomposition of equation (63) could nonetheless be applied to equation (14) to yield, $$I_2(q) = \sum_{n \geq 1} \mu_n \langle u_q \| \varphi_n \rangle \langle \varphi_n \| u_q \rangle = \sum_{n \geq 1} \mu_n |\langle \varphi_n \| u_q \rangle|^2, \forall q \in P, \tag{65}$$

which is also in the form of ISOCS that decomposes the partially coherent imaging system, and may be used similarly to speedup the calculation of resultant intensities with $\{\psi_n(r)\}_{n \geq 1}$ pre-computed. The functions $\{\psi_n(r)\}_{n \geq 1}$ may be regarded as another complete set of imaging kernels of the partially coherent imaging system. The separation between the illumination field in terms of coherent modes and the PSF of the projection system (including the projection lenses, the immersion medium, and the film stack on wafer) as in equation (64) offers a great advantage when dealing with system variations. Variations of the projection system, such as abberations, defocus, and calculating resultant intensity at different depths in the resist, may be readily represented by a varying PSF $K_{12}(0,r)$. Changes in the illumination source may be conveniently captured by modifying the mutual intensity $J_1^-(r_1,r_2)|_W$ and the associated coherent modes. No matter what system variations, either the PSF $K_{12}(0,r)$ or the coherent modes $\{\psi_n(r)\}_{n \geq 1}$ and weights $\{\mu_n\}_{n \geq 1}$ may be modified correspondingly, and a new set of imaging kernels may be readily synthesized according to equation (64).

Similarly to the formulation of (28-33) using convolutions strictly in the conventional sense, one may start with the equation, $$I_2(q) = \int_P \int_P u^*(r_1) T_-(q-r_1, q-r_2)|_W u(r_2) dr_1 dr_2, \tag{66}$$

with $T_-(r_1,r_2)|_W$ being represented as, $$T_-(r_1, r_2)|_W \overset{def}{=} \tag{67}$$
$$T(-r_1, -r_2)|_W = K_{12}^*(0, r_1)|_W J_1^-(r_2, r_1)|_W K_{12}(0, r_2)|_W.$$

Using equation (62) and defining, $$\Phi_n(r) = K_{12}(0,r)|_W \epsilon_n(r), \forall n \geq 1, \forall r \in P, \tag{68}$$

one may expand $T_-(r_1,r_2)|_W$ as, $$T_-(r_1, r_2)|_W = \sum_{n \geq 1} \mu_n \Phi_n^*(r_1) \Phi_n(r_2), \tag{69}$$

which may be plugged into equation (66) to yield, $$I_2(q) = \sum_{n \geq 1} \mu_n \int_P \int_P u^*(r_1) \Phi_n^*(q-r_1) \Phi_n(q-r_2) u(r_2) dr_1 dr_2 = \tag{70}$$
$$\sum_{n \geq 1} \mu_n |u(q) \star \Phi_n(q)|^2,$$

which is again in terms of convolutions in the conventional sense, although the $\{\phi_n\}_{n\geq 1}$ functions as represented in equation (68) are obtained from coherent modes, thus are in general different from those as represented in equation (30), which are obtained through Mercer-expanding the TCC.

Further Generalizations

In the above we have generalized the traditional method of ISOCS for partially coherent imaging systems by relaxing the condition of imaging kernels being orthogonal, or being eigenvectors of a Hermitian operator. In particular, we propose to use a set of generalized imaging kernels that are separable in terms of coherent modes of the illumination field and the PSF of the projection system. Being eigenvectors of the mutual intensity operator $J_1^-$, the coherent modes are orthogonal in general. A further generalization may be to relax the condition of all coherent modes being eigenvectors of the same Hermitian operator, rather to use a hybrid decomposition of an illumination field into multiple groups of coherent modes, where coherent modes of different groups are not associated to the same Hermitian operator, although within each group the coherent modes may be eigenvectors of the same Hermitian operator. This may be done by firstly dividing an illumination source into multiple non-overlapping radiating regions (RRs), then representing the illumination field of each RR by statistically independent coherent modes. For example, a dipole or quadrupole illumination source consist of multiple isolated poles of source areas, which are naturally non-overlapping RRs. Furthermore, each pole of source area may be divided into smaller non-overlapping RRs. Let the RRs of an illumination source be denoted by $RR(l) \subset S_0$, $l \in [1,L]$, which satisfy $RR(l) \cap RR(m) = \emptyset$, $\forall l \in [1,L]$, $\forall m \in [1,L]$, $l \neq m$. Naturally, the RRs are mutually incoherent, so the total mutual intensity $J_1^-(r_1, r_2)$ is the sum of contributions of individual RRs, namely, $$J_1^-(r_1, r_2) = \sum_{l=1}^{L} J_1^-(l; r_1, r_2), \quad (71)$$

where for each $l \in [1,L]$, $$J_1^-(l; r_1, r_2) \stackrel{def}{=} \int_{RR(l)} K_{01}^*(s, r_1) K_{01}(s, r_2) I_0(s) ds, \quad (72)$$

which is the contribution of the lth RR to the mutual intensity. It is evident that a windowed version of each $J_1^-(l;r_1,r_2)$, $l \in [1,L]$, represented as, $$J_1^-(l; r_1, r_2)|_w \stackrel{def}{=} W(-r_1) J_1^-(l; r_1, r_2) W(-r_2), \forall l \in [1, L], \quad (73)$$

may be viewed as the Hilbert-Schmidt kernel of a Hermitian and positive definite linear operator, thus may be Mercer-expanded as, $$J_1^-(l; r_1, r_2)|_w = \sum_{n\geq 1} \mu_{ln} \xi_{ln}(r_1) \xi_{ln}^*(r_2), \forall l \in [1, L], \quad (74)$$

where for each $l \in [1,L]$, $\mu_{l1} \geq \mu_{l2} \geq \ldots > 0$ and $\{\epsilon_{ln}\}_{n\geq 1}$ are the eigenvalues and eigenvectors respectively of the linear operator corresponding to $J_1^-(l;r_1,r_2)|_w$, which is in turn associated with the lth RR. Now the hybrid decomposition of mutual intensity in equations (71) and (74) may be plugged into equation (59) as well to decompose the TCC, $$T(r_1, r_2) \approx T(r_1, r_2)|_w = \sum_{l\geq 1}\sum_{n\geq 1} \mu_{ln} \varphi_{ln}(r_1) \varphi_{ln}^*(r_2), \forall r_1, r_2 \in P, \quad (75)$$

$$\varphi_{ln}(r) \stackrel{def}{=} [K_{12}(0, -r)|_w]^* \xi_{ln}(r), \forall l \geq 1, \forall n \geq 1, \forall r \in P. \quad (76)$$

Again, the imaging kernels $\{\psi_{ln}(r)\}_{l\geq 1, n\geq 1}$ are not mutually orthogonal in general, but may be pre-computed and used just as well to speed up the resultant intensity calculation, $$I_2(q) = \quad (77)$$
$$\sum_{l\geq 1}\sum_{n\geq 1} \mu_{ln} \langle u_q \| \varphi_{ln} \rangle \langle \varphi_{ln} \| u_q \rangle = \sum_{l\geq 1}\sum_{n\geq 1} \mu_{ln} |\langle \varphi_{ln} \| u_q \rangle|^2, \forall q \in P.$$

To simplify notations, the imaging kernels $\{\psi_{ln}(r)\}_{l\geq 1, n\geq 1}$ and their strengths $\{\mu_{ln}\}_{l\geq 1, n\geq 1}$ may be properly ordered and indexed by a single integer, for example using $n=1,2,\ldots$. Then equations (75) and (77) would be formally identical to (63) and (65) respectively, although the imaging kernels may be obtained differently.

There may be several advantages to use a hybrid decomposition of an illumination field. One advantage is that geometrically congruent but differently positioned RRs may be represented by coherent modes based on the same set of eigenvectors with simple phase shifts and/or coordinate rotations. For instance, the mutual intensity $J_1^-(l;r_1,r_2)$ of a typical RR from a translationally congruent family of RRs may be represented by coherent modes of the following form, $$J_1^-(l; r_1, r_2) = \sum_{n\geq 1} \mu_n [\xi_n(r_1) e^{-i2\pi f_l \cdot r_1}][\xi_n(r_2) e^{-i2\pi f_l \cdot r_2}]^*, \quad (78)$$

where $f_l$ is a constant spatial frequency corresponding to the center position of the individual RR, while the eigenvalues $\{\mu_n\}_{n\geq 1}$ and the base eigenvectors $\{\epsilon_n(r)\}_{n\geq 1}$ remain the same for all RRs in the same congruent family. Examples of geometrically congruent RRs are the poles of an ideal dipole or quadrupole illumination source, or divided regions of an annular illumination source with equal angular spans. For simulations going beyond the thin-mask approximation and considering the topographic effects of thick masks, it may be necessary to treat the mask transmittance function as dependent upon the incidence angle of an illuminating beam. So another advantage of using a hybrid decomposition of an illumination field is that, when the spatial extent of an RR is sufficiently small, all beams radiated by the RR have approximately the same spatial frequency, such that all coherent modes associated to the RR may share the same mask transmittance function, although different RRs may have to use different mask transmittance functions due to the topographic effects of the physical mask. On the other hand, it may be desired to have each RR covering as much source area as possible to reduce the total number of coherent modes. A further advantage of using a hybrid decomposition of an illumination field is that, variations in the illumination system, such as intensity/position variations of multiple emitters, are readily incorporated into the coherent modes and resulted model kernels. A positioning shift of an RR merely induces point-wise multiplication of a phase-shift factor onto the coherent modes associated with the RR, as shown in equation (78). Since the model kernels are generated through point-wise multiplication of coherent modes and a PSF, the effect of the positioning shift of the RR is just point-wise multiplication of a phase-shift factor onto the associated model kernels. An intensity variation of each individual RR is simply a homogeneous scaling of the eigenvalues in equation (74) corresponding to the coherent modes, and consequently the strengths of the model kernels associated with the corresponding RR. It is noted, however, that the methods of dividing an illumination source into multiple non-overlapping RRs and decomposing a total mutual intensity $J_1^-(r_1,r_2)$ into a sum of contributions of individual RRs as in equation (71), and the consequent advantages mentioned above, are not limited to the generation of model kernels using coherent modes, nor to the use of such model kernels. Indeed, instead of Mercer-expanding the contributory mutual intensities due to individual RRs, we may construct contributory TCCs associated with individual RRs by, for example, point-wise multiplying a PSF to the right and the complex conjugate of the same PSF to the left of each of the contributory mutual intensities. Each contributory TCC may then be Mercer-expanded into imaging kernels, with weights of the imaging kernels proportional to the intensity of the RR with which the contributory TCC is associated. A translational displacement of an RR also translates into a simple multiplication of a phase-shift factor to the associated imaging kernels.

Yet another generalization is to decompose the PSF of projection into a coherent linear superposition, so that model kernels resulted from multiplication of the PSF and coherent modes may be divided into groups, where each group consists of partial kernels that are mutually coherent but different groups are incoherent. By the same token, any coherent mode of a illumination field may be decomposed into a coherent linear superposition and consequently yields a group of partial kernels. A partial kernel is not an imaging kernel by itself, but a coherent linear superposition of all partial kernels within a group becomes an imaging kernel. The important thing is that the mixed imaging and partial kernels are still amenable to the methods of fast image calculation by pre-computing the model kernels and reducing the computational task into convolving the model kernels with a mask transmittance function. The only difference is that the resultant amplitudes contributed by partial kernels need to be summed coherently before squared. To be specific, consider a PSF $K_{12}(0,r)$ being linearly decomposed as, $$K_{12}(0, r) = \sum_{k \geq 1} a_k K_{12}(k; 0, r), \quad (79)$$

where $\{a_k\}_{k \geq 1}$ are complex coefficients. Such linear decomposition of PSF and a coherent-mode representation of $J_1^-(r_1, r_2)|_W$ in the form of equation (62) would decompose the TCC of equation (59) into a mixture of imaging (when k=1) or partial (when k>1) kernels, $$T(r_1, r_2) \approx T(r_1, r_2)|w = \sum_{n \geq 1} \mu_n \left[\sum_{k \geq 1} \varphi_{nk}(r_1)\right]\left[\sum_{k \geq 1} \varphi_{nk}(r_1)\right]^*, \quad (80)$$

$$\forall r_1, r_2 \in P,$$

with the imaging or partial kernels being represented as, $$\varphi_{nk}(r) \stackrel{def}{=} [a_k K_{12}(k; 0, -r)|_W]^* \xi_n(r), \forall n \geq 1, \forall k \geq 1, \forall r \in P. \quad (81)$$

Consequently, the formula for image calculation would be, $$I_2(q) = \sum_{n \geq 1} \mu_n \left|\sum_{k \geq 1} \langle \varphi_{nk} || u_q \rangle\right|^2. \quad (82)$$

Model kernel refers herein to either an imaging kernel or a partial kernel. In terms of algorithm implementations, a computer program would need to compute the amplitude distributions of a resultant image by convolving the model kernels with a mask transmittance function, then combine the amplitudes for each group of partial kernels (if any), finally square the total amplitude of each group and add up the squares to get the total resultant intensity. As going to be discussed in details below, one application of coherently decomposing a PSF is a semi-analytical treatment of defocus effects of a high-N.A. imaging system using groups of partial kernels, each of which is written in the form of a sinusoidal defocus factor multiplying a function that changes only slowly along the defocus direction.

Our approaches differ from a conventional method of eigen-analyzing the TCC in that they separate the partially coherent illumination from the optical projection, such that the resulted model kernels are not orthogonal in general, nor being eigenvectors of the TCC. On the other hand, our approaches are also different from another traditional method using Abbe's formulation, that divides the source into non-overlapping pixels which are naturally incoherent, where each pixel is sufficiently small to be treated as a single coherent point source. Our approaches decompose the whole illumination source or each of many RRs into spatially overlapping and statistically independent (i.e. incoherent) coherent modes, each of which is spatially extensive and completely coherent. We have further proposed to decompose the PSF into a coherent linear superposition, so that the resulted model kernels may be divided into groups, where each group consists of partial kernels due to the same coherent mode, hence are mutually coherent, while different groups are incoherent as being associated with different coherent modes. Even in the extreme that each RR consists of a single light pixel which may be regarded as a coherent point source, our method of coherently decomposing the PSF would still give a novel approach that uses groups of model kernels, where each group consists of coherent partial kernels but different groups are incoherent.

3D Intensity Distribution and Defocus

Figure 19:
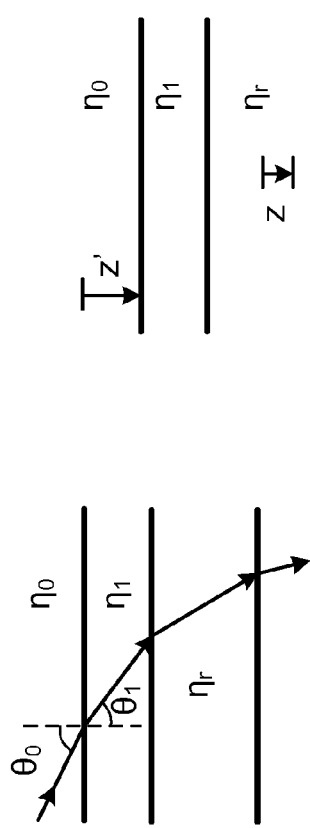
FIG. 19 illustrates film stacks associated with a photolithographic processing system.

On the surface of a semiconductor wafer, we are concerned with light propagation through a stack of thin films, including a layer of photoresist, antireflection coatings, and the semi-conductor substrate. We may have to consider the reflections and refractions at the interfaces between media with different refractive indices. All interfaces are assumed perpendicular to the z-axis, as shown in FIG. 19. There are two reasons that make it necessary to go beyond the theory of a single 2D resultant intensity distribution $I_2(q)$, and to consider the 3D distribution of resultant intensity, especially when the resultant intensity in question is the optical intensity in the photo-resist layer. Firstly, the exposure of the photoresist film takes place in a volume of resist material with a depth comparable to the size of the optical wavelength. Information of 3D optical intensity is needed for an ab initio model of resist development. Secondly, system variations along the z-axis needs to be characterized in order to model the behavior of a stepper machine under defocus conditions. There are two kinds of z-dependence, as shown in FIG. 19. One is the relative displacement z' of the whole film stack with respect to the plane of best focus, the so-called defocus (distance). The other is the relative position z in the resist layer, with respect to, for example, the mid-plane of the resist layer. It is necessary to describe the z-dependence of the optical intensity distribution for an ab initio 3D model of resist exposure and development. It is further needed to characterize the variation of the 3D intensity distribution versus the defocus z'. In a sense, z' and z are two independent variables because of the different refractive indices $\eta_0$ and $\eta_r$ in the immersion medium and the resist film respectively. So we need to study a function $I_2(q;z,z')$, which describes the variation of optical intensity in a four-dimensional (4D) space, and necessarily a 4D PSF $K_{12}(0,r;z,z')$, which characterizes the z- and z'-dependent impulse response of the projection system, or equivalently a 4D transfer function $K_{12}(f;z,z') \overset{def}{=} F[K_{12}(0,r;z,z')]$. In the frequency domain, the effects of z and z' are to induce $f^2$-dependent phase-shift factors to the transfer function, namely, $$K_{12}(f;z,z') = e^{i2\pi(\eta_r^2 - f^2)^{1/2}z} e^{i2\pi(\eta_0^2 - f^2)^{1/2}z'} K_{12}(f;0,0), \quad (83)$$

where $K_{12}(f;0,0)$ is the transfer function at $z=z'=0$. For an ideal projection system free of abberations, the transfer function at best focus is just a low-pass pupil function $P(f)$, which is $P(f) = 1_{|f| \leq N.A.}$ for the usual case of a circular pupil with radius N.A. Aberration effects may be included by multiplying an aberration function $A(f)$ to the pupil function, such that $K_{12}(f;0,0) = P(f)A(f)$. Furthermore, the index difference between the film stack and the immersion medium induces another term of aberration, $$B(f) = \exp\left[-i2\pi(\eta_0^2 - f^2)^{1/2}d + i2\pi\sum_{k=1}^{r}(\eta_k^2 - f^2)^{1/2}t_k\right], \quad (84)$$

where d is the remaining distance measured from the top surface of the film stack, that the imaging beams would have to further travel in the immersion medium in order to reach the plane of best focus, $\{t_k\}_{k=1}^{r}$ are the thicknesses of film layers in the stack until reaching the plane of best focus in the resist, $\{\eta_l\}_{k=1}^{r}$ are the refractive indices of the film layers. $B(f)$ may be called the film-stack aberration. Expanded in Taylor series of $f^2$, the film-stack aberration may be written as, $$B(f) = \exp\left[-i2\pi\eta_0 d + i2\pi\sum_{k=1}^{r}\eta_k t_k + i\pi f^2 \frac{d}{\eta_0} - i\pi f^2 \sum_{k=1}^{r}\frac{t_k}{\eta_k} + H.O\right], \quad (85)$$

where H.O. denotes higher-order terms in $f^2$. The constant phase terms do not induce aberration. So the plane of best focus in the resist happens where the following is satisfied, $$\sum_{k=1}^{r}\frac{t_k}{\eta_k} = \frac{d}{\eta_0}. \quad (86)$$

However, the H.O. terms are not compensated in general, unless the stack of films are carefully designed to do so, or the aberration function $A(f)$ of the projection lenses is intentionally adjusted to compensate the H.O. effects of $B(f)$. In designing a multi-layer film stack, one may use more layers of different materials and adjust their thicknesses to satisfy more conditions besides equation (86) for compensation of $B(f)$ up to higher-order terms in $f^2$. For example, if the following, $$\sum_{k=1}^{r}\frac{t_k}{\eta_k^3} = \frac{d}{\eta_0^3}, \quad (87)$$

is also fulfilled by the film stack in addition to equation (86), then the aberration terms proportional to $f^4$ are also compensated. It is conceivable that more film layers could potentially satisfy more conditions to better compensate the H.O. aberrations. However, this is possible only when there is at least one layer with a refractive index lower than $\eta_0$ and at least another layer with an index higher than $\eta_0$. A film stack may also be inserted at other positions, for instance, after the mask but before the first projection lens, to compensate the aberrations. In general, given the number of film layers and the associated indices, the thicknesses of the films may be optimized such that a measure of overall phase error (aberration) is minimized. An example measure of overall phase error may be, $$\int_0^{N.A.^2}\left[-(\eta_0^2 - f^2)^{1/2}d + \sum_{k=1}^{r}(\eta_k^2 - f^2)^{1/2}t_k + \eta_0 d - \sum_{k=1}^{r}n_k t_k\right]^2 w(f^2)df^2, \quad (88)$$

where $\omega(f^2)$ is a weight function satisfying $\omega(f^2) \geq 0$ and $\int_0^{N.A.^2}\omega(f^2)df^2 = 1$.

With $z=z'=0$, the transfer function of a projection system is given by, $$K_{12}(f;0,0) = P(f)A(f)B(f), \quad (89)$$

which may be plugged into equation (83) to get the transfer function at arbitrary z and z', $$K_{12}(f;z,z') = e^{i2\pi(\eta_r^2 - f^2)^{1/2}z} e^{i2\pi(\eta_0^2 - f^2)^{1/2}z'} P(f)A(f)B(f), \quad (90)$$

whose inverse Fourier transform gives the z- and z'-dependent PSF, $$K_{12}(0,r;z,z') \overset{def}{=} \mathcal{F}^{-1}[K_{12}(f;z,z')] = \int_F K_{12}(f;z,z')e^{i2\pi f \cdot r}dr. \quad (91)$$

Consequently, the TCC becomes z- and z'-dependent, and may be calculated as, $$T(r_1, r_2; z, z') \overset{def}{=} K_{12}^*(0, -r_1; z, z')J(r_1, r_2)K_{12}(0, -r_2; z, z'), \quad (92)$$

or a restricted version by the window function $W(r)$, $$T(r_1, r_2; z, z') \approx T(r_1, r_2; z, z')|_W \quad (93)$$
$$\overset{def}{=} K_{12}^*(0, -r_1; z, z')|_W J(r_1, r_2)|_W K_{12}(0, -r_2; z, z')|_W.$$

At different depth z in the resist film, the phase factor $\exp[i2\pi(\eta_r^2 - f^2)^{1/2}z]$ leads to phase-walk-off (i.e., defocus) of imaging waves with values of $|f|$ ranging from 0 to a large N.A., which may induce non-negligible variations of the latent image at different depth of the resist film. And the phase factor $\exp[i2\pi(\eta_0^2 - f^2)^{1/2}z']$ results in defocus of the image in resist when the distance between the film stack and the last projection lens deviates by z' from the best focus. In a high-N.A. imaging system, the image changes rapidly and varies a great deal as z' ranging from 0 to positive and negative defocuses on the order of $\lambda$, the wavelength of the illumination light. Traditional softwares for full-chip photolithography simulations compute only a single 2D aerial image for each defocus value with the z-dimension neglected, build multiple TCCs for discrete levels of defocus and eigen-analyze the TCCs to get several sets of imaging kernels, with each set being called a defocus model. However, multiple defocus models do not support continuous sampling, or discrete sampling that is sufficiently fine to approximate continuous sampling, of the defocus axis. Moreover, multiple defocus models require significantly more effort to calibrate, and may induce higher computational complexity to applications using them.

A physical quantity being dependent on both spatial (often planar) coordinate(s) and values of process variations and/or a depth into a photosensitive medium may be represented mathematically by a sum of multiple terms, with each term being a product of one function of spatial coordinate(s) that does not depend on the values of process variations and/or depth into the photosensitive medium and another function that depends on the values of process variations and/or depth into the photosensitive medium. Such mathematical form representing the physical quantity is called a space-variation separated (SVS) series expansion. In an SVS series expansion, the functions of spatial coordinate(s) may be called basis spatial functions, and the functions that depend on the values of process variations and/or depth into the photosensitive medium may be called expansion coefficients. In this description, we will make repeated use of SVS series expansion to represent a PSF, a TCC, model kernels, amplitudes or intensity distributions of a resultant image, under the effect of process variations and/or at different depths into the photosensitive medium.

An immediate example is to write the PSF represented by equations (90) and (91) into an SVS series expansion. One way of doing that is analytical deduction: expanding the phase factor $e^{i2\pi(\eta_r^2-f^2)^{1/2}z}$ and $e^{i2\pi(\eta_0^2-f^2)^{1/2}z'}$ into Taylor, Fourier, or another form of series about z and z', then substituting the series into equations (90) and (91) to obtain an SVS series expansion for the PSF. For instance, $$k_{12}(0, r; z, z') = F^{-1}\left[e^{i2\pi(\eta_r^2-f^2)^{1/2}z} e^{i2\pi(\eta_0^2-f^2)^{1/2}z'} P(f)A(f)B(f)\right] = \quad (94)$$

$$F^{-1}\left\{\sum_{l\geq 0}\sum_{l'\geq 0} \frac{1}{l!}\frac{1}{l'!}\left[i2\pi(\eta_r^2-f^2)^{1/2}z\right]^l \left[i2\pi(\eta_0^2-f^2)^{1/2}z'\right]^{l'} P(f)A(f)B(f)\right\} = \sum_{l\geq 0}\sum_{l'\geq 0} z^l z'^{l'} K_{12}^{(ll')}(0, r),$$

where ∈l,l'≧0, the basis spatial functions, $$K_{12}^{(ll')}(0, r) \stackrel{def}{=} \quad (95)$$

$$F^{-1}\left\{\frac{1}{l!}\frac{1}{l'!}\left[i2\pi(\eta_r^2-f^2)^{1/2}z\right]^l \left[i2\pi(\eta_0^2-f^2)^{1/2}z'\right]^{l'} P(f)A(f)B(f)\right\},$$

are functions of the planar spatial coordinate r, and independent of the defocus distance and depth into the resist film, whereas the expansion coefficients $z^l z'^{l'}$ in equation (94) depend on the defocus distance and depth into the resist film. In practice, the series expansion may be truncated to a finite number of terms just enough to reach desired accuracy. Another way of obtaining an SVS series expansion for a physical quantity is through data fitting: starting from a formal SVS series expansion with predetermined expansion coefficients dependent upon values of process variations and/or depth into a photosensitive medium and basis spatial functions of spatial coordinate(s) to be determined, numerically evaluating the physical quantity at multiple values of process variations and/or depth into the photosensitive medium, then determining the basis spatial functions by data fitting. For instance, the basis spatial functions in a formal SVS series expansion, $$K_{12}(0,r;z,z') = K_{12}^{(0)}(0,r;z) + z'K_{12}^{(1)}(0,r;z) + z'^2 K_{12}^{(2)}(0,r;z), \quad (96)$$

may be fixed by numerically calculating $K_{12}(0,r;z,z')$ at three or more values of z'. Here, for mathematical clarity, the depth into the resist film z is incorporated into the basis spatial functions for the time being, so that the expansion coefficients depend on the defocus distance z'. Assuming that $K_{12}(0,r;z,z')$ is evaluated numerically at z'=−h,0,+h such that $K_{12}(0,r;z,-h)$, $K_{12}(0,r;z,0)$, and $K_{12}(0,r;z,h)$ are available as arrays of numerical data, then the following equations, $$K_{12}(0,r;z,-h) = K_{12}^{(0)}(0,r;z) - hK_{12}^{(1)}(0,r;z) + h^2 K_{12}^{(2)}(0,r;z), \quad (97)$$

$$K_{12}(0,r;z,0) = K_{12}^{(0)}(0,r;z), \quad (98)$$

$$K_{12}(0,r;z,h) = K_{12}^{(0)}(0,r;z) + hK_{12}^{(1)}(0,r;z) + h^2 K_{12}^{(2)}(0,r;z), \quad (99)$$

may be solved for the basis spatial functions, $$K_{12}^{(0)}(0,r;z) = K_{12}(0,r;z,0), \quad (100)$$

$$K_{12}^{(1)}(0,r;z) = [K_{12}(0,r;z,h) - K_{12}(0,r;z,-h)]/(2h), \quad (101)$$

$$K_{12}^{(2)}(0,r;z) = [K_{12}(0,r;z,h) + K_{12}(0,r;z,-h) - 2K_{12}(0,r;z,0)]/(2h^2). \quad (102)$$

If it is further desired to separate z from the basis spatial functions and instead to incorporate it into expansion coefficients of a truncated SVS series expansion such as the following, $$K_{12}(0, r; z, z') = K_{12}^{(00)}(0, r) + zK_{12}^{(10)}(0, r) + z'K_{12}^{(01)}(0, r) + z^2 K_{12}^{(20)}(0, r) + zz'K_{12}^{(11)}(0, r) + z'^2 K_{12}^{(02)}(0, r), \quad (103)$$

then six pieces of numerical data at different values of z and z' may be used to determine the basis spatial functions similarly by solving a system of linear equations. When the number of pieces of numerical data is different from the number of unknown basis spatial functions, standard procedures of data fitting, such as the method of least squares, may be employed to find a set of basis spatial functions that optimally fit the numerical data.

Based on an SVS series expansion for the PSF like the one in equation (94), a set of partial kernels dependent on the values of process variations and/or depth into the resist film may be derived, each of which is also represented by an SVS series expansion. To that end, one may firstly represent the mutual intensity $J_1(r_1,r_2)|_W$ by Mercer's expansion or a hybrid decomposition (as in equations (71) and (74)) in the mathematical form of equation (62). Then one may plug equation (94) into equation (64) to get, $$\varphi_n(r; z, z') \stackrel{def}{=} [K_{12}(0, -r; z, z')|_W]^* \xi_n(r) = \sum_{l\geq 0}\sum_{l'\geq 0} z^l z'^{l'} \varphi_{nll'}(r), \quad (104)$$

$$\forall n \geq 1,$$

which is also in a form of SVS series expansion, with basis spatial functions represented as, $$\varphi_{nll'}(r) \stackrel{def}{=} \left[ K_{12}^{(ll')}(0, -r) \mid w \right]^* \xi_n(r), \forall n \geq 1, \forall l, l' \geq 0. \quad (105)$$

Then the TCC of equation (93) may be written as, $$T(r_1, r_2; z, z') \approx T(r_1, r_2; z, z')|_w \quad (106)$$

$$= \sum_{n \geq 1} \mu_n \varphi_n(r_1; z, z') \varphi_n^*(r_2; z, z')$$

$$= \sum_{n \geq 1} \mu_n \left[ \sum_{l \geq 0} \sum_{l' \geq 0} z^l z'^{l'} \varphi_{nll'}(r_1) \right]$$

$$\left[ \sum_{l \geq 0} \sum_{l' \geq 0} z^l z'^{l'} \varphi_{nll'}(r_2) \right]^*.$$

Naturally, the resultant intensity distribution of equation (65) is also dependent on the values of process variations and/or depth into the resist film and may be written as, $$I_2(q; z, z') = \quad (107)$$

$$\sum_{n \geq 1} \mu_n |\langle \varphi_n(r; z, z') | u_q(r) \rangle|^2 = \sum_{n \geq 1} \mu_n \left| \sum_{l \geq 0} \sum_{l' \geq 0} z^l z'^{l'} \langle \varphi_{nll'} \| u_q \rangle \right|^2,$$

$\forall q \in P$, $\forall z, z' \in R$. For each $n \geq 1$, one may write, $$F_n(q; z, z') \stackrel{def}{=} \sum_{l \geq 0} \sum_{l' \geq 0} z^l z'^{l'} \langle \varphi_{nll'} \| u_q \rangle, \quad (108)$$

as the amplitude distribution due to the nth coherent mode of the illumination field. The above equation is obviously an SVS series expansion for the amplitude distribution $F_n(q;z, z')$, $\forall n \geq 1$, with $\langle \psi_{nll'} \| u_q \rangle$ as basis spatial functions and $z^l z'^{l'}$ as expansion coefficients. In a practical computer program simulating an image of a mask on a target, the partial kernels $\psi_{nll'}(r)$, $n \geq 1$, $l,l' \geq 0$ may be pre-computed, and each may be convolved with the mask transmittance function $u(r)$ once to yield a basis spatial function of the form $\langle \psi_{nll'} \| u_q \rangle$, then the amplitude distributions $F_n(q;z,z')$, $n \geq 1$ at arbitrary values of z and z' within certain ranges may be readily calculated by summing up the SVS series of equation (108). Finally, totaling the amplitude distributions squared gives intensity distributions of the resultant image of mask at various values of z and z', based on which, desired photolithographic data, such as predicted contours of wafer patterns and pattern errors, may be extracted based on ab initio or lumped parameter models of resist development and chemical etching. Since 3D resultant intensity distribution in the resist film is accurately calculated based on first-principles, if further the models of resist development and chemical etching are ab initio or otherwise good in capturing the essential mechanisms underlying the chemical processes, then the overall photolithographic simulations may be ab initio in nature, accurate and providing excellent predictions over a wide range of process variations.

The use of SVS series expansion not only enables sampling over the space of process variations with at least two parameters (defocus and intensity/position variations of multiple emitters, among others) continuously tunable, but also reduces significantly the computational complexity in photolithographic simulations when sampling process variations, because no additional convolutions involving the mask transmittance function are required in subsequent simulations for more sampling points of process variations, after the convolutions being done once for the first sampling point of process variations. Such saving of computational complexity is especially apparent when the same or similar computational task is repeated under process variations, that is, the computational task is repeated with the same or similar specifications including but not limited to input data and desired output data, except for changing the values of a set of process variations. Let $T_0$ denote the complexity (total computation time) of convolutions obtaining basis spatial functions such as $\langle \psi_{nll'} \| u_q \rangle$, $n \geq 1$, $l,l' \geq 0$, and $\Delta T$ denote the extra complexity for summing up an SVS series such as that of equation (108), then calculating the resultant intensity distribution of the mask image at an arbitrary sampling point of process variations, and finally extracting the desired photolithographic data. It is usually the case that $\Delta T$ is far less than $T_0$, denoted as $\Delta T \ll T_0$, because convolving a mask transmittance function with model kernels is the dominate source of complexity. Using a method of SVS series expansion, the total complexity for simulating one sampling point of process variations is $T_{SVS} = T_0 + \Delta T$, whereas the cost for simulating a large number N sampling points of process variations would be $T_{SVS}(N)$ as in the following, $$T_{SVS}(N) = T_{SVS}(1) + \Delta T \times (N-1) \ll T_{SVS}(1) \times N. \quad (109)$$

It may be the case that $T_{SVS}(1) \geq T(1)$, where $T(1)$ as in equation (1) is the cost of simulating one sampling point of process variations with an existing software approach, because the method of SVS series expansion may use more model kernels than the existing software approach. However, as N gets larger, the advantage of using SVS series expansion should become apparent due to the superior scalability as manifested by equation (109). Furthermore, many applications using photolithographic simulations intend to locate lithographic defects where the resulted patterns on wafer deviate much from the desired due to an imperfect design of mask layout or a non-optimized photolithographic process, and that try to correct such lithographic defects by accordingly modifying the mask layout or optimizing the photolithographic process. In such applications, the target points or target regions that need to have the value of resultant intensity calculated may be irregularly and sparsely distributed. And the number of target points or the total area of target regions may be further reduced in subsequent simulations for more sampling points of process variations, because previous simulations may have limited the set of target points or narrowed the target regions for the search of potential lithographic defects. This translates to more savings of computational complexity in subsequent simulations by using SVS, because not only additional convolutions involving the mask transmittance function are not required, but also the subsequent combination of the convolution results (i.e., summation of SVS series) is needed only for a significantly reduced number of target points. Let Σ be the average number of target points per repetition, and CPP be the lowest cost per point among available methods of convolutions. For a general case where the target points are irregularly and sparsely distributed but the density of target points is not too low, and where the mask layout is reasonably complex so that the average number of primitive mask shapes within a window of optical ambit is not too small, the lowest CPP may be approached by an FFT-based method, which generates convolution results virtually for the entire set of target points regularly and sufficiently densely distributed according to a Nyquist rate of sampling theorem. The initial sampling point of process variations may incur a relatively higher cost, as the total computation time may be $T_{SVS}(1) \approx CCP \times \Sigma$. However, the subsequent sampling points of process variations enjoy much lower computational complexity by using SVS series. If $\Delta t$ is the computation time for combining convolution results to get the resultant intensity at a single target point, $\Delta t \ll CPP$, then the total computation time $T_{SVS}(N)$ for simulating $N \geq 2$ sampling points of process variations using SVS series is given by, $$T_{SVS}(N) = T_{SVS}(1) + \Delta t \times \Sigma \times (N-1) \ll CPP \times \Sigma \times N, \quad (110)$$

when N is large, where $CPP \times \Sigma \times N$ would roughly be the total computation time taken by a known existing software to simulate N sampling points of process variations. Substantial savings of computational complexity may be achieved by using methods of SVS series expansion according to one or more of the preferred embodiments described herein.

For an example that does coherent linear decomposition for the PSF, one may divide the pupil plane (that is the plane of spatial frequency) into multiple annular regions represented by $f'_{k-1} \leq |f| \leq f'_k$, $1 \leq k \leq k_{max}$, where $0 = f'_0 < f'_1 < \ldots < f'_{k-1} < f'_k < \ldots < f'_{k_{max}} = N.A.$ are the radii of the boundary circles of the annular regions. The first annular region is actually a disc with $|f| \leq f'_1$. The z- and z'-dependent PSF may be written into a coherent superposition as, $$K_{12}(0, r; z, z') = \sum_{k=1}^{k_{max}} K'_{12}(k; 0, r, z, z'), \quad (111)$$

where for each $k \in [1, k_{max}]$, $K'_{12}(k; 0, r; z, z')$ is the contribution of imaging beams with spatial frequencies that fall into the kth annular region, namely, $$K'_{12}(k; 0, r; z, z') \stackrel{def}{=} \int_{f'_{k-1} \leq |f| \leq f'_k} K_{12}(f; z, z') e^{i2\pi f \cdot r} df, \quad (112)$$

$$\forall k \in [1, k_{max}].$$

The defocus phase factor $\exp[i2\pi(\eta_r^2 - f^2)^{1/2} z] \exp[i2\pi(\eta_0^2 - f^2)^{1/2} z']$ is more or less the same for all imaging beams with spatial frequencies that fall into the same annular region, when the annular region is sufficiently narrow. For each $k \in [1, k_{max}]$, if one takes a typical frequency value $f_k \in [f'_{k-1}, f'_k]$, for example $f_k = (f'_{k-1} + f'_k)/2$, and writes $K'_{12}(k; 0, r; z, z')$ as, $$K'_{12}(k; 0, r; z, z') = K_{12}(k; 0, r; z, z') e^{i\theta_k(z, z')}, \quad (113)$$

where, $$\theta_k(z, z') \stackrel{def}{=} 2\pi(\eta_r^2 - f_k^2)^{1/2} z + 2\pi(\eta_0^2 - f_k^2)^{1/2} z', \quad (114)$$

$$K_{12}(k; 0, r; z, z') \stackrel{def}{=} \int_{f'_{k-1} \leq |f| \leq f'_k} K_{12}(f; z, z') e^{-i\theta_k(z, z')} e^{i2\pi f \cdot r} dr, \quad (115)$$

then $K_{12}(k; 0, r; z, z')$ is a slow-varying function of z and z', while $\theta_k(z, z')$ absorbs the fast z- and z'-dependence. The slow variation makes it convenient to expand $K_{12}(k; 0, r; z, z')$ into a Taylor or Fourier series about z and z', and to keep only the first a few terms of the series. For example, a Taylor expansion of $K_{12}(k; 0, r; z, z')$ in z and z' may be, $$K_{12}(k; 0, r; z, z') = \sum_{l \geq 0} \sum_{l' \geq 0} z^l z'^{l'} K_{12}^{(ll')}(k; 0, r), \quad \forall k \in [1, k_{max}]. \quad (116)$$

Equations (111), (113), and (116) may be combined to write the PSF $K_{12}(0, r; z, z')$ into an SVS series expansion, $$K_{12}(0, r; z, z') = \sum_{k=1}^{k_{max}} \sum_{l \geq 0} \sum_{l' \geq 0} e^{i\theta_k(z, z')} z^l z'^{l'} K_{12}^{(ll')}(k; 0, r), \quad (117)$$

which may also be regarded as a special case of equation (79) for a coherent linear decomposition of a z- and z'-dependent PSF. As discussed before, such linear decomposition of PSF and a coherent-mode representation of $J_1^-(r_1, r_2)|_W$ in the form of equation (62) could be combined to decompose the TCC of equation (93) into a mixture of partial kernels, $$T(r_1, r_2; z, z') \approx T(r_1 r_2; z, z')|_w \quad (118)$$

$$= \sum_{n \geq 1} \mu_n \left[ \sum_{k=1}^{k_{max}} \sum_{l \geq 0} \sum_{l' \geq 0} e^{i\theta_k(z, z')} z^l z'^{l'} \varphi_{nkll'}(r_1) \right] \times$$

$$\left[ \sum_{k=1}^{k_{max}} \sum_{l \geq 0} \sum_{l' \geq 0} e^{i\theta_k(z, z')} z^l z'^{l'} \varphi_{nkll'}(r_2) \right]^*$$

$\forall r_1, r_2 \in P$, with the partial kernels being represented as, $$\varphi_{nkll'}(r) \stackrel{def}{=} \left[ K_{12}^{(ll')}(k; 0, -r) \mid w \right]^* \xi_n(r), \quad (119)$$

$$\forall n, k \geq 1, \forall l, l' \geq 0, \forall r \in P.$$

Consequently, the z- and z'-dependent resultant intensity distribution $I_2(q; z, z')$ would be calculated as, $$I_2(q; z, z') = \sum_{n \geq 1} u_n \left| \sum_{k=1}^{k_{max}} \sum_{l \geq 0} \sum_{l' \geq 0} e^{i\theta_k(z, z')} z^l z'^{l'} \langle \varphi_{nkll'} \| u_q \rangle \right|^2. \quad (120)$$

Again, $\forall n \geq 1$, one may write, $$F_n(q; z, z') \stackrel{def}{=} \sum_{k=1}^{k_{max}} \sum_{l \geq 0} \sum_{l' \geq 0} e^{i\theta_k(z, z')} z^l z'^{l'} \langle \varphi_{nkll'} \| u_q \rangle, \quad (121)$$

as the amplitude distribution due to the nth coherent mode of the illumination field, which is obviously represented by an SVS series expansion with $\langle \psi_{nkll'} \| u_q \rangle$ as basis spatial functions and $e^{i\theta_k(z, z')} z^l z'^{l'}$ as expansion coefficients, $k \geq 1$, $l \geq 0$, $l' \geq 0$.

Alternatively, one may divide the pupil plane into rectangular regions of the form $$[f'_{i-1}, f'_i] \times [g'_{j-1}, g'_j] \stackrel{def}{=} \{(f_x, f_y) : f'_{i-1} \leq f_x \leq f'_i, g'_{j-1} \leq f_y \leq g'_j\},$$

$$0 < i \leq i_{max}, 0 < j \leq j_{max},$$

where $-N.A. = f'_0 < f'_1 < \ldots < f'_i < \ldots < f'_{i_{max}} = N.A.$ and $-N.A. = g'_0 < g'_1 < \ldots < g'_j < \ldots < g'_{j_{max}} = N.A.$ are division points along the $f_x$ and $f_y$ directions respectively to form a rectangu lar mesh covering the pupil plane. Again, the z- and z'-dependent PSF may be written into a coherent superposition as, $$K_{12}(0, r; z, z') = \sum_{i=1}^{i_{max}} \sum_{j=1}^{j_{max}} K'_{12}(i, j; 0, r; z, z'), \qquad (122)$$

where for each (i,j) pair, $i \in [1, i_{max}]$, $j \in [1, j_{max}]$, $K'_{12}(i,j;0,r;z,z')$ is the contribution of imaging beams with spatial frequencies that fall into the (i,j)th rectangular region, namely, $$K'_{12}(i, j; 0, r; z, z') \stackrel{def}{=} \int_{f \in [f'_{i-1}, f'_i] \times [g'_{j-1}, g'_j]} K_{12}(f; z, z') e^{i2\pi f \cdot r} df. \qquad (123)$$

When the rectangular regions are sufficiently small, the defocus phase factor is more or less the same for all imaging beams with spatial frequencies that fall into the same rectangular region. Again, each $K'_{12}(i,j;0,r;z,z')$ may be resolved as a typical defocus phase factor multiplying a function that is slow-varying in z and z', whose slow variation may either be neglected or approximated by a truncated Taylor or Fourier series about z and z' with only a few terms. The result is a coherent linear decomposition of the PSF, which is in the form of an SVS series expansion with basis spatial functions independent of the values of process variations and/or depth into the resist film and expansion coefficients dependent on the values of process variations and/or depth into the resist film. Similar to previous formulations, an SVS series expansion of the PSF and a coherent-mode representation of $L_1^-(r_1, r_2)|_W$ in the form of equation (62) could be combined to yield a mixture imaging or partial kernels, and the amplitude distribution due to each coherent mode may be represented by an SVS series expansion, whose expansion coefficients dependent on the values of process variations and/or depth into the resist film, and whose basis spatial functions are convolutions of the mask transmittance function with functions independent of the values of process variations and/or depth into the resist film. It may seem that dividing the pupil plane into many rectangular regions might increase the computational complexity because many model kernels need to be convolved with the mask transmittance function. However, the narrower spectral content of each partial kernel reduces the complexity of convolutions: in the frequency domain, the non-zero regime of each partial kernel is much reduced; in the spatial domain, much lower sampling rate could be used for both partial kernels and convolution results, namely amplitude distributions, after factoring out a fast-varying term of the form $\exp(i2\pi f_{ij} r)$, where $f_{ij}$ is the center (or a typical) spatial frequency for each rectangular region in the pupil plane.

A different starting point of writing the PSF into an SVS series is expanding the defocus phase factor $\exp[i2\pi(\eta_r^2 - f^2)^{1/2} z + i2\pi(\eta_0^2 - f^2)^{1/2} z']$ into a Taylor or Fourier series of f, or a series in terms of orthogonal polynomials of f, with coefficients dependent on z and z'. Furthermore, such expansion in series about f may be carried out simultaneously for multiple variable factors in the complete transfer function $K_{12}(f; z, z')$ of equation (90), which includes variable abberation effects due to the lens system and the film stack, besides the defocus phase factor. Here, simultaneity refers to that the resulted SVS series expansion for the PSF captures variable abberation effects together with the defocus process variations into a single set of expansion coefficients for a single set of basis spatial functions. This point will be elaborated in general and in more details below, where the treatment for the defocus process variations alone is an readily deducible special case.

SVS Series Expansions for TCC

In the above formulations, the real-space representation of the TCC of an optical imaging system has been factored into the product of a mutual intensity characterizing the illumination field, a PSF characterizing the projection system, and the complex conjugate of the PSF, then the mutual intensity has been Mercer-expanded into coherent modes, which may be multiplied by an SVS series expansion for the PSF to generate model kernels in the form of SVS series expansions. A different approach is not to factor the TCC into a mutual intensity and PSFs, nor to Mercer-expand any mutual intensity to generate coherent modes, rather to keep the TCC as a whole for the combined effects of the illumination and projection systems, and to expand the TCC into an SVS series with (TCC) basis spatial functions independent of the values of process variations and/or depth into the resist film and (TCC) expansion coefficients dependent on the values of process variations and/or depth into the resist film, then to Mercer-expand the partial TCCs.

Analytical deduction is still one way to get an SVS series expansion for the TCC. For example, starting from an SVS series expansion for the PSF as in equation (94), the TCC of equation (92) may be expanded as, $$T(r_1, r_2; z, z') = \left[ \sum_{l \geq 0} \sum_{l' \geq 0} z^l z'^{l'} K_{12}^{(ll')}(0, -r_1) \right]^* J(r_1, r_2) \qquad (124)$$

$$\left[ \sum_{l \geq 0} \sum_{l' \geq 0} z^l z'^{l'} K_{12}^{(ll')}(0, -r_2) \right]$$

$$= \sum_{k \geq 0} \sum_{k' \geq 0} z^k z'^{k'} T^{(kk')}(r_1, r_2),$$

where $\forall k, k' \geq 0$, the partial TCCs are represented as, $$T^{(kk')}(r_1, r_2) \stackrel{def}{=} \sum_{l=0}^{k} \sum_{l'=0}^{k'} \left[ K_{12}^{(ll')}(0, -r_1) \right]^* J(r_1, r_2) \left[ K_{12}^{k-l, k'-l'}(0, -r_2) \right]. \qquad (125)$$

The TCC basis spatial functions are dependent on the planar spatial coordinates $r_1$ and $r_2$ but independent of the values of process variations and/or depth into the resist film, while the expansion coefficients $z^k z'^{k'}$ in equation (124) depend on the values of process variations and/or depth into the resist film. In practice, the series expansion may be truncated to a finite number of terms just enough to reach desired accuracy. Another way of obtaining an SVS series expansion for the TCC is through data fitting. Here for mathematical clarity, it is good to use an example that considers only the defocus-dependence of the TCC and to expand the TCC into an SVS series expansion with expansion coefficients dependent on the defocus value z', whereas the depth in the resist film z is either fixed or integrated over the entire resist film. Indeed, such scenario happens in two types of resist models approximating the continuous 3D distribution of the latent image in the resist film. One approximation uses several planar 2D image distributions sampled at fixed discrete values of z to represent or approximate the actual 3D distribution of latent image, in which case the TCC for any 2D image distribution at a fixed z value is still dependent on the defocus parameter z'. The other approximation integrates the 3D image distribution over the resist depth to yield an effective 2D image distribution that is independent of the z parameter but still dependent on the defocus parameter z'. In any case, one may seek a formal SVS series expansion for the z'-dependent TCC, $$T(r_1,r_2;z')=T^{(0)}(r_1,r_2)+z'T^{(1)}(r_1,r_2)+z'^2T^{(2)}(r_1,r_2), \quad (126)$$

where the partial TCCs $T^{(0)}(r_1,r_2)$, $T^{(1)}(r_1,r_2)$, and $T^{(2)}(r_1,r_2)$ may be fixed with $T(r_1,r_2;z')$ numerically evaluated at three or more values of z'. Assuming that $T(r_1,r_2;-h)$, $T(r_1,r_2;0)$, and $T(r_1,r_2;h)$ are known as arrays of numerical data, then the following equations, $$T(r_1,r_2;-h)=T^{(0)}(r_1,r_2)-hT^{(1)}(r_1,r_2)+h^2T^{(2)}(r_1,r_2), \quad (127)$$

$$T(r_1,r_2;0)=T^{(0)}(r_1,r_2), \quad (128)$$

$$T(r_1,r_2;h)=T^{(0)}(r_1,r_2)+hT^{(1)}(r_1,r_2)+h^2T^{(2)}(r_1,r_2), \quad (129)$$

may be solved to get the partial TCCs, $$T^{(0)}(r_1,r_2)=T(r_1,r_2;0), \quad (130)$$

$$T^{(1)}(r_1,r_2)=[T(r_1,r_2;h)-T(r_1,r_2;-h)]/(2h), \quad (131)$$

$$T^{(2)}(r_1,r_2)=[T(r_1,r_2;h)+T(r_1,r_2;-h)-2T(r_1,r_2;0)]/(2h^2). \quad (132)$$

By the same token, should it be desired to expand a z- and z'-dependent TCC in an SVS series as in the following, $$T(r_1, r_2; z, z') = T^{(00)}(r_1, r_2) + zT^{(10)}(r_1, r_2) + z'T^{(01)}(r_1, r_2) + \quad (133)$$
$$z^2 T^{(20)}(r_1, r_2) + zz' T^{(11)}(r_1, r_2) + z'^2 T^{(02)}(r_1, r_2),$$

then six pieces of numerical data at different values of z and z' may be used to determine the partial TCCs by solving a system of linear equations. When the number of pieces of numerical data is different from the number of unknown partial TCCs, standard procedures of optimal data fitting may be employed to find a set of partial TCCs that best fit the numerical data.

When a TCC is expanded into an SVS series like the one in equation (124), each partial TCC $T^{(kk')}(r_1,r_2)$ viewed as a Hilbert-Schmidt kernel also corresponds to a Hermitian operator $T^{(kk')}$, $$T^{(kk')}|u\rangle(r_1) \stackrel{def}{=} \int_P T^{(kk')}(r_1, r_2)u(r_2)dr_2, \quad (134)$$

$$\forall u \in L^2(P), \forall k, k' \geq 0.$$

Although the operators $T^{(kk')}$, $\forall k,k' \geq 0$ are not necessarily positive definite, being Hermitian is sufficient for their Hilbert-Schmidt kernels to have a Mercer expansion with real eigenvalues, and the eigenvalues of each operator may be ordered such that their absolute values form a decreasing sequence. That is, $\forall k,k' \geq 0$, there exist a sequence of functions $\{\phi_n^{(kk')}(r)\}_{n\geq 1} \subset L^2(P)$, and a sequence of real numbers $\{\lambda_n^{(kk')}\}_{n\geq 1}$, $|\lambda_1^{(kk')}| \geq |\lambda_2^{(kk')}| \geq \ldots > 0$, such that, $$T^{(kk')}(r_1, r_2) = \sum_{n\geq 1} \lambda_n^{(kk')}[\phi_n^{(kk')}(r_1)][\phi_n^{(kk')}(r_2)]^*. \quad (135)$$

Consequently, the total TCC of equation (124) may be written as, $$T(r_1, r_2; z, z') = \sum_{k\geq 0}\sum_{k'\geq 0}\sum_{n\geq 1} z^k z'^{k'} \lambda_n^{(kk')}[\phi_n^{(kk')}(r_1)][\phi_n^{(kk')}(r_2)]^*. \quad (136)$$

The z- and z'-dependent resultant intensity distribution $I_2(q;z,z')$ would be calculated as, $$I_2(q; z, z') = \int_P \int_P u_q^*(r_1)T(r_1, r_2; z, z')u_q(r_2)dr_1 dr_2 \quad (137)$$
$$= \sum_{k\geq 0}\sum_{k'\geq 0}\sum_{n\geq 1} z^k z'^{k'} \lambda_n^{(kk')}|\langle\phi_n^{(kk')}\|u_q\rangle|^2,$$

$$\forall q \in P, \forall z, z' \in R.$$

It is noted that instead of amplitude distributions, here it is the resultant intensity distribution $I_2(q;z,z')$ itself being represented by an SVS series expansion, where the basis spatial functions $|\langle\phi_n^{(kk')}\|u_q\rangle|^2$ depend on the planar spatial coordinate, and the expansion coefficients $z^k z'^{k'} \lambda_n^{(kk')}$ depend on the values of process variations and/or depth into the resist film, $\forall k,k' \geq 0$, $\forall n \geq 1$.

Other Process Variations

Besides defocus and intensity/position variations of multiple emitters, there are many other sources of process variations, such as lens abberations, fluctuations of refractive index and attenuation coefficient in the immersion medium between the last projection lens and the wafer substrate, and variations of thickness, material refractive indices and attenuation coefficients in layers of the film stack. These are but some of the process variations related to optical imaging. The PSF incarnates the effects of most optical variations in the projection system. Let $\alpha = \{\alpha_{lk}\}$, $l \in Z$, $k \in N_0 \stackrel{def}{=} \{0,1,2,\ldots\}$ be a collection of coefficients of Zernike polynomials representing the lens abberations. Namely, the abberation factor A(f) in equation (90) is represented as (see, for example, M. Born and E. Wolf, as referenced supra), $$A(f) = A(f_x, f_y) = A(\eta_0\rho\cos\theta, \eta_0\rho\sin\theta) = \exp\left[i2\pi\sum_{lk} a_{lk} Z_k^l(\rho, \theta)\right], \quad (138)$$

where a coordinate transformation $f=(f_x,f_y) \to (\eta_0\rho \cos\theta, \eta_0\rho \sin\theta)$ is performed, with $\rho \in [0,1]$, $\theta \in [0,2\pi)$, $Z_k^l(\rho,\theta)$ are the Zernike polynomials on the unit disc represented as, $$Z_k^l(\rho, \theta) \stackrel{def}{=} R_{|l|+2k}^l(\rho)e^{il\theta}, \quad (139)$$

$$R_{|l|+2k}^l(\rho) \stackrel{def}{=} \frac{w_{lk}}{k!\rho^{|l|}}\left[\frac{d}{d(\rho^2)}\right]^k [\rho^{2(|l|+k)}(\rho^2-1)^k], \quad (140)$$

$\forall l \in Z$, $\forall k \in N_0$, where $\{\omega_{lk}\}_{lk}$ are constants normalizing the polynomials such that, $$\int_0^1 R_{|l|+2k}^l(\rho)R_{|l|+2k'}^l(\rho)2\pi\rho d\rho = \delta_{kk'}, \forall k,k' \in N_0. \quad (141)$$

So A(f) is dependent on the Zernike coefficients, which may be denoted explicitly as $A(f;\alpha)$. The Zernike coefficients $\alpha$ of a given stepper system may be measured experimentally. However, given an ensemble of stepper machines with even the same design specifications, the Zernike coefficients may have to be assumed varying randomly with certain distributions, without detailed measurements on every machine. Let $\beta=(\beta_1,\beta_2,\ldots)$ be a set of optically related parameters representing variations in the film stack. So the abberation factor B(f) in equation (90) is dependent on $\beta$, which may be denoted explicitly as $B(f;\beta)$. Consequently, both the transfer function of equation (90) and the PSF of equation (91) depend on $\alpha$ and $\beta$, which may be denoted as $K_{12}(f;z,z';\alpha,\beta)$ and $K_{12}(0,r;z,z';\alpha,\beta)$ respectively to signify such dependence. Using the same methods established above, the abberation factor A(f)B(f) may be expanded into (multi-fold) Taylor or Fourier series about parameters of process variations α and β, together with series expansions about z and z' for the defocus phase factor, they may derive a multi-fold SVS series expansion for the PSF $K_{12}(0,r;z,z';\alpha,\beta)$. The PSF in an SVS series expansion may then be used to generate SVS series expansions for model kernels and amplitude distributions of the mask image. However, many parameters of process variations seem to induce substantial complexity in the SVS series expansions, unless most variations are relatively small and sufficiently treated as first-order (linear) perturbations, then the effects of such variations are separable and each contributes a linear additive perturbation to the unperturbed system.

A better approach may start from expanding the PSF into a series of orthogonal functions of f, for example, Hermite-Gaussian functions or Zernike polynomials. Hermite-Gaussian functions have the nice property of Fourier transform invariant, that is, the Fourier transform of a Hermite-Gaussian function is still a Hermite-Gaussian function of the same order. Zernike polynomials are orthogonal on the unit disc, which are right suitable to model the sharp cutoff of a pupil aperture. Let $$K_{var}(f; z, z'; \alpha, \beta) \stackrel{def}{=} e^{i2\pi(\eta_r^2-f^2)^{1/2}z}e^{i2\pi(\eta_0^2-f^2)^{1/2}z'}A(f;\alpha)B(f;\beta), \quad (142)$$

collects factors in the transfer function of equation (90) that are related to process variations, excluding the factor P(f) which collects the limiting effect of pupil aperture and any non-varying abberations. As an example, $K_{var}(f;z,z';\alpha,\beta)$ may be expanded using Zernike polynomials, $$K_{var}(f; z, z'; \alpha, \beta) = K_{var}(\eta_0\rho\cos\theta, \eta_0\rho\sin\theta; z, z'; \alpha, \beta) = \quad (143)$$
$$\sum_l \sum_{k\geq 0} C_{lk}(z, z'; \alpha, \beta) Z_k^l(\rho, \theta),$$

where the expansion coefficients are given by, $$C_{lk}(z,z';\alpha,\beta) = \int_0^1 \int_0^{2\pi} K_{var}(\eta_0\rho\cos\theta,\eta_0\rho\sin\theta; z,z';\alpha,\beta) \\ R_{|l|+2k}^{l}(\rho)e^{-il\theta}\rho d\rho d\theta, \quad (144)$$

$\forall l \in Z, \forall l \in N_0$. Note that equation (143) is already an SVS series expansion for $K_{var}(f;z,z';\alpha,\beta)$ in the spatial frequency domain, with Zernike polynomials as basis spatial (frequency) functions, and expansion coefficients $C_{lk}(z,z';\alpha,\beta)$, $l \in Z, k \in N_0$ dependent on the values of, and representing the effects of, process variations under consideration and/or depth into the resist film. The expansion coefficients may be calculated either by analytical means or via numerical integration. Then one may substitute equations (142) and (143) into equations (90) and (91) to obtain an SVS series expansion for the PSF, $$K_{12}(0, r; z, z'; \alpha, \beta) = \quad (145)$$
$$\mathcal{F}^{-1}[P(f)K_{var}(f; z, z'; \alpha, \beta)] = \sum_l \sum_{k\geq 0} C_{lk}(z, z'; \alpha, \beta) K_{12}^{(lk)}(0, r),$$

where the basis spatial functions, $$K_{12}^{(lk)}(0, r) \stackrel{def}{=} \mathcal{F}^{-1}[P(f)Z_k^l(\rho, \theta)] = \mathcal{F}^{-1}[P(f_x, f_y)Z_k^l(f_x, f_y)], \quad (146)$$

$\forall l \in Z, \forall k \in N_0$, are dependent on the planar spatial coordinate r but independent of the values of process variations and/or depth into the resist film, whereas the expansion coefficients $\{C_{lk}(z,z';\alpha,\beta)\}_{lk}$ in equation (145) depend on the values of process variations and/or depth into the resist film. Note that a coordinate transformation $(\rho,\theta) \to (f_x,f_y) = (\eta_0\rho\cos\theta, \eta_0\rho\sin\theta)$ is carried out to write $\{Z_k^l(\rho,\theta)\}_{lk}$ into $\{Z_k^l(f_x,f_y)\}_{lk}$, namely, polynomials of $f_x$ and $f_y$. Equation (145) may be combined with the coherent-mode representation of $J_1^-(r_1,r_2)|_W$ in the form of equation (62) to decompose the TCC of equation (93) into partial kernels, $$T(r_1, r_2; z, z'; \alpha, \beta) \approx T(r_1, r_2; z, z'; \alpha, \beta)|_W \quad (147)$$
$$= \sum_{n\geq 1} \mu_n \left[ \sum_l \sum_{k\geq 0} C_{lk}^*(z, z'; \alpha, \beta)\varphi_{nlk}(r_1) \right] \times \left[ \sum_l \sum_{k\geq 0} C_{lk}^*(z, z'; \alpha, \beta)\varphi_{nlk}(r_2) \right]^*$$

$\forall r_1, r_2 \in P$, where the partial kernels are represented as, $$\varphi_{nlk}(r) \stackrel{def}{=} [K_{12}^{(lk)}(0, -r)|w]^*\xi_n(r), \quad (148)$$
$$\forall n \geq 1, \forall l \in Z, \forall k \geq 0, \forall r \in P.$$

Consequently, the resultant intensity distribution $I_2(q;z,z';\alpha,\beta)$ under general process variations would be calculated as, $$I_2(q; z, z'; \alpha, \beta) = \sum_{n\geq 1} \mu_n \left| \sum_l \sum_{k\geq 0} C_{lk}(z, z'; \alpha, \beta)\langle\varphi_{nlk}\|u_q\rangle \right|^2. \quad (149)$$

Again, $\forall n \geq 1$, one may write, $$F_n(q; z, z'; \alpha, \beta) \stackrel{def}{=} \sum_l \sum_{k\geq 0} C_{lk}(z, z'; \alpha, \beta)\langle\varphi_{nlk}\|u_q\rangle, \quad (150)$$

as the amplitude distribution due to the nth coherent mode of the illumination field, which is obviously represented by an SVS series expansion with $\{\langle\psi_{nlk}\|u_q\rangle\}_{lk}$ as basis spatial functions and $\{C_{lk}(z,z';\alpha,\beta)\}_{lk}$ as expansion coefficients.

Our exemplary formulations have demonstrated that and how a PSF may incorporate most effects and variations in an optical projection system, including at least projection lenses, an immersion medium, and a stack of films on a wafer substrate. In general, optical variations in the illumination system are incorporated into the mutual intensity function or coherent modes generated from the mutual intensity function. Such illumination variations include, for example, intensity/position variations of multiple emitters and variations in the condenser optics. Being constructed from the mutual intensity and the PSF, a TCC characterizes the illumination and projection systems combined, i.e., the optical imaging system, also called the optical exposure system, and incorporates most optical variations in both the illumination and the projection systems. The same can be said for model kernels obtained by Mercer-expanding the TCC. Similarly, model kernels resulted from coherent modes and the PSF do as well characterize the optical imaging system and incorporate most optical variations.

Apart from optical variations in the illumination and projection systems, there are many other process variations that are related to resist development and chemical etching. It may be noted that the steps of optical imaging and chemical processing are well separated in a fully ab initio approach to photolithographic simulations. So long as the distribution of optical intensity in a resist layer is accurately calculated based on first-principles, the post-optics chemical processes may be independently simulated under arbitrary process variations. Sometimes, however, a lumped parameter model for the chemical processes may be used, and a few parameters related to chemical processing may be incorporated into a generalized TCC or PSF in the same mathematical framework of optical imaging. In such case, the parameters of process variations related to chemistry may be treated on a similar footing as other "purely optical" parameters of process variations.

Scalar Versus Vectorial Imaging and 3D Mask Effects

It should be noted that our mathematical formulations and methods of photolithographic simulations are applicable to both scalar and vectorial theories of optical imaging. Because optical waves are vectorial in nature, a rigorous mathematical theory should be based on vectorial descriptions for the waves and their interactions with matters. A scalar theory, as an approximation, may be applied when N.A. and $\sigma_{max}$ of an imaging system are relatively small. However, for advanced photolithographic systems with high N.A. and/or $\sigma_{max}$, it is necessary to use a full-vectorial theory of imaging. Furthermore, the ever-shrinking feature size has rendered the topographic effects of modern photolithographic masks increasingly significant. That is, as the height variation of the mask topography becomes comparable to the planar feature size of mask patterns, and both are becoming as small as the wavelength of the illumination light, it is no longer accurate nor sufficient to describe the mask transmittance function using the traditional thin-mask approximation, or the so-called Kirchhoff boundary conditions. One of the topographic effects is mask-induced birefringence, another is that the mask transmittance becomes dependent on the incidence angle of an illumination beam. Consequently, it may be necessary to consider the polarization effects of a thick mask and the incident angle dependence of a mask transmittance function. The mask transmittance function may no longer be binary or multi-phase valued polygons, rather, it may vary continuously over the mask plane, and comprise multiple polarization components. Our formulations and methods apply as well to vectorial imaging and thick masks so long as the optical effect of the mask is described by a mask transmittance function, which may be convolved with model kernels to yield amplitude distributions of the mask image. In fact, the great advantage of using functional analysis in our formulations is the mathematical generality. A function element from the Hilbert space $L^2(P)$ has been used to describe a mask transmittance function, a coherent mode, a model kernel, and an amplitude distribution on a plane. A linear operator mapping from $L^2(P)$ to $L^2(P)$ has been associated to a mutual intensity, an optical propagation amplitude, and a TCC describing the transformation from a mask to its image. Our formulations using functional analysis provide sufficient generality to cover most practical and theoretical scenarios of optical imaging, regardless of whether the waves are treated approximately as scalar, or rigorously as vectorial, whether the function elements and linear operators are discrete and therefore finite-dimensional vectors and matrices as implemented in a computer program, or continuous and infinite-dimensional quantities. With the availability of much detailed discussions on vectorial imaging and explicit extensions of the Hopkins and ISOCS formulations into the vectorial case (see, for example, D. G. Flagello et al., "Theory of high-NA imaging in homogeneous thin films," J. Opt. Soc. Am. A, vol. 13, no. 1, pp. 53-64, 1996; K. Adam et al., "Improved modeling performance with an adapted vectorial formulation of the Hopkins imaging equation," Proc. SPIE, vol. 5040, pp. 78-91, 2003; K. Adam and W. Maurer, "Polarization effects in immersion lithography," Proc. SPIE, vol. 5377, pp. 329-343, 2004; and M. Totzeck et al., "How to describe polarization influence on imaging," Proc. SPIE, vol. 5754, pp. 23-37, 2005), one skilled in the art will be readily able to interpret and apply the formulations described herein as either scalar or vectorial, in a variety of different environments and application scenarios. In particular, J. Lei et al. in "Hopkins equation in Hilbert space and its application in polarized illumination modeling," Proc. SPIE, vol. 5754, pp. 953-960, 2005 and "A study for polarized illumination effects in photo resist," Proc. SPIE, vol. 5853, pp. 800-807, 2005, have also showed how a full-vectorial imaging theory may be nicely incorporated into a general formulation using functional analysis. To be specific, for vectorial imaging, the mask transmittance function and model kernels may be multi-component- or vector-valued with each component corresponding to a polarization state of the optical wave, while the TCC and propagators may be matrix-valued that transform one vector-valued function to another. Finally, it is noted that an accurate theory of imaging inside the film stack on a wafer substrate may have to consider the multiple reflection/refraction effects among the film interfaces as well as optical attenuation in the film materials. Fortunately, such optical effects in the film stack may be conveniently incorporated into just one PSF, which will then be used to compute the TCC and model kernels.

Resist Development and Chemical Etching

Once the 3D optical intensity distribution in a resist film is accurately calculated based on first-principles, standard resist and etching models using the Dill A, B, C parameters among others, may be employed to simulate the photochemistry of resist exposure and the subsequent chemical processes of post-exposure baking and resist development, as well as any following steps of chemical etching. See, generally, F. H. Dill, "Optical lithography," IEEE Trans. Electron Dev., vol. 22, no. 7, pp. 440-444, 1975; F. H. Dill et al., "Characterization of positive photoresist," IEEE Trans. Electron Dev., vol. 22, no. 7, pp. 445-452, 1975; F. H. Dill et. al., "Modeling projection printing of positive photoresists," IEEE Trans. Electron Dev., vol. 22, no. 7, pp. 456-464, 1975; J. D. Plummer et al., *Silicon VLSI Technology: Fundamentals, Practice and Modeling*, Prentice Hall, 2000, at Chapter 5, Section 5.5.; and H. J. Levinson, *Principles of Lithography*, 2nd ed., SPIE Press, 2005. Provided that the models for photochemistry, resist development, and chemical etching are based on first-principles or otherwise good in capturing the essential mechanisms underlying the chemical processes, and parameters used by the models are well calibrated (see, e.g., P. Baluswamy et al., "Practical resist model calibration," Proc. SPIE, vol. 5040, pp. 1556-1569, 2003; and M. D. Smith et al., "The lithographic impact of resist model parameters," Proc. SPIE, vol. 5376, pp. 322-332, 2004), the overall photolithographic simulations may be ab initio in nature, accurate and providing excellent predictions over a wide range of process variations. It is noted that resist and etching models induce even more parameters of process variations. As optical imaging and subsequent chemical processing are well-separated steps, so long as the latent image in resist is accurately calculated based on first-principles, the post-optics chemical processes may be independently simulated under arbitrary process variations. Therefore, it becomes possible to have a tool of photolithographic simulations supporting even more continuously tunable parameters of process variations.

Alternatively, lumped parameter models and other approximate models (see, e.g., T. A. Brunner and R. A. Ferguson, "Approximate models for resist processing effects," Proc. SPIE, vol. 2726, pp. 198-207, 1996; S. G. Hansen, "The resist vector: connecting the aerial image to reality," Proc. SPIE, vol. 4690, pp. 366-380, 2002; J. Byers et al., "Lumped parameter model for chemically amplified resists," Proc. SPIE, vol. 5377, pp. 1462-1474, 2004; and D. F. Beale et al., "Advanced model formulations for optical and process proximity correction," Proc. SPIE, vol. 5377, pp. 721-729, 2004) may be used as well to simulate the chemistry of resist exposure and development, as well as the resist to silicon pattern transfer, so long as the approximate models could reasonably predict the outcome of the chemical processes, given an accurately calculated optical intensity distribution inside the resist film. Such lumped parameter models are no longer strictly based on first-principles, hence may be less accurate, but they may provide faster simulations of chemical processing than fully ab initio approaches. According to a preferred embodiment, some resist and etching effects are incorporated into a TCC or PSF, which is then Mercer-expanded or multiplied onto a set of coherent kernels to generate model kernels. For example, due to the finite resolution of a resist response, chemical diffusions in an exposed resist, and other blurring effects, the latent image distribution $I_{LAT}(q;z;var)$ in an exposed resist layer may not be the same (up to a constant scaling factor) as the distribution of optical intensity $I_2(q;z;varO)$ that exposes the resist, rather, $I_{LAT}(q;z;var)$ is a blurred (or smoothed) version of $I_2(q;z;varO)$ and may be represented as, $$I_{LAT}(q;z;var) = \int_{z_1}^{z_2} \int_P I_2(q-q';z-\zeta;varO) D(q';\zeta;varC) \, dq' d\zeta, \quad \forall q \in P, \tag{151}$$

where varO is a set of parameters for optical variations in the illumination and projection systems, varC is a set of parameters for variations in chemical processing, var=(varO,varC) is the union of the two sets of process variations, $z_1$ and $z_2$ are the depths of the two ends of the resist layer, $D(q;z;varC)$ is a diffusion kernel incorporating chemical variations varC and characterizing the blurring effects, the optical intensity distribution $I_2(q;z;varO)$ depends on optical variations varO, and the distribution of the resultant intensity $I_{LAT}(q;z;var)$ depends on both varO and varC. As usual, $I_2(q;z;varO)$ may be represented as, $$I_2(q;z;varO) = \int_P \int_P u^*(r_1) T(q-r_1,q-r_2;z;varO) u(r_2) \, dr_1 dr_2, \quad \forall q \in P, \tag{152}$$

where $T(r_1,r_2;z; varO)$ is a z- and varO-dependent TCC calculated as, $$T(r_1,r_2;z;varO) = K^*{}_{12}(0,r_1;z;varO) J_1{}^-(r_2,r_1;varO) K_{12}(0,r_2;z;varO), \tag{153}$$

$\forall r_1,r_2 \in P$. $J_1{}^-(r_1,r_2;varO)$ and $K_{12}(0,r;z;varO)$ are the mutual intensity and the PSF incorporating the optical variations and characterizing the illumination system and the projection system respectively. Equations (151) and (152) may be combined to yield, $$I_{LAT}(q;z;var) = \int_{z_1}^{z_2} \int_P \int_P \int_P u^*(r_1) T \tag{154}$$
$$(q-q'-r_1, q-q'-r_2; z-\zeta; varO) \times$$
$$u(r_2) D(q';\zeta;varC) dr_1 dr_2 dq' d\zeta$$
$$\stackrel{def}{=} \int_P \int_P u^*(r_1) T_G(q-r_1, q-r_2; z; var) u(r_2) dr_1 dr_2,$$

where $T_G(r_1,r_2;z;var)$ is a generalized TCC represented as, $$T_G(r_1, r_2; z; var) \stackrel{def}{=} \tag{155}$$
$$\int_{z_1}^{z_2} \int_P T(r_1-q, r_2-q; z-\zeta; varO) D(q;\zeta; varC) dq d\zeta,$$

$\forall r_1,r_2 \in P$, which incorporates both optical and chemical variations. Such general formulation is also applicable to a special case of numerical approximation, in which the 3D volumetric distribution of the resultant intensity $I_{LAT}(q;z;var)$ is collapsed into a 2D resultant image by integrating the 3D intensity distribution over the z-axis, and predictions about the processed resist and/or wafer patterns are based on the 2D resultant image. To derive the special case, the z variable in $I_{LAT}(q;z;var)$ and $T_G(r_1,r_2;z;var)$ may be dropped or set to a constant, e.g., z=0, such that, $$I_{LAT}(q;var) = \int_P \int_P u^*(r_1) T_G(q-r_1,q-r_2;var) u(r_2) dr_1 dr_2, \tag{156}$$

with the effective TCC $T_G(r_1,r_2;var)$ represented as, $$T_G(r_1, r_2; var) \stackrel{def}{=} \tag{157}$$
$$\int_{z_1}^{z_2} \int_P T(r_1-q, r_2-q; -\zeta; varO) D(q;\zeta; varC) dq d\zeta.$$

For another example, the rate of optical absorption in a resist film may be z-dependent and described by a function $R(z;varC)$ due to, for instance, an inhomogeneity of concentration of photochemically active molecules along the z direction. The function $R(z;varC)$ is real- and nonnegative-valued $\forall z \in [z_1,z_2]$, and may be variable, dependent on a parameter included in the set varC. As a consequence, the resultant image $I_{EXP}(q;z;var)$ after resist exposure but before chemical diffusions, namely, the concentration of photo-excited molecules, may be represented as $I_{EXP}(q;z;var) = I_2(q;z;varO) R(z;varC)$. It is straightforward to verify that $I_{EXP}(q;z;var)$ may also be represented as, $$I_{EXP}(q;z;var) = \int_P \int_P u^*(r_1) T^G(q-r_1,q-r_2; var) u(r_2) dr_1 dr_2, \tag{158}$$

with a generalized TCC $T^G(r_1,r_2;var)$ represented as, $$T^G(r_1, r_2; var) \stackrel{def}{=} T(r_1, r_2; z; varO) R(z; varC). \tag{159}$$

As $R(z;varC)$ is nonnegative, it is further possible to incorporate $[R(z;varC)]^{1/2}$ into a generalized $$PSF \; K_{12}^G(0, r; z; var) \stackrel{def}{=} K_{12}(0, r; z; varO)[R(z; varC)]^{1/2},$$

such that, $$T^G(r_1,r_2;z;var) = [K_{12}{}^G(0,r_1;z;var)]^* J_1{}^-(r_2,r_1;varO) K_{12}{}^G(0,r_2;z;var). \tag{160}$$

The above are just two examples of how a generalized TCC or PSF may incorporate some chemical effects. Model kernels may be generated by Mercer-expanding the generalized TCC, or multiplying the generalized PSF onto a set of coherent modes. It is noted though, that all chemical effects may not be incorporated into a TCC or PSF, at least not in a fully ab initio model. Variations of chemical processing are generally incorporated into models of chemical processing based on first-principles which are separated from the process of optical imaging. Nevertheless, when a TCC or PSF does contain some chemistry, the generated model kernels may incorporate chemical effects of resist exposure, resist development, and etching. Such model kernels may also be convolved with a mask transmittance function, and the convolution results may be combined to generate a distribution of a resultant intensity, based on which predictions may be made about the resist or silicon patterns corresponding to the mask. The resultant intensity may represent, for examples but not limited to, latent images in resist, processed resist chemical patterns, processed resist physical patterns, final semiconductor patterns, and other types of planar and/or volumetric, physical and/or chemical results from the chemical processing of the exposed resist and/or wafer. It is noted that the resist and etching effects incorporated into the TCC or the PSF may be turned off, so that the resulted imaging kernels reduce to conventional optical kernels, and the resulted partial kernels reduce to that represent purely optical effects of an optical imaging system. Finally, it is noted that a continuous 3D resultant intensity distribution in a target volume is not the only way of describing the effects of a photolithographic process. Another possibility, that is using several planar 2D resultant intensity distributions sampled at discrete values of depth in the target, may serve the purpose equally well, provided that the resultant intensity distribution does not change rapidly along the target depth.

Tree Data Structure, Tree Codes, and Numerics

To organize mask data, resist images, and patterns on wafer efficiently for fast access, a quad-tree may be built which may divide a rectangle bounding box of a given mask layout into smaller and hierarchically structured rectangle areas until reaching a predetermined size (set by users or derived from user-set parameters) of rectangle area for the leaf nodes of the quad-tree. Each non-leaf node of the quad-tree corresponds to a rectangle bounding box, which is further divided into four smaller bounding boxes that are associated to four children nodes. Each node has a pointer to mask data that are enclosed by the bounding box associated to the node, and a pointer to data of images and patterns on wafer that are enclosed by the same bounding box. The same quad-tree should be built whether running distributed processing or running a single CPU, whether doing OPC or SiFiC. The quad-tree is uniquely determined by the mask layout and the area size of the leaf node, which ensures result consistency from one run to another, and from one application to another. The mask data, resist images, and patterns on wafer are attached to the same quad-tree. Known tree-code algorithms may be employed for calculating convolutions of mask and model kernels, processing the amplitude and intensity data of resultant images, simulating resist development and chemical etching effects, finding contours of wafer patterns, and for other purposes. Other known methods of numerics, i.e., techniques of numerical operations for fast computer execution, may be employed without departing from the scope of the preferred embodiments. For example, it may be mathematically and theoretically convenient to assume that the eigenvectors representing either coherent modes or model kernels are normalized, so that the eigenvalues are carried by the strengths or weights of the coherent modes and model kernels. In a practical computer algorithm, however, the eigenvalues or other constant factors except variable parameters of process variations may be absorbed into the coherent modes and ultimately the model kernels, so to save scalar multiplications to convolution results (of a mask transmittance function with the model kernels) when combining them to get resultant intensities. In that case, the eigenvectors in question are no longer normalized, and the constant factors in the strengths or weights of the coherent modes and model kernels may assume trivial values such as +1 and −1.

What is claimed is:

1. A method for simulating a photolithographic process, the method being implemented by a computing device comprising at least one processor, comprising:
   receiving a plurality of model kernels characterizing the photolithographic process, the model kernels not being dependent on a predetermined process variation associated with the photolithographic process;
   receiving a plurality of parameters dependent on said process variation; and
   computing with the computing device a plurality of resultant intensities for a corresponding plurality of process variation values using said parameters, a mask transmittance function, and said plurality of model kernels.

2. The method of claim 1, said computing a plurality of resultant intensities comprising:
   computing a first resultant intensity for a first process variation value by processing said mask transmittance function with said model kernels to generate a plurality of intermediate results and processing the intermediate results with said parameters, said parameters being set according to said first process variation value; and
   computing a second resultant intensity for a second process variation value by processing said intermediate results with said parameters, said parameters being set according to said second process variation value.

3. The method of claim 2, wherein said processing said mask transmittance function with said model kernels has a relatively high degree of computational complexity as compared to said processing the intermediate results with said parameters, whereby said computing said second resultant intensity is achieved in substantially less time than said computing said first resultant intensity.

4. The method of claim 3, wherein said processing said mask transmittance function with said model kernels comprises convolving said mask transmittance function with said model kernels, said intermediate results being convolution results.

5. The method of claim 4, wherein said processing the intermediate results with said parameters comprises one of (i) summing the squared magnitudes of the convolution results as weighted according to said parameters, and (ii) coherently summing the convolution results by group as weighted according to a first subset of said parameters and summing the squared magnitudes of the coherent sums as weighted by a second subset of said parameters.

6. A computer readable medium tangibly embodying one or more sequences of instructions wherein execution of the one or more sequences of instructions by a computing device comprising at least one processor causes the computing device to simulate a photolithographic process according to the method of claim 1.

* * * * *